United States Patent
Jeon et al.

(10) Patent No.: US 12,328,998 B2
(45) Date of Patent: Jun. 10, 2025

(54) DISPLAY DEVICE AND METHOD FOR REPAIRING THE SAME

(71) Applicant: Samsung Display Co., LTD., Yongin-si (KR)

(72) Inventors: Young Jae Jeon, Hwaseong-si (KR); Woo Geun Lee, Suwon-si (KR); Jae Beom Choi, Suwon-si (KR); Jong-In Kim, Seoul (KR); Jin-Won Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 610 days.

(21) Appl. No.: 17/407,407

(22) Filed: Aug. 20, 2021

(65) Prior Publication Data

US 2022/0199742 A1  Jun. 23, 2022

(30) Foreign Application Priority Data

Dec. 23, 2020  (KR) ........................ 10-2020-0182541

(51) Int. Cl.
*H01L 27/32* (2006.01)
*H10K 50/86* (2023.01)
(Continued)

(52) U.S. Cl.
CPC ......... *H10K 59/131* (2023.02); *H10K 50/865* (2023.02); *H10K 59/126* (2023.02); *H10K 71/861* (2023.02)

(58) Field of Classification Search
None
See application file for complete search history.

(56) References Cited

U.S. PATENT DOCUMENTS 7,045,438 B2   5/2006  Yamazaki et al.
8,016,452 B2   9/2011  Dunn
(Continued)

FOREIGN PATENT DOCUMENTS

KR   10-1993334    6/2019
KR   10-2057584   12/2019
(Continued)

*Primary Examiner* — Jarrett J Stark
(74) *Attorney, Agent, or Firm* — KILE PARK REED & HOUTTEMAN PLLC

(57) ABSTRACT

A display device includes a semiconductor layer of a driving transistor; a semiconductor layer of a switching transistor; a semiconductor layer of an initialization transistor; a gate electrode of the driving transistor overlapping a semiconductor layer of the driving transistor; a lower storage electrode connected to the semiconductor layer of the switching transistor; an upper storage electrode connected to the semiconductor layer of the driving transistor, a light blocking pattern, and the semiconductor layer of the initialization transistor, and overlapping the lower storage electrode; a semiconductor layer of a first auxiliary transistor adjacent the semiconductor layer of the switching transistor and/or the semiconductor layer of the initialization transistor; a first electrode of the first auxiliary transistor connected to the semiconductor layer of the first auxiliary transistor; and a second electrode of the first auxiliary transistor connected to the semiconductor layer of the first auxiliary transistor.

7 Claims, 38 Drawing Sheets

(51) Int. Cl.
*H10K 59/126* (2023.01)
*H10K 59/131* (2023.01)
H10K 71/00 (2023.01)

(56) References Cited

U.S. PATENT DOCUMENTS

| | | | |
|---|---|---|---|
| 8,390,019 B2 | 3/2013 | Yamazaki et al. | |
| 9,159,285 B2 | 10/2015 | Chang et al. | |
| 10,276,078 B2 | 4/2019 | Lee et al. | |
| 12,183,752 B2* | 12/2024 | Tang | H10F 39/18 |
| 2012/0211752 A1* | 8/2012 | Kim | H10K 59/131 |
| | | | 257/59 |
| 2013/0120469 A1* | 5/2013 | Tien | G02F 1/133753 |
| | | | 345/88 |
| 2015/0187804 A1* | 7/2015 | Park | H01L 27/124 |
| | | | 257/43 |
| 2017/0032733 A1* | 2/2017 | Jang | G09G 3/20 |
| 2020/0091264 A1* | 3/2020 | Lee | H01L 27/1248 |
| 2020/0111855 A1* | 4/2020 | Bae | H01L 27/1255 |
| 2023/0065335 A1* | 3/2023 | Kim | H10K 59/131 |
| 2023/0217733 A1* | 7/2023 | Oh | H10K 59/879 |
| | | | 257/494 |
| 2025/0017042 A1* | 1/2025 | Seo | H10K 59/1213 |

FOREIGN PATENT DOCUMENTS

| | | |
|---|---|---|
| KR | 10-2059943 | 12/2019 |
| KR | 10-2020-0085978 | 7/2020 |
| KR | 10-2021-0014233 | 2/2021 |

\* cited by examiner

DISPLAY DEVICE AND METHOD FOR REPAIRING THE SAME

CROSS-REFERENCE TO RELATED APPLICATION(S)

This application claims priority to and benefits of Korean Patent Application No. 10-2020-0182541 under 35 U.S.C. § 119 filed on Dec. 23, 2020 in the Korean Intellectual Property Office, the entire contents of which are incorporated herein by reference.

BACKGROUND

1. Technical Field

The disclosure relates to a display device and a method for repairing the same.

2. Description of the Related Art

A display device represents a device for displaying images on a screen, and it may be a liquid crystal display (LCD) and an organic light emitting diode display (OLED). The display device is used in various electronic devices such as portable phones, GPS, digital cameras, electronic books, portable game devices, or various terminals.

An organic light emitting device may include two electrodes and an organic emission layer disposed therebetween, and electrons injected from one electrode are combined with holes injected from the other electrode on an organic emission layer to form excitons. The excitons transit to a ground state from an excited state to output energy and emit light.

The organic light emitting device may include a plurality of pixels including an organic light emitting diode that is a self-light-emitting device, and a plurality of transistors and at least one capacitor for driving the organic light emitting diode are formed on respective pixels.

In case that a defect is generated to the transistor configuring the display device, a corresponding pixel may not be normally operated. A process for repairing the corresponding pixel as a dark spot so that the defect of the pixel may be invisible may be progressed. In case that a small amount of defective pixels are positioned in the display device, the defective pixels may not be seen. However, in case that many defective pixels are in the display device or they are positioned near each other, they may be visible.

The above information disclosed in this background section is only for enhancement of understanding of the background of the described technology, and therefore it may contain information that may not form the prior art that may already be known to a person of ordinary skill in the art.

SUMMARY

The described technology provides a display device for, when a defect is generated to a transistor, making a defective pixel good according to a repairing process, and the repairing method.

An embodiment provides a display device that may include a driving voltage line, a data line, an initialization voltage line, and a light blocking pattern disposed on a substrate; a semiconductor layer of a driving transistor electrically connected to the driving voltage line; a semiconductor layer of a switching transistor electrically connected to the data line; a semiconductor layer of an initialization transistor electrically connected to the initialization voltage line; a gate electrode of the driving transistor overlapping the semiconductor layer of the driving transistor; a lower storage electrode extending from the gate electrode of the driving transistor and electrically connected to a semiconductor layer of the switching transistor; an upper storage electrode electrically connected to the semiconductor layer of the driving transistor, the light blocking pattern, and the semiconductor layer of the initialization transistor, and overlapping the lower storage electrode; a semiconductor layer of a first auxiliary transistor disposed in a region adjacent at least one of the semiconductor layer of the switching transistor and the semiconductor layer of the initialization transistor; a first electrode of the first auxiliary transistor electrically connected to the semiconductor layer of the first auxiliary transistor and overlapping at least one of the data line and the initialization voltage line; and a second electrode of the first auxiliary transistor electrically connected to the semiconductor layer of the first auxiliary transistor and overlapping at least one of the lower storage electrode and the light blocking pattern.

The display device may further include a scan line disposed on the substrate; and a gate electrode of the switching transistor, a gate electrode of the initialization transistor, and a gate electrode of the first auxiliary transistor extending from the scan line, wherein the gate electrode of the switching transistor may overlap the semiconductor layer of the switching transistor, the gate electrode of the initialization transistor may overlap the semiconductor layer of the initialization transistor, and the gate electrode of the first auxiliary transistor may overlap the semiconductor layer of the first auxiliary transistor.

The display device may further include a first electrode of the switching transistor electrically connecting between the semiconductor layer of the switching transistor and the data line; a second electrode of the switching transistor electrically connecting between the semiconductor layer of the switching transistor and the lower storage electrode; and a second electrode of the initialization transistor electrically connecting between the semiconductor layer of the initialization transistor and the initialization voltage line.

The data line may include a first data line, a second data line, and a third data line to which different data voltages are applied, and the first electrode of the first auxiliary transistor may overlap the first data line, the second data line, and the third data line.

The display device may further include a semiconductor layer of a second auxiliary transistor disposed in a region of the semiconductor layer of the switching transistor; a first electrode of a second auxiliary transistor electrically connected to the semiconductor layer of the second auxiliary transistor and overlapping the data line; and a second electrode of the second auxiliary transistor electrically connected to the semiconductor layer of the second auxiliary transistor and overlapping the lower storage electrode, wherein the semiconductor layer of the first auxiliary transistor may be disposed adjacent the semiconductor layer of the initialization transistor, the first electrode of the first auxiliary transistor may overlap the initialization voltage line, and the second electrode of the first auxiliary transistor may overlap the light blocking pattern.

The display device may further include a scan line disposed on the substrate; and a gate electrode of the switching transistor, a gate electrode of the initialization transistor, a gate electrode of the first auxiliary transistor, and a gate electrode of the second auxiliary transistor extending from the scan line, wherein the gate electrode of the switching transistor may overlap the semiconductor layer of the switching transistor, the gate electrode of the initialization transistor may overlap the semiconductor layer of the initialization transistor, the gate electrode of the first auxiliary transistor may overlap the semiconductor layer of the first auxiliary transistor, and the gate electrode of the second auxiliary transistor may overlap the semiconductor layer of the second auxiliary transistor.

The data line may include a first data line, a second data line, and a third data line to which different data voltages are applied, and the first electrode of the second auxiliary transistor may overlap the first data line, the second data line, and the third data line.

An embodiment provides a method for repairing a display device that may include disconnecting between a semiconductor layer of an initialization transistor and an initialization voltage line; disconnecting between the semiconductor layer of the initialization transistor and an upper storage electrode; short-circuiting a first electrode of a first auxiliary transistor and the initialization voltage line; and short-circuiting a second electrode of the first auxiliary transistor and the upper storage electrode, wherein the display deice may include the initialization transistor, the first auxiliary transistor, the initialization voltage line, and the upper storage electrode.

Laser beams may be irradiated to an overlapping portion of the first electrode of the first auxiliary transistor and the initialization voltage line in the short-circuiting of the first electrode of the first auxiliary transistor and the initialization voltage line, and laser beams may be irradiated to an overlapping portion of the second electrode of the first auxiliary transistor and the upper storage electrode in the short-circuiting of the second electrode of the first auxiliary transistor and the upper storage electrode.

The method may further include disconnecting between a semiconductor layer of a switching transistor and a data line; disconnecting between the semiconductor layer of the switching transistor and a lower storage electrode; short-circuiting a first electrode of a second auxiliary transistor and the data line; and short-circuiting a second electrode of the second auxiliary transistor and the lower storage electrode, wherein the display device may include the switching transistor, the second auxiliary transistor, the data line, and the lower storage electrode.

Laser beams may be irradiated to an overlapping portion of the first electrode of the second auxiliary transistor and the data line in the short-circuiting the first electrode of the second auxiliary transistor and the data line, and laser beams may be irradiated to an overlapping portion of the second electrode of the second auxiliary transistor and the lower storage electrode in the short-circuiting the second electrode of the second auxiliary transistor and the lower storage electrode.

An embodiment provides a display device that may include a driving voltage line, a data line, an initialization voltage line, a light blocking pattern, and a dummy light blocking pattern disposed on a substrate; a semiconductor layer of a driving transistor electrically connected to the driving voltage line; a semiconductor layer of a switching transistor electrically connected to the data line; a semiconductor layer of an initialization transistor electrically connected to the initialization voltage line; a gate electrode of the driving transistor overlapping the semiconductor layer of the driving transistor; a lower storage electrode extending from the gate electrode of the driving transistor and electrically connected to the semiconductor layer of the switching transistor; an upper storage electrode electrically connected to the semiconductor layer of the driving transistor, the light blocking pattern, and the semiconductor layer of the initialization transistor, and overlapping the lower storage electrode; a semiconductor layer of a dummy driving transistor disposed in a region adjacent the driving voltage line; a semiconductor layer of a dummy switching transistor disposed in a region adjacent the data line; a semiconductor layer of a dummy initialization transistor disposed in a region adjacent the initialization voltage line; a gate electrode of a dummy driving transistor overlapping the semiconductor layer of the dummy driving transistor; a dummy lower storage electrode extending from the gate electrode of the dummy driving transistor and electrically connected to the semiconductor layer of the dummy switching transistor; a dummy upper storage electrode electrically connected to the semiconductor layer of the dummy driving transistor, the dummy light blocking pattern, and the semiconductor layer of the dummy initialization transistor, and overlapping the dummy lower storage electrode; and a driving auxiliary wire overlapping the light blocking pattern and the dummy light blocking pattern.

The display device may further include a scan line and a dummy scan line disposed on the substrate; a gate electrode of a switching transistor and a gate electrode of an initialization transistor extending from the scan line; a gate electrode of a dummy switching transistor and a gate electrode of a dummy initialization transistor extending from the dummy scan line; and a scan auxiliary wire overlapping the scan line and the dummy scan line, wherein the gate electrode of the switching transistor may overlap the semiconductor layer of the switching transistor, the gate electrode of the initialization transistor may overlap the semiconductor layer of the initialization transistor, the gate electrode of the dummy switching transistor may overlap the semiconductor layer of the dummy switching transistor, and the gate electrode of the dummy initialization transistor may overlap the semiconductor layer of the dummy initialization transistor.

The driving auxiliary wire may include a first portion overlapping the scan line; a second portion overlapping the light blocking pattern; a third portion overlapping the semiconductor layer of the initialization transistor; and a fourth portion overlapping the semiconductor layer of the switching transistor, the first portion, the second portion, the third portion, and the fourth portion may be electrically connected to each other, and the third portion and the fourth portion may be disposed on a different layer from a layer of the first portion and the second portion.

The display device may further include a first electrode of a switching transistor electrically connecting between the semiconductor layer of the switching transistor and the data line; a second electrode of a switching transistor electrically connecting between the semiconductor layer of the switching transistor and the lower storage electrode; and a second electrode of an initialization transistor electrically connecting between the semiconductor layer of the initialization transistor and the initialization voltage line, wherein the first electrode and the second electrode of the switching transistor and the second electrode of the initialization transistor may be disposed on a same layer as a layer of a first portion and a second portion of the driving auxiliary wire.

The substrate may include a display area and a peripheral area, the semiconductor layer and the gate electrode of the driving transistor, the semiconductor layer and the gate electrode of the switching transistor, and the semiconductor layer and the gate electrode of the initialization transistor may be disposed in the display area, the semiconductor layer and the gate electrode of the dummy driving transistor, the semiconductor layer and the gate electrode of the dummy switching transistor, and the semiconductor layer and the gate electrode of the dummy initialization transistor may be disposed in the peripheral area, and the driving voltage line, the data line, the initialization voltage line, the driving auxiliary wire, and the scan auxiliary wire may extend to the peripheral area from the display area.

The display device may further include a scan line disposed on the substrate; and a gate electrode of the switching transistor, a gate electrode of the initialization transistor, a gate electrode of the dummy switching transistor, and a gate electrode of the dummy initialization transistor extending from the scan line, wherein the gate electrode of the switching transistor may overlap the semiconductor layer of the switching transistor, the gate electrode of the initialization transistor may overlap the semiconductor layer of the initialization transistor, the gate electrode of the dummy switching transistor may overlap the semiconductor layer of the dummy switching transistor, and the gate electrode of the dummy initialization transistor may overlap the semiconductor layer of the dummy initialization transistor.

An embodiment provides a method for repairing a display device that may include disconnecting between a semiconductor layer of a driving transistor and a driving voltage line; disconnecting between a semiconductor layer of a switching transistor and a data line; disconnecting between a semiconductor layer of an initialization transistor and an initialization voltage line; short-circuiting a light blocking pattern and a driving auxiliary wire; short-circuiting an upper storage electrode and a lower storage electrode; short-circuiting a semiconductor layer of a dummy driving transistor and the driving voltage line; short-circuiting a semiconductor layer of a dummy switching transistor and the data line; short-circuiting a semiconductor layer of a dummy initialization transistor and the initialization voltage line; and short-circuiting a dummy light blocking pattern and a driving auxiliary wire, wherein the display device may include the driving transistor, dummy driving transistor, the switching transistor, the dummy switching transistor, the initialization transistor, the dummy initialization transistor, the driving voltage line, the data line, the initialization voltage line, the light blocking pattern, the driving auxiliary wire, and the upper and lower storage electrodes.

The method may further include short-circuiting a scan line and a scan auxiliary wire; and short-circuiting a dummy scan line and the scan auxiliary wire, wherein the display device may include the scan line, the dummy scan line, and the scan auxiliary wire.

Laser beams may be irradiated to an overlapping portion of the light blocking pattern and the driving auxiliary wire in the short-circuiting of the light blocking pattern and the driving auxiliary wire, laser beams may be irradiated to an overlapping portion of the dummy light blocking pattern and the driving auxiliary wire in the short-circuiting of the dummy light blocking pattern and the driving auxiliary wire, laser beams may be irradiated to an overlapping portion of the scan line and the scan auxiliary wire in the short-circuiting of the scan line and the scan auxiliary wire, and laser beams may be irradiated to an overlapping portion of the dummy scan line and the scan auxiliary wire in the short-circuiting of the dummy scan line and the scan auxiliary wire.

According to the embodiments, in case that a defect is generated to the transistor, the defective pixel may be made good according to the repairing process.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
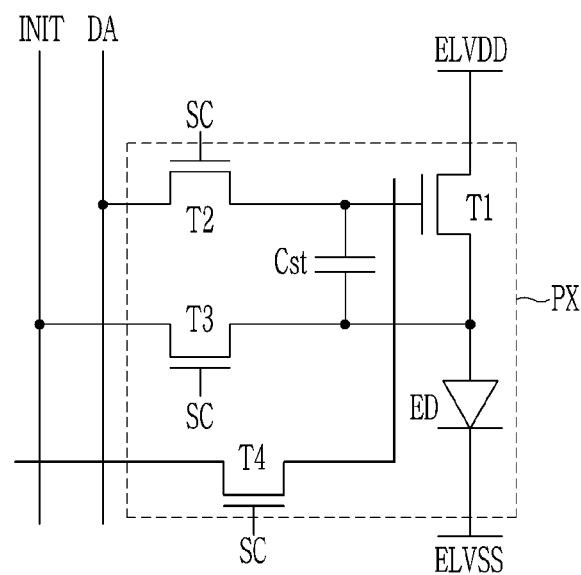
FIG. 1 shows a schematic diagram of an equivalent circuit of a pixel of a display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

Parts that may be irrelevant to the description may be omitted to clearly describe the disclosure, and the same elements will be designated by the same reference numerals throughout the specification.

The size and thickness of each configuration shown in the drawings are arbitrarily shown for better understanding and ease of description, but the disclosure is not limited thereto. In the drawings, the thickness of layers, films, panels, regions, etc., are exaggerated for clarity. The thicknesses of some layers and areas are exaggerated for convenience of explanation.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

For example, when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Unless explicitly described to the contrary, the word "comprise" and variations such as "comprises" or "comprising", "includes," and/or "including,", "has," "have," and/or "having," and variations thereof will be understood to imply the inclusion of stated elements but not the exclusion of any other elements.

The phrase "in a plan view" means viewing an object portion from the top, and the phrase "in a schematic cross-sectional view" means viewing a cross-section of which the object portion is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A display device according to an embodiment will now be described with reference to FIG. 1.

FIG. 1 shows a schematic diagram of an equivalent circuit of a pixel of a display device according to an embodiment.

The display device may include pixels PX. As shown in FIG. 1, pixels PX may respectively include transistors (e.g., transistors T1, T2, T3, and T4), a capacitor Cst, and at least one light emitting diode ED that is a light-emitting device. In the embodiment, an example in which one pixel PX may include one light emitting diode ED will be generally described.

Transistors (e.g., transistors T1, T2, T3, and T4) include a driving transistor T1, a switching transistor T2, an initialization transistor T3, and a first auxiliary transistor T4. A first electrode and a second electrode to be described below are connected to a first region and a second region positioned on respective sides of a channel of a semiconductor layer of the respective transistors (e.g., transistors T1, T2, T3, and T4), and they may be a source electrode or a drain electrode. The first electrode and second electrode may also represent a first region and a second region positioned on respective sides of the channel of the semiconductor layer.

The driving transistor T1 may include a gate electrode connected to a first end of the capacitor Cst, a first electrode connected to a driving voltage line for transmitting a driving voltage ELVDD, and a second electrode connected to an anode of the light emitting diode ED and a second end of the capacitor Cst. The driving transistor T1 may receive a data voltage DA according to a switching operation of the switching transistor T2, and may supply a driving current to the light emitting diode ED according to a voltage stored in the capacitor Cst.

The switching transistor T2 may include a gate electrode connected to a first scan line for transmitting a first scan signal SC, a first electrode connected to a data line for transmitting a data voltage DA or a reference voltage, and a second electrode connected to the first end of the capacitor Cst and the gate electrode of the driving transistor T1. The switching transistor T2 may be turned on according to the first scan signal SC, and may transmit the reference voltage or the data voltage DA to the gate electrode of the driving transistor T1 and the first end of the capacitor Cst.

The initialization transistor T3 may include a gate electrode connected to the first scan line for transmitting a first scan signal SC, a first electrode connected to the second end of the capacitor Cst, the second electrode of the driving transistor T1, and the anode of the light emitting diode ED, and a second electrode connected to the initialization voltage line for transmitting the initialization voltage INIT. The initialization transistor T3 may be turned on by the first scan signal SC and may transmit the initialization voltage INIT to the anode of the light emitting diode ED and the second end of the capacitor Cst to initialize a voltage at the anode of the light emitting diode ED.

A gate electrode of the first auxiliary transistor T4 may be electrically connected to the first scan line for transmitting the first scan signal SC. Some or a number of electrodes of the first auxiliary transistor T4 may not be electrically connected to other wires but may float. They may, however, be electrically connected to the other wires, within the spirit and the scope of the disclosure. A first electrode of the first auxiliary transistor T4 may be electrically connected to the data line or the initialization voltage line. A second electrode of the first auxiliary transistor T4 may be electrically connected to the gate electrode or the second electrode of the driving transistor T1.

The respective pixels PX may include the first auxiliary transistor T4, and in most of the pixels PX, the first auxiliary transistor T4 may not be electrically connected and may not be operable. However, on some or a number of pixels PX, the first auxiliary transistor T4 may be electrically connected to another wire and may be operable. For example on some or a number of pixels PX, in the case of the pixel in which a defect may be generated to the switching transistor T2 or the initialization transistor T3, one of the switching transistor T2 and the initialization transistor T3 may be separated from other wires, and the first auxiliary transistor T4 may be electrically connected thereto in substitution for the separated one. In this instance, the first auxiliary transistor T4 functions as the switching transistor T2 or the initialization transistor T3. For example, the first auxiliary transistor T4 may be electrically connected between the data line and the gate electrode of the driving transistor T1, and may substitute for the switching transistor T2 in this instance. As another example, the first auxiliary transistor T4 may be electrically connected between the initialization voltage line and the second electrode of the driving transistor T1, and may substitute for the initialization transistor T3 in this instance.

The first end of the capacitor Cst is connected to the gate electrode of the driving transistor T1, and the second end thereof is connected to the first electrode of the initialization transistor T3 and the anode of the light emitting diode ED. A cathode of the light emitting diode ED is connected to the common voltage line for transmitting the common voltage ELVSS.

The light emitting diode ED may emit light with luminance caused by the driving current generated by the driving transistor T1.

A detailed structure of a display device according to an embodiment will now be described with reference to FIG. 1 and FIG. 2 to FIG. 8.

Figure 2:
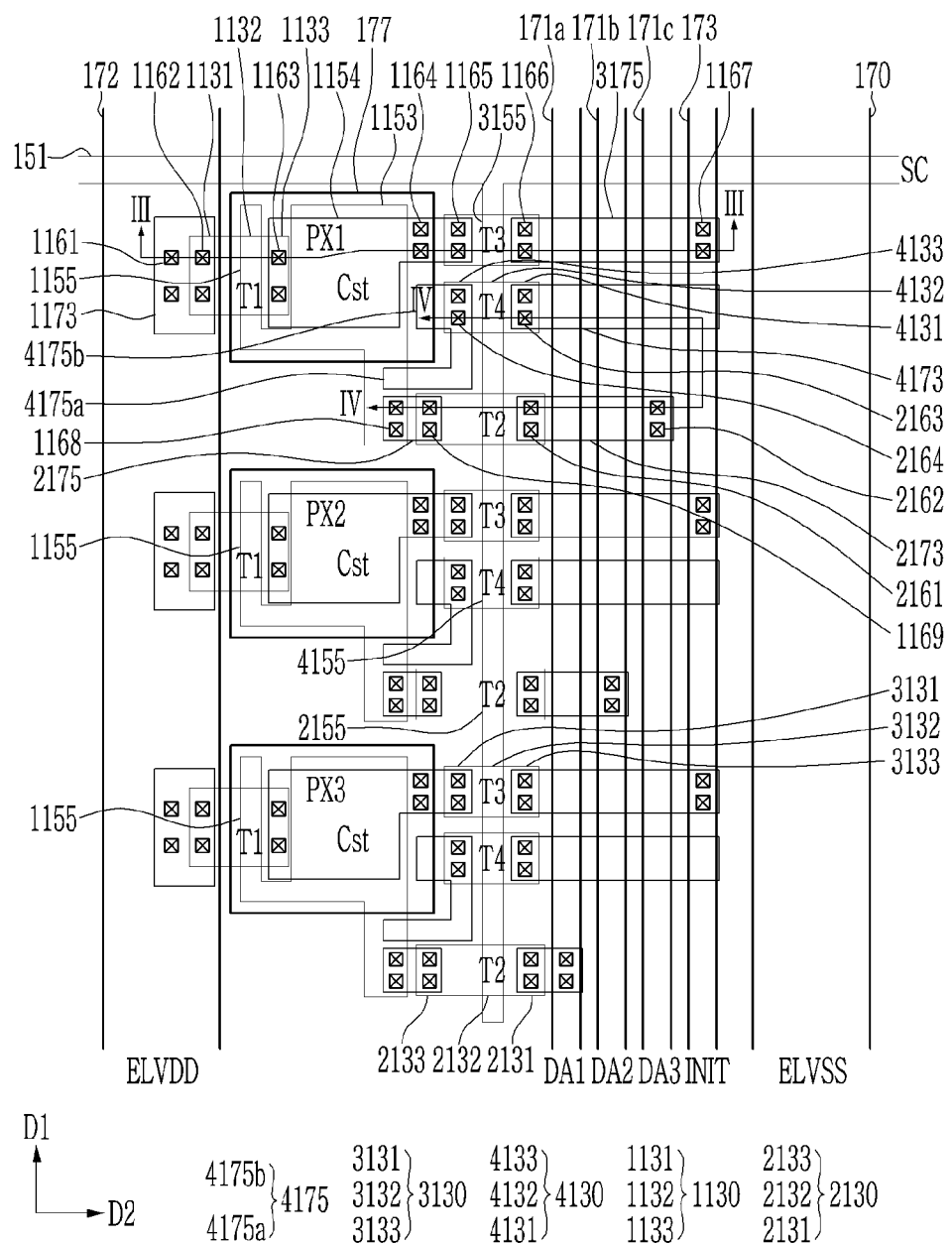
FIG. 2 shows a schematic top plan view of a display device according to an embodiment.
Figure 3:
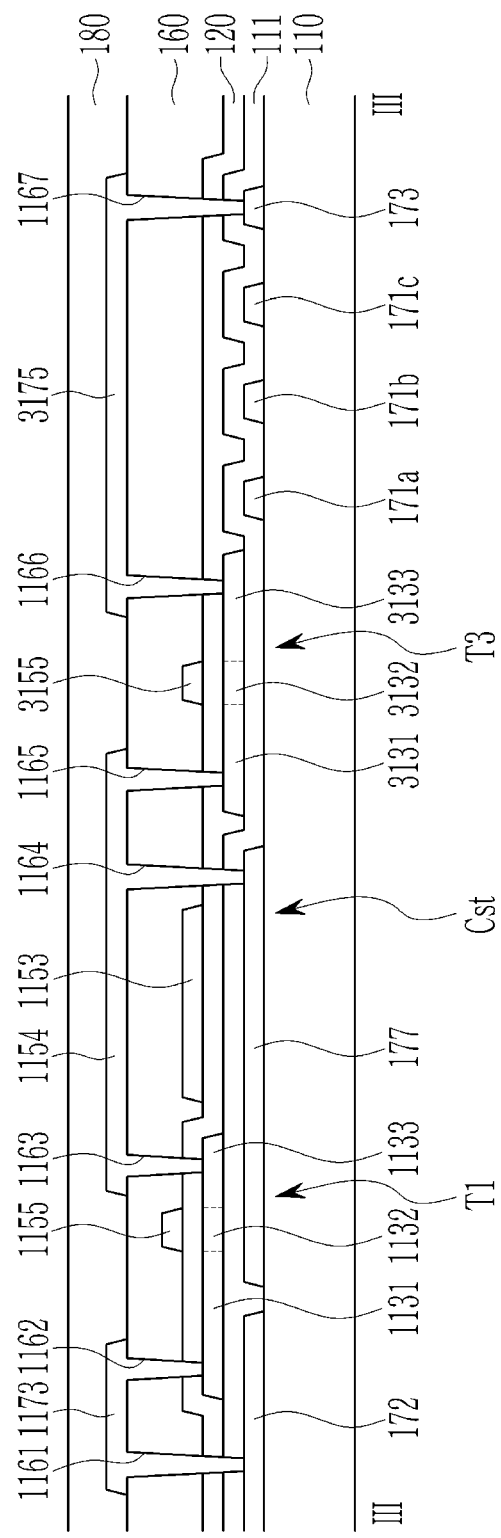
FIG. 3 shows a schematic cross-sectional view of a display device according to an embodiment with respect to a line III-III of FIG. 2.
Figure 4:
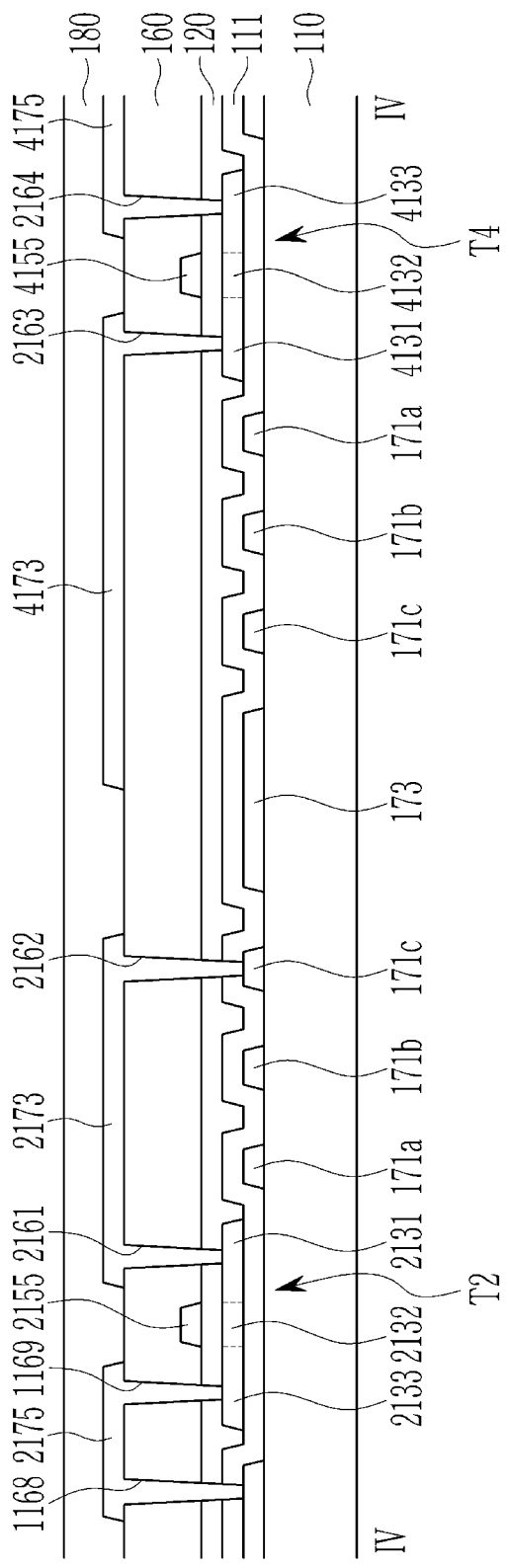
FIG. 4 shows a schematic cross-sectional view of a display device according to an embodiment with respect to a line IV-IV of FIG. 2.

FIG. 2 shows a schematic top plan view of a display device according to an embodiment, FIG. 3 shows a schematic cross-sectional view of a display device according to an embodiment with respect to a line III-III of FIG. 2, and FIG. 4 shows a schematic cross-sectional view of a display device according to an embodiment with respect to a line IV-IV of FIG. 2. FIG. 5 to FIG. 8 show sequential schematic top plan views in an order for manufacturing a display device according to an embodiment. FIG. 2 to FIG. 8 illustrate three adjacent pixels of a display device according to an embodiment, and the three pixels may be repeatedly disposed.

Here, pixels PX1, PX2, and PX3 may respectively represent a portion or a region in which constituent elements included by the above-noted one pixel PX, for example, where transistors (e.g., transistors T1, T2, T3, and T4), a capacitor Cst, and a light emitting diode ED are positioned.

The display device according to an embodiment may include a substrate 110. The substrate 110 may include a material that is not bent because of a rigid characteristic such as glass, or may include a flexible material that may be bent like plastic or polyimide.

Figure 5:
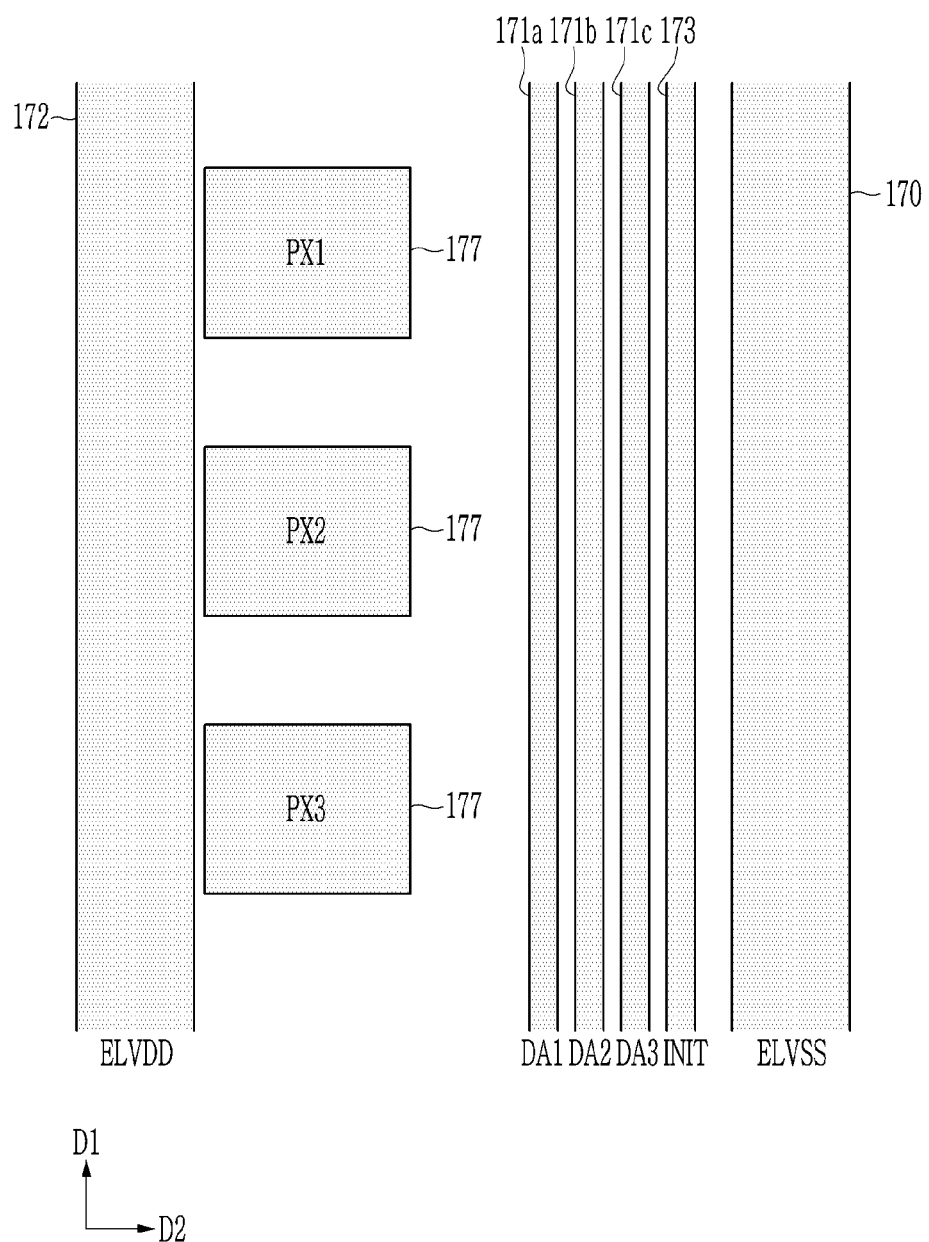
FIG. 5 to FIG. 8 show sequential schematic top plan views in an order for manufacturing a display device according to an embodiment.

A first conductive layer including a first data line 171a, a second data line 171b, and a third data line 171c may be positioned on the substrate 110. FIG. 5 illustrates the first conductive layer.

The first data line 171a, the second data line 171b, and the third data line 171c extend in a first direction D1. For example, the first data line 171a, the second data line 171b, and the third data line 171c may have a width, and may have a bar shape extending in the first direction D1. The first data line 171a, the second data line 171b, and the third data line 171c may be positioned to be adjacent to each other in a second direction D2 traversing the first direction D1. The first data line 171a, the second data line 171b, and the third data line 171c may be positioned to have an interval therebetween. Different data voltages DA1, DA2, and DA3 are applied to the first data line 171a, the second data line 171b, and the third data line 171c, which may be separately disposed to prevent a short-circuit among them. The first direction D1 may be a column direction, and the second direction D2 may be a row direction. The first direction D1 and the second direction D2 may cross or intersect each other and may be orthogonal to each other. A second data line 171b may be adjacently positioned on a right of the first data line 171a, and a third data line 171c may be adjacently positioned on a right of the second data line 171b. In this instance, the expression that the data lines 171a, 171b, and 171c are adjacently positioned indicates that no other wire extending in parallel to the data lines 171a, 171b, and 171c is positioned among the data lines 171a, 171b, and 171c. For example, no other wire extending in parallel to the adjacent first data line 171a and the second data line 171b may be positioned among the lines. Further, no other wire may be positioned between the second data line 171b and the third data line 171c that are adjacent to each other.

The first conductive layer may further include a common voltage line 170, an initialization voltage line 173, a driving voltage line 172, and a light blocking pattern 177.

The common voltage line 170, the initialization voltage line 173, and the driving voltage line 172 extend in the first direction D1. For example, the common voltage line 170, the initialization voltage line 173, and the driving voltage line 172 may extend in parallel to the first to third data lines 171a, 171b, and 171c. The common voltage line 170, the initialization voltage line 173, and the driving voltage line 172 may be positioned to be spaced from each other with an interval therebetween. The common voltage ELVSS may be applied to the common voltage line 170, the initialization voltage INIT may be applied to the initialization voltage line 173, and the driving voltage ELVDD may be applied to the driving voltage line 172. The common voltage line 170, the initialization voltage line 173, and the driving voltage line 172 to which different voltages are applied may be spaced from each other so that they may not be short-circuited. The initialization voltage line 173 may be positioned near or disposed in a region adjacent the third data line 171c, and the common voltage line 170 may be positioned near or disposed in a region adjacent the initialization voltage line 173. However, their positions are not limited and may be changed.

The light blocking pattern 177 may be positioned between the driving voltage line 172 and the first data line 171a in a plan view. The first to third pixels PX1, PX2, and PX3 respectively include a light blocking pattern 177, and light blocking patterns 177 may be positioned near or disposed in a region adjacent each other in the first direction D1. In a plan view, a light blocking pattern 177 of the second pixel PX2 may be positioned at a bottom of the light blocking pattern 177 of the first pixel PX1, and a light blocking pattern 177 of the third pixel PX3 may be positioned at a bottom of the light blocking pattern 177 of the second pixel PX2.

A shape of the light blocking pattern 177 may be a polygon in a plan view. The shapes of the light blocking patterns 177 of pixels PX1, PX2, and PX3 may be the same or different in a plan view. For example, the light blocking patterns 177 of pixels PX1, PX2, and PX3 may be rectangular.

A buffer layer 111 that is an insulating layer may be positioned on a first conductive layer including a first data line 171a, a second data line 171b, a third data line 171c, a common voltage line 170, an initialization voltage line 173, a driving voltage line 172, and a light blocking pattern 177.

The buffer layer 111 is positioned between the substrate 110 and the semiconductor layer, and it may improve a characteristic of polysilicon by blocking an impurity from the substrate 110 during a crystallization process for forming polysilicon. Further, a stress of the semiconductor layer on the buffer layer 111 may be relaxed by planarizing the substrate 110. The buffer layer 111 may include an inorganic insulating material such as a silicon nitride ($SiN_x$), a silicon oxide ($SiO_x$), or a silicon oxynitride ($SiO_xN_y$). The buffer layer may be a single or multi-layered structure of the material.

Figure 6:
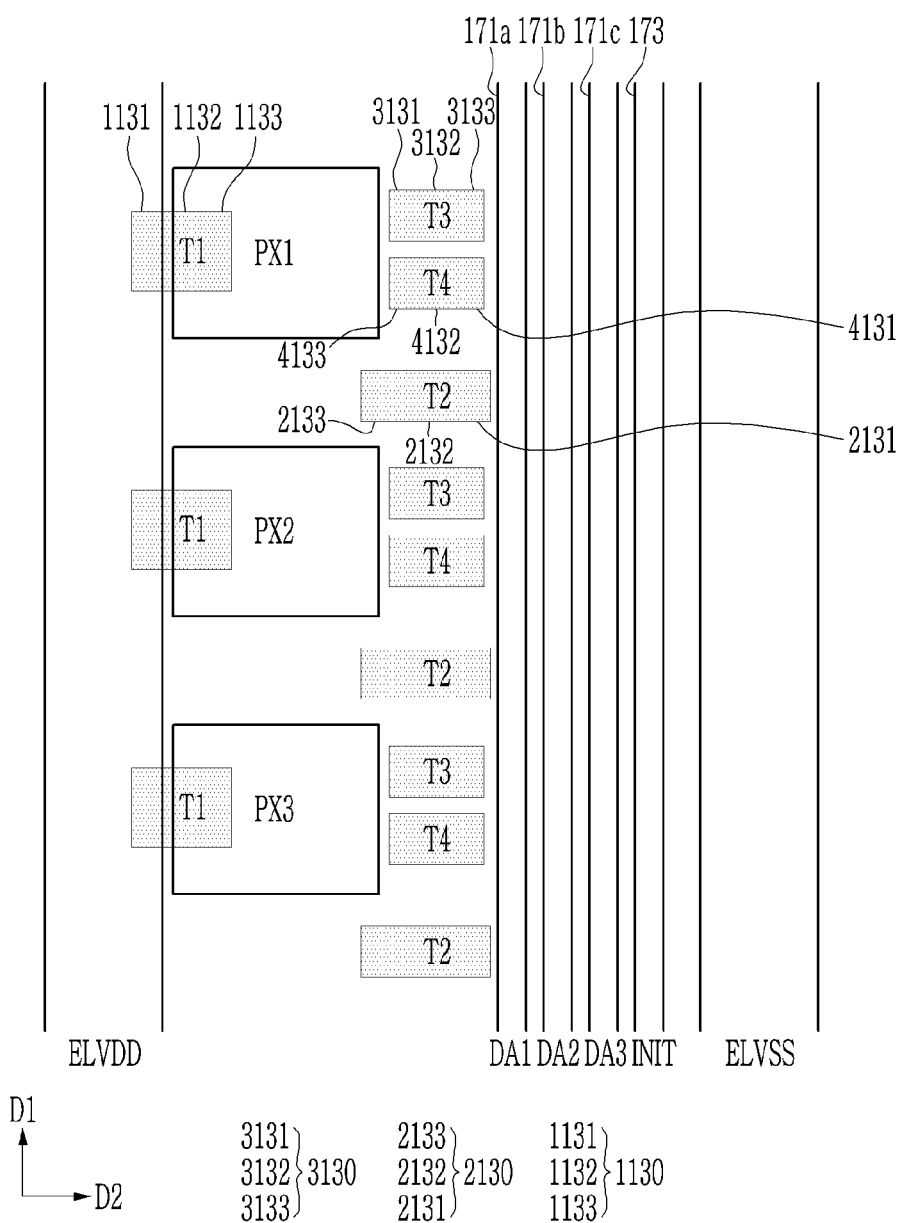

Semiconductor layers including a semiconductor layer 1130 of the driving transistor T1 of the first to third pixels PX1, PX2, and PX3, a semiconductor layer 2130 of the switching transistor T2, a semiconductor layer 3130 of the initialization transistor T3, and a semiconductor layer 4130 of the first auxiliary transistor T4 may be positioned on the buffer layer 111. FIG. 6 illustrates a first conductive layer and a semiconductor layer. The semiconductor layer may include a semiconductor material such as amorphous silicon, polysilicon, or an oxide semiconductor.

The semiconductor layer 1130 of the driving transistor T1 may include a first region 1131, a channel 1132, and a second region 1133. The first region 1131 and the second region 1133 may be a source region or a drain region. The first region 1131, the channel 1132, and the second region 1133 may be integral with each other, and may have a bar shape extending in the second direction D2. The channel 1132 of the semiconductor layer 1130 of the driving transistor T1 may be positioned between the first region 1131 and the second region 1133. The first region 1131 of the driving transistor T1 may overlap the driving voltage line 172. The first region 1131 of the driving transistor T1 may be connected to the driving voltage line 172, and may receive a driving voltage ELVDD from the driving voltage line 172. In this instance, the first region 1131 of the driving transistor T1 may not be connected to or directly connected to the driving voltage line 172 but may be indirectly connected thereto. The channel 1132 and the second region 1133 of the driving transistor T1 may overlap the light blocking pattern 177.

The driving transistors T1 of the first to third pixels PX1, PX2, and PX3 may be sequentially positioned in the first direction D1. For example, in a plan view, the driving transistor T1 of the second pixel PX2 may be positioned at the bottom of the driving transistor T1 of the first pixel PX1, and the driving transistor T1 of the third pixel PX3 may be positioned at the bottom of the driving transistor T1 of the second pixel PX2.

The semiconductor layer 2130 of the switching transistor T2 may include a first region 2131, a channel 2132, and a second region 2133. In this instance, the first region 2131 and the second region 2133 may be a source region or a drain region. The first region 2131, the channel 2132, and the second region 2133 may be integral with each other, and may have a bar shape extending in the second direction D2. The channel 2132 of the semiconductor layer 2130 of the switching transistor T2 may be positioned between the first region 2131 and the second region 2133. The first region 2131 of the switching transistor T2 may be connected to one of the data lines 171a, 171b, and 171c. For example, the first region 2131 of the switching transistor T2 of the first pixel PX1 may be connected to the third data line 171c. The first region 2131 of the switching transistor T2 of the second pixel PX2 may be connected to the second data line 171b.

The first region 2131 of the switching transistor T2 of the third pixel PX3 may be connected to the first data line 171a. However, the first regions 2131 of the switching transistors T2 of the first to third pixels PX1, PX2, and PX3 may not be connected to or directly connected to the data lines 171a, 171b, and 171c but may be indirectly connected thereto. Connection relationships of the switching transistors T2 of the first to third pixels PX1, PX2, and PX3 and the data lines 171a, 171b, and 171c are not limited thereto and may be variable in many ways. For example, the first region 2131 of the switching transistor T2 of the first pixel PX1 may be connected to the first data line 171a, and the first region 2131 of the switching transistor T2 of the third pixel PX3 may be connected to the third data line 171c. The switching transistors T2 of the first to third pixels PX1, PX2, and PX3 may be sequentially positioned in the first direction D1. For example, in a plan view, the switching transistor T2 of the second pixel PX2 may be positioned at the bottom of the switching transistor T2 of the first pixel PX1, and the switching transistor T2 of the third pixel PX3 may be positioned at the bottom of the switching transistor T2 of the second pixel PX2. The switching transistors T2 of the first to third pixels PX1, PX2, and PX3 are connected to the data lines 171a, 171b, and 171c that are different from each other.

The semiconductor layer 3130 of the initialization transistor T3 may include a first region 3131, a channel 3132, and a second region 3133. In this instance, the first region 3131 and the second region 3133 may be a source region or a drain region. The first region 3131, the channel 3132, and the second region 3133 may be integral with each other, and may have a bar shape extending in the second direction D2. The channel 3132 of the semiconductor layer 3130 of the initialization transistor T3 may be positioned between the first region 3131 and the second region 3133. The second region 3133 of the initialization transistor T3 may be connected to the initialization voltage line 173, and may receive the initialization voltage INIT. However, the second region 3133 of the initialization transistor T3 may not be connected to or directly connected to the initialization voltage line 173 but may be indirectly connected thereto. The first region 3131 of the initialization transistor T3 may be connected to the second region 1133 of the driving transistor T1 and the light blocking pattern 177. However, the first region 3131 of the initialization transistor T3 may not be connected to or directly connected to the second region 1133 of the driving transistor T1 and the light blocking pattern 177 but may be indirectly connected thereto.

The initialization transistors T3 of the first to third pixels PX1, PX2, and PX3 may be sequentially positioned in the first direction D1. For example, in a plan view, the initialization transistor T3 of the second pixel PX2 may be positioned at a bottom of the initialization transistor T3 of the first pixel PX1, and the initialization transistor T3 of the third pixel PX3 may be positioned at a bottom of the initialization transistor T3 of the second pixel PX2.

The semiconductor layer 4130 of the first auxiliary transistor T4 may include a first region 4131, a channel 4132, and a second region 4133. In this instance, the first region 4131 and the second region 4133 may be a source region or a drain region. The first region 4131, the channel 4132, and the second region 4133 may be integral with each other, and may have a bar shape extending in the second direction D2. The channel 4132 of the semiconductor layer 4130 of the first auxiliary transistor T4 may be positioned between the first region 4131 and the second region 4133.

The semiconductor layer 4130 of the first auxiliary transistor T4 may be positioned or disposed near the semiconductor layer 2130 of the switching transistor T2 and the semiconductor layer 3130 of the initialization transistor T3. For example, the semiconductor layer 4130 of the first auxiliary transistor T4 may be positioned or disposed between the semiconductor layer 2130 of the switching transistor T2 and the semiconductor layer 3130 of the initialization transistor T3. For example, the semiconductor layer 3130 of the initialization transistor T3, the semiconductor layer 4130 of the first auxiliary transistor T4, and the semiconductor layer 2130 of the switching transistor T2 may be sequentially positioned or disposed in the first direction D1. In this instance, the first region 4131 of the semiconductor layer 4130 of the first auxiliary transistor T4 may be positioned or disposed between the first region 2131 of the semiconductor layer 2130 of the switching transistor T2 and the second region 3133 of the semiconductor layer 3130 of the initialization transistor T3. The channel 4132 of the semiconductor layer 4130 of the first auxiliary transistor T4 may be positioned or disposed between the channel 2132 of the semiconductor layer 2130 of the switching transistor T2 and the channel 3132 of the semiconductor layer 3130 of the initialization transistor T3. The second region 4133 of the semiconductor layer 4130 of the first auxiliary transistor T4 may be positioned or disposed between the second region 2133 of the semiconductor layer 2130 of the switching transistor T2 and the first region 3131 of the semiconductor layer 3130 of the initialization transistor T3.

The semiconductor layer 4130 of the first auxiliary transistor T4 may not be electrically connected to other wires. However, depending on cases, the semiconductor layer 4130 of the first auxiliary transistor T4 may be electrically connected to another wire. For example, the first region 4131 of the semiconductor layer 4130 of the first auxiliary transistor T4 may be electrically connected to one of the data lines 171a, 171b, and 171c and the initialization voltage line 173. However, the first region 4131 of the semiconductor layer 4130 of the first auxiliary transistor T4 may not be connected to or directly connected to one of the data lines 171a, 171b, and 171c and the initialization voltage line 173 but may be indirectly connected thereto. The second region 4133 of the semiconductor layer 4130 of the first auxiliary transistor T4 may be electrically connected to one of the gate electrode 1155 of the driving transistor T1 and the second region 1133 of the semiconductor layer 1130 of the driving transistor T1. However, the second region 4133 of the semiconductor layer 4130 of the first auxiliary transistor T4 may not be connected to or directly connected to one of the gate electrode 1155 of the driving transistor T1 and the second region 1133 of the semiconductor layer 1130 of the driving transistor T1 but may be indirectly connected thereto.

The first auxiliary transistors T4 of the first to third pixels PX1, PX2, and PX3 may be sequentially positioned in the first direction D1. For example, in a plan view, the first auxiliary transistor T4 of the second pixel PX2 may be positioned at a bottom of the first auxiliary transistor T4 of the first pixel PX1, and the first auxiliary transistor T4 of the third pixel PX3 may be positioned at a bottom of the first auxiliary transistor T4 of the second pixel PX2.

A first insulating layer 120 may be positioned on the semiconductor layers including the semiconductor layer 1130 of the driving transistor T1, the semiconductor layer 2130 of the switching transistor T2, the semiconductor layer 3130 of the initialization transistor T3, and the semiconductor layer 4130 of the first auxiliary transistor T4.

Figure 7:
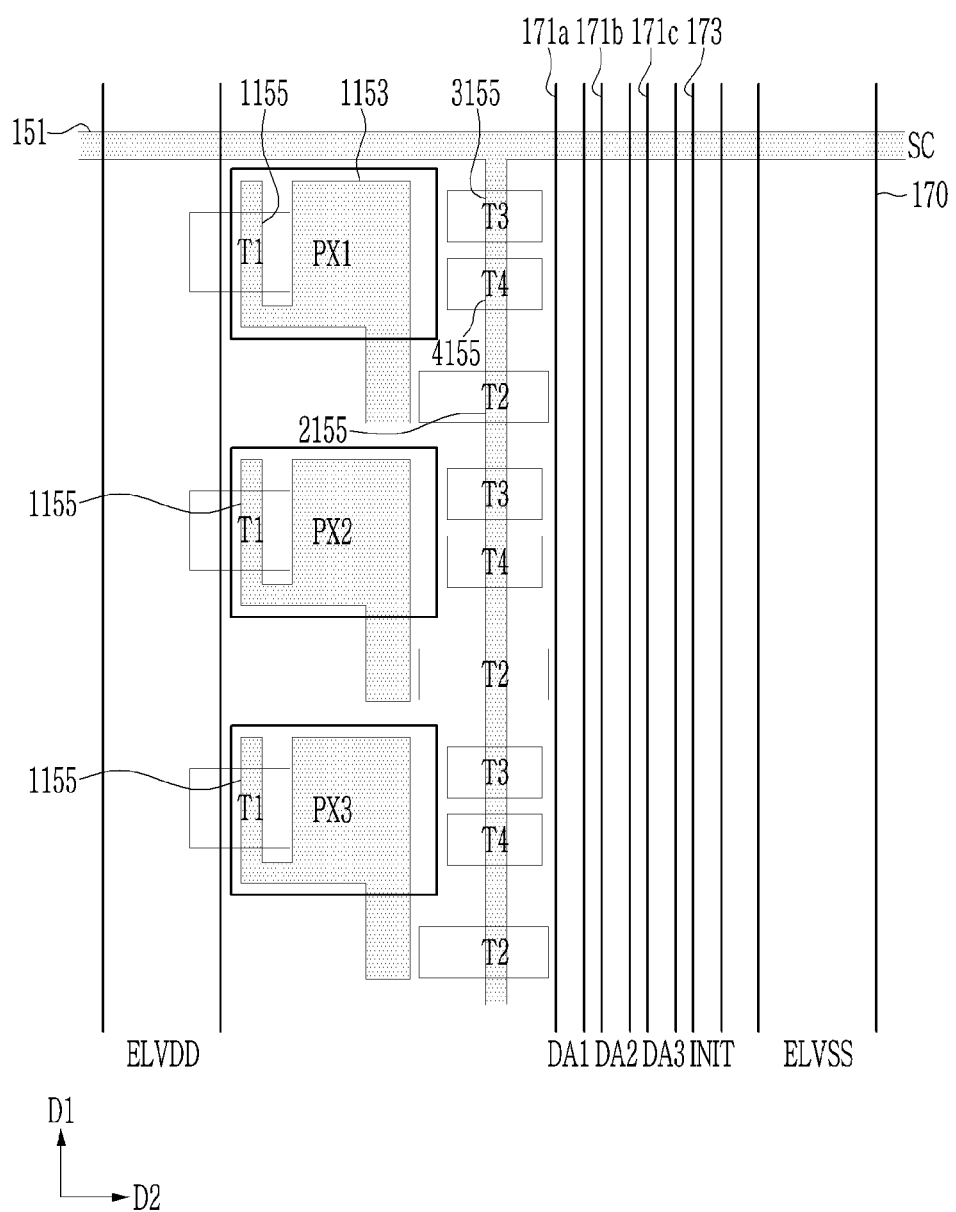

A second conductive layer including the gate electrodes 1155 of the driving transistor T1 of the first to third pixels PX1, PX2, and PX3, the lower storage electrode 1153, the gate electrode 2155 of the switching transistor T2, the gate electrode 3155 of the initialization transistor T3, and the gate electrode 4155 of the first auxiliary transistor T4 may be positioned on the first insulating layer 120. FIG. 7 illustrates a first conductive layer, a semiconductor layer, and a second conductive layer.

The gate electrode 1155 of the driving transistor T1 may overlap the channel 1132 of the driving transistor T1. The gate electrode 1155 of the driving transistor T1 may extend from the lower storage electrode 1153 and may be integral with each other. The lower storage electrode 1153 may be connected to the second region 2133 of the switching transistor T2. However, the lower storage electrode 1153 may not be connected to or directly connected to the second region 2133 of the switching transistor T2 but may be indirectly connected thereto. A shape of the lower storage electrode 1153 may be a polygon in a plan view. The shapes of the lower storage electrodes 1153 of the first to third pixels PX1, PX2, and PX3 in a plan view may be the same as or different from each other.

The gate electrode 2155 of the switching transistor T2 may overlap the channel 2132 of the switching transistor T2. The gate electrodes 2155 of the switching transistors T2 of the first to third pixels PX1, PX2, and PX3 may be connected to each other and may be integral with each other. Therefore, a same first scan signal SC may be applied to the gate electrodes 2155 of the switching transistors T2 of the first to third pixels PX1, PX2, and PX3. In this instance, the gate electrodes 2155 of the switching transistors T2 connected to each other may have a bar shape extending in the first direction D1.

The gate electrode 3155 of the initialization transistor T3 may overlap the channel 3132 of the initialization transistor T3. The gate electrodes 3155 of the initialization transistors T3 of the first to third pixels PX1, PX2, and PX3 may be connected to each other and may be integral with each other. Therefore, a same first scan signal SC may be applied to the gate electrodes 3155 of the initialization transistors T3 of the first to third pixels PX1, PX2, and PX3. In this instance, the gate electrodes 3155 of the initialization transistors T3 connected to each other may have a bar shape extending in the first direction D1.

The gate electrode 4155 of the first auxiliary transistor T4 may overlap the channel 4132 of the first auxiliary transistor T4. The gate electrodes 4155 of the first auxiliary transistors T4 of the first to third pixels PX1, PX2, and PX3 may be electrically connected to each other and may be integral with each other. The gate electrode 4155 of the first auxiliary transistor T4 may be electrically connected to the gate electrode 2155 of the switching transistor T2 and the gate electrode 3155 of the initialization transistor T3 and may be integral with each other.

The second conductive layer may further include a first scan line 151. The first scan line 151 may extend in the second direction D2, for example, it may extend in the row direction. The first scan line 151 may be connected to the gate electrodes 3155 of the initialization transistors T3 of the first to third pixels PX1, PX2, and PX3, the gate electrode 4155 of the first auxiliary transistor T4, and the gate electrode 2155 of the switching transistor T2, and may be integral with each other.

A doping process or a plasma processing may be performed after the second conductive layer is formed. The semiconductor layer covered by the second conductive layer is not doped or plasma processed, and a portion of the semiconductor layer not covered by the second conductive layer is doped or plasma processed to thus have the same characteristic as a conductor. For example, the channel 1132 of the driving transistor T1, the channel 2132 of the switching transistor T2, the channel 3132 of the initialization transistor T3, and the channel 4132 of the first auxiliary transistor T4 covered by the second conductive layer are not doped or plasma processed. The first region 1131 and the second region 1133 of the driving transistor T1, the first region 2131 and the second region 2133 of the switching transistor T2, the first region 3131 and the second region 3133 of the initialization transistor T3, and the first region 4131 and the second region 4133 of the first auxiliary transistor T4 not covered by the second conductive layer are doped or plasma processed to thus have the same characteristic as a conductor.

A second insulating layer 160 may be positioned on a second conductive layer including the gate electrode 1155 of the driving transistor T1, the lower storage electrode 1153, the gate electrode 2155 of the switching transistor T2, the gate electrode 3155 of the initialization transistor T3, and the gate electrode 4155 of the first auxiliary transistor T4.

Figure 8:
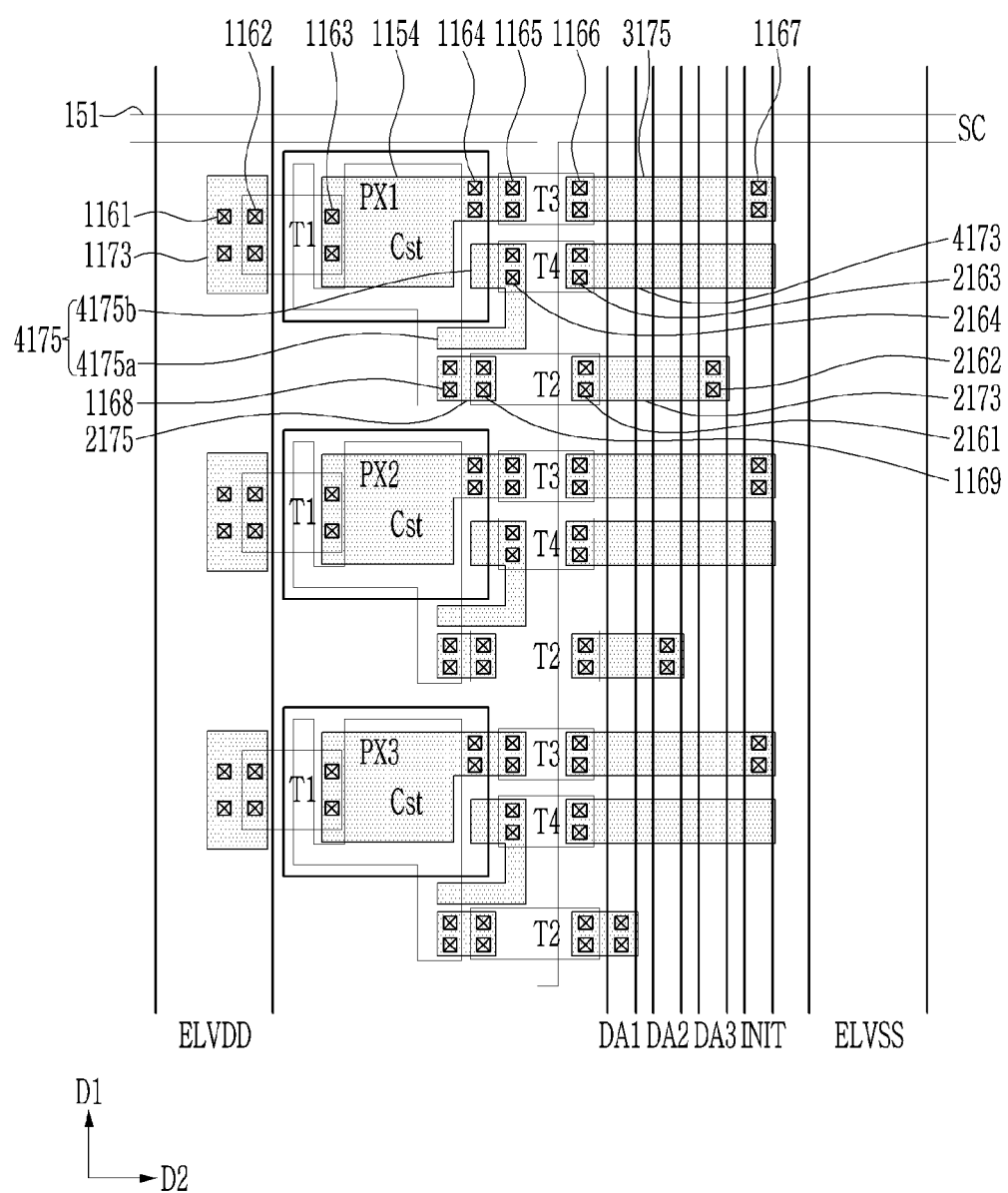

A third conductive layer including the first electrode 1173 of the driving transistor T1, the upper storage electrode 1154, the first electrode 2173 and the second electrode 2175 of the switching transistor T2, the second electrode 3175 of the initialization transistor T3, and the first electrode 4173 and the second electrode 4175 of the first auxiliary transistor T4 may be positioned on the second insulating layer 160. FIG. 8 illustrates a first conductive layer, a semiconductor layer, a second conductive layer, and a third conductive layer.

The first electrode 1173 of the driving transistor T1 may overlap the driving voltage line 172. The second insulating layer 160 may include an opening 1161 overlapping the first electrode 1173 of the driving transistor T1 and the driving voltage line 172. The opening 1161 may be further formed in the first insulating layer 120 and the buffer layer 111. The first electrode 1173 of the driving transistor T1 may be connected to the driving voltage line 172 through the opening 1161. The first electrode 1173 of the driving transistor T1 may overlap the first region 1131 of the semiconductor layer 1130 of the driving transistor T1. The second insulating layer 160 may include an opening 1162 overlapping the first electrode 1173 of the driving transistor T1 and the first region 1131 of the semiconductor layer 1130 of the driving transistor T1. The opening 1162 may be further formed in the first insulating layer 120. The first electrode 1173 of the driving transistor T1 may be connected to the first region 1131 of the semiconductor layer 1130 of the driving transistor T1 through the opening 1162. The first region 1131 of the semiconductor layer 1130 of the driving transistor T1 may be connected to the driving voltage line 172 through the first electrode 1173 of the driving transistor T1. Therefore, the driving voltage ELVDD may be applied to the first region 1131 of the semiconductor layer 1130 of the driving transistor T1 through the driving voltage line 172.

The upper storage electrode 1154 may overlap the lower storage electrode 1153. The lower storage electrode 1153 and the upper storage electrode 1154 may overlap each other with the second insulating layer 160 therebetween to form a capacitor Cst. The lower storage electrode 1153 may also overlap the light blocking pattern 177 with the first insulating layer 120 therebetween to thus form another capacitor Cst.

The upper storage electrode 1154 may overlap the second region 1133 of the driving transistor T1. The second insulating layer 160 may include an opening 1163 overlapping the upper storage electrode 1154 and the second region 1133 of the driving transistor T1. The opening 1163 may further be formed in the first insulating layer 120. The upper storage electrode 1154 may be connected to the second region 1133 of the driving transistor T1 through the opening 1163.

The upper storage electrode 1154 may overlap the light blocking pattern 177. The second insulating layer 160 may include an opening 1164 overlapping the upper storage electrode 1154 and the light blocking pattern 177. The opening 1164 may be further included in the first insulating layer 120 and the buffer layer 111. The upper storage electrode 1154 may be connected to the light blocking pattern 177 through the opening 1164. Hence, the light blocking pattern 177 may be connected to the second region 1133 of the driving transistor T1 through the upper storage electrode 1154. The same voltage as the voltage applied to the second region 1133 of the driving transistor T1 may be applied to the light blocking pattern 177.

The upper storage electrode 1154 may overlap the first region 3131 of the initialization transistor T3. The second insulating layer 160 may include an opening 1165 overlapping the upper storage electrode 1154 and the first region 3131 of the initialization transistor T3. The opening 1165 may be further included in the first insulating layer 120. The upper storage electrode 1154 may be connected to the first region 3131 of the initialization transistor T3 through the opening 1165. Therefore, the first region 3131 of the initialization transistor T3 may be connected to the second region 1133 of the driving transistor T1 through the upper storage electrode 1154.

The respective first to third pixels PX1, PX2, and PX3 include an upper storage electrode 1154, a lower storage electrode 1153, and a light blocking pattern 177. The upper storage electrode 1154, the lower storage electrode 1153, and the light blocking pattern 177 of the first to third pixels PX1, PX2, and PX3 may be positioned between the driving voltage line 172 and the first data line 171*a* in a plan view. The upper storage electrodes 1154 of the first to third pixels PX1, PX2, and PX3 may be positioned near or disposed in a region adjacent each other in the first direction D1. In a plan view, an upper storage electrode 1154 of the second pixel PX2 may be positioned at a bottom of an upper storage electrode 1154 of the first pixel PX1, and an upper storage electrode 1154 of the third pixel PX3 may be positioned at a bottom of an upper storage electrode 1154 of the second pixel PX2. The lower storage electrodes 1153 of the first to third pixels PX1, PX2, and PX3 may be positioned near or disposed in a region adjacent each other in the first direction D1. In a plan view, a lower storage electrode 1153 of the second pixel PX2 may be positioned at a bottom of a lower storage electrode 1153 of the first pixel PX1, and a lower storage electrode 1153 of the third pixel PX3 may be positioned at a bottom of a lower storage electrode 1153 of the second pixel PX2.

A shape of the upper storage electrode 1154 may be a polygon in a plan view. The shapes of the upper storage electrodes 1154 of the first to third pixels PX1, PX2, and PX3 may be the same or different in a plan view.

A first-side end of the first electrode 2173 of the switching transistor T2 may overlap a first region 2131 of the semiconductor layer 2130 of the switching transistor T2. The second insulating layer 160 may include an opening 2161 overlapping the first electrode 2173 of the switching transistor T2 and the first region 2131 of the semiconductor layer 2130. The opening 2161 may be further formed in the first insulating layer 120. The first electrode 2173 of the switching transistor T2 may be connected to the first region 2131 of the semiconductor layer 2130 of the switching transistor T2 through the opening 2161.

A second-side end of the first electrode 2173 of the switching transistor T2 may overlap the data lines 171*a*, 171*b*, and 171*c*. The second insulating layer 160 may include an opening 2162 overlapping the first electrode 2173 of the switching transistor T2 and the data lines 171*a*, 171*b*, and 171*c*. The opening 2162 may be further formed in the first insulating layer 120. The first electrode 2173 of the switching transistor T2 may be connected to one of the data lines 171*a*, 171*b*, and 171*c* through the opening 2162. The first electrode 2173 of the switching transistor T2 may be connected to the third data line 171*c* through the opening 2162, regarding the first pixel PX1. The first electrode 2173 of the switching transistor T2 may be connected to the second data line 171*b* on the second pixel PX2, and the first electrode 2173 of the switching transistor T2 may be connected to the first data line 171*a* on the third pixel PX3. However, without being limited thereto, the connection relationship of the first electrode 2173 of the switching transistor T2 and the data lines 171*a*, 171*b*, and 171*c* may be changed in various ways on the first to third pixels PX1, PX2, and PX3. For example, the first electrode 2173 of the switching transistor T2 may be connected to the first data line 171*a* on the first pixel PX1.

The first-side end of the second electrode 2175 of the switching transistor T2 may overlap the second region 2133 of the semiconductor layer 2130 of the switching transistor T2. The second insulating layer 160 may include an opening 1169 overlapping the second electrode 2175 of the switching transistor T2 and the second region 2133 of the semiconductor layer 2130. The opening 1169 may be further formed in the first insulating layer 120. The second electrode 2175 of the switching transistor T2 may be connected to the second region 2133 of the semiconductor layer 2130 of the switching transistor T2 through the opening 1169.

The second-side end of the second electrode 2175 of the switching transistor T2 may overlap the lower storage electrode 1153. The second insulating layer 160 may include an opening 1168 overlapping the second electrode 2175 of the switching transistor T2 and the lower storage electrode 1153. The second electrode 2175 of the switching transistor T2 may be connected to the lower storage electrode 1153 through the opening 1168. Therefore, the second region 2133 of the semiconductor layer 2130 of the switching transistor T2 may be connected to the gate electrode 1155 of the driving transistor T1 through the second electrode 2175 and the lower storage electrode 1153.

The first-side end of the second electrode 3175 of the initialization transistor T3 may overlap the second region 3133 of the semiconductor layer 3130 of the initialization transistor T3. The second insulating layer 160 may include an opening 1166 overlapping the second electrode 3175 of the initialization transistor T3 and the second region 3133 of the semiconductor layer 3130. The opening 1166 may be further formed in the first insulating layer 120. The second electrode 3175 of the initialization transistor T3 may be connected to the second region 3133 of the semiconductor layer 3130 of the initialization transistor T3 through the opening 1166.

The second-side end of the second electrode 3175 of the initialization transistor T3 may overlap the initialization voltage line 173. The second insulating layer 160 may include an opening 1167 overlapping the second electrode 3175 of the initialization transistor T3 and the initialization voltage line 173. The opening 1167 may be further formed in the first insulating layer 120 and the buffer layer 111. The second electrode 3175 of the initialization transistor T3 may be connected to the initialization voltage line 173 through the opening 1167. Therefore, the second region 3133 of the semiconductor layer 3130 of the initialization transistor T3 may be connected to the initialization voltage line 173 through the second electrode 3175. The second region 3133 of the semiconductor layer 3130 of the initialization transistor T3 may receive the initialization voltage INIT through the initialization voltage line 173.

The first-side end of the first electrode 4173 of the first auxiliary transistor T4 may overlap the first region 4131 of the semiconductor layer 4130 of the first auxiliary transistor T4. The second insulating layer 160 may include an opening 2163 overlapping the first electrode 4173 of the first auxiliary transistor T4 and the first region 4131 of the semiconductor layer 4130. The opening 2163 may be further formed in the first insulating layer 120. The first electrode 4173 of the first auxiliary transistor T4 may be electrically connected to the first region 4131 of the semiconductor layer 4130 of the first auxiliary transistor T4 through the opening 2163.

The second-side end of the first electrode 4173 of the first auxiliary transistor T4 may overlap the data lines 171*a*, 171*b*, and 171*c* and the initialization voltage line 173. The first electrode 4173 of the first auxiliary transistor T4 may not be electrically connected to the data lines 171*a*, 171*b*, and 171*c* and the initialization voltage line 173. However, depending on cases, the first electrode 4173 of the first auxiliary transistor T4 of one pixel PX may be electrically connected to one of the data lines 171*a*, 171*b*, and 171*c* and the initialization voltage line 173.

The second electrode 4175 of the first auxiliary transistor T4 may include a first portion 4175*a* and a second portion 4175*b*. The first portion 4175*a* and the second portion 4175*b* of the second electrode 4175 of the first auxiliary transistor T4 may be integral with each other. The first-side end of the first portion 4175*a* of the second electrode 4175 of the first auxiliary transistor T4 may be electrically connected to the first-side end of the second portion 4175*b* in the second region 4133 of the semiconductor layer 4130 of the first auxiliary transistor T4. For example, the second electrode 4175 of the first auxiliary transistor T4 may overlap the second region 4133 of the semiconductor layer 4130 of the first auxiliary transistor T4. The second insulating layer 160 may include an opening 2164 overlapping the second electrode 4175 of the first auxiliary transistor T4 and the second region 4133 of the semiconductor layer 4130. The opening 2164 may be further formed in the first insulating layer 120. The second electrode 4175 of the first auxiliary transistor T4 may be electrically connected to the second region 4133 of the semiconductor layer 4130 of the first auxiliary transistor T4 through the opening 2164. The second-side end of the first portion 4175*a* of the second electrode 4175 of the first auxiliary transistor T4 may overlap the lower storage electrode 1153. The second-side end of the second portion 4175*b* of the second electrode 4175 of the first auxiliary transistor T4 may overlap the light blocking pattern 177. The second electrode 4175 of the first auxiliary transistor T4 may not be electrically connected to the lower storage electrode 1153 and the light blocking pattern 177. However, depending on cases, the second electrode 4175 of the first auxiliary transistor T4 of one pixel PX may be electrically connected to the lower storage electrode 1153 and the light blocking pattern 177.

A third insulating layer 180 may be positioned on a third conductive layer including the first electrode 1173 of the driving transistor T1, the upper storage electrode 1154, the first electrode 2173 and second electrode 2175 of the switching transistor T2, the second electrode 3175 of the initialization transistor T3, and the first electrode 4173 and the second electrode 4175 of the first auxiliary transistor T4.

At least one of the first conductive layer, the second conductive layer, and the third conductive layer may include at least one metal from among copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof. The first conductive layer, the second conductive layer, and the third conductive layer may be respectively made of a single layer or a multilayer. For example, at least one of the first conductive layer, the second conductive layer, and the third conductive layer may have a multilayer structure including a lower layer including titanium and an upper layer including copper.

At least one of the buffer layer 111, the first insulating layer 120, the second insulating layer 160, and the third insulating layer 180 may include an inorganic insulating material such as a silicon nitride ($SiN_x$), a silicon oxide ($SiO_x$), or a silicon oxynitride ($SiO_xN_y$), and/or an organic insulating material such as a polyimide, an acryl-based polymer, or a siloxane-based polymer.

Although not shown, a pixel electrode may be positioned on the third insulating layer 180. The pixel electrode may be connected to the driving transistor T1, and may receive an output current of the driving transistor T1. A fourth insulating layer may be positioned on the pixel electrode. An opening may be formed in the fourth insulating layer, and the opening of the fourth insulating layer may overlap the pixel electrode. An emission layer may be positioned on the pixel electrode and the fourth insulating layer, and a common electrode may be positioned on the emission layer. The pixel electrode, the emission layer, and the common electrode may form a light emitting diode ED.

A method for repairing a display device according to an embodiment will now be described with reference to FIG. 9 to FIG. 14.

Figure 9:
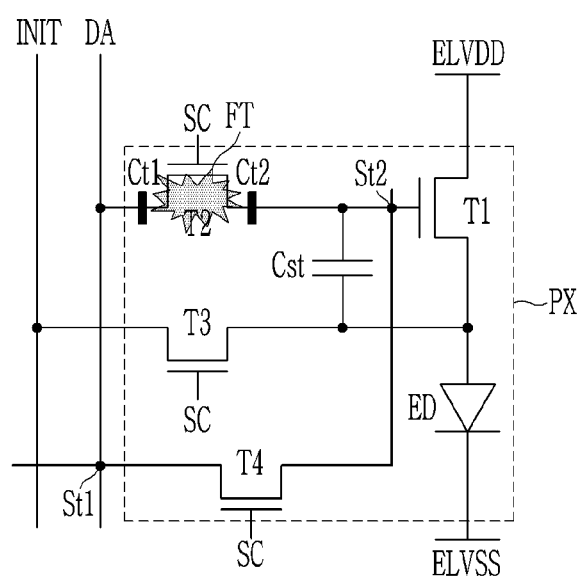
FIG. 9 and FIG. 10 show a repairing method in case that a defect is generated to a switching transistor of a display device according to an embodiment.
Figure 10:
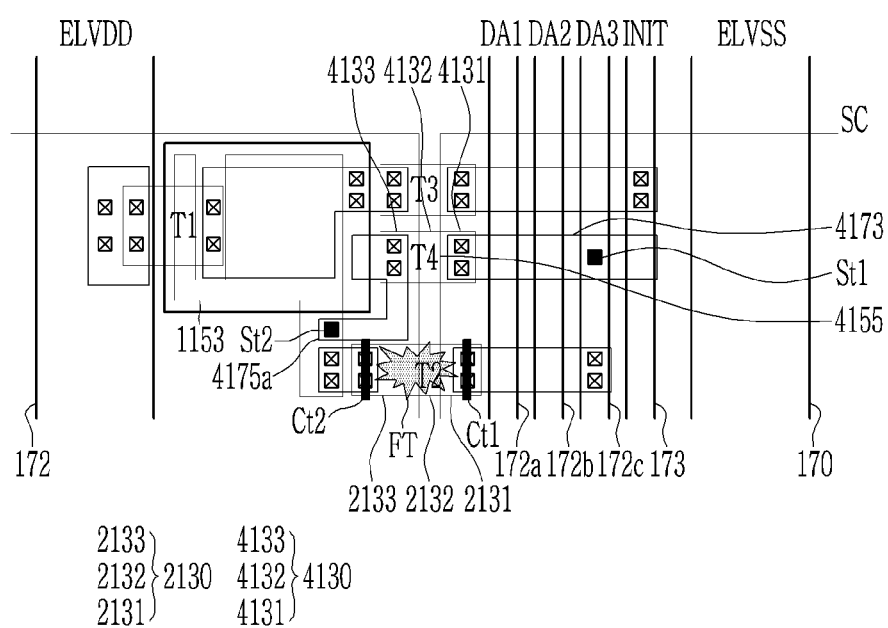
Figure 11:
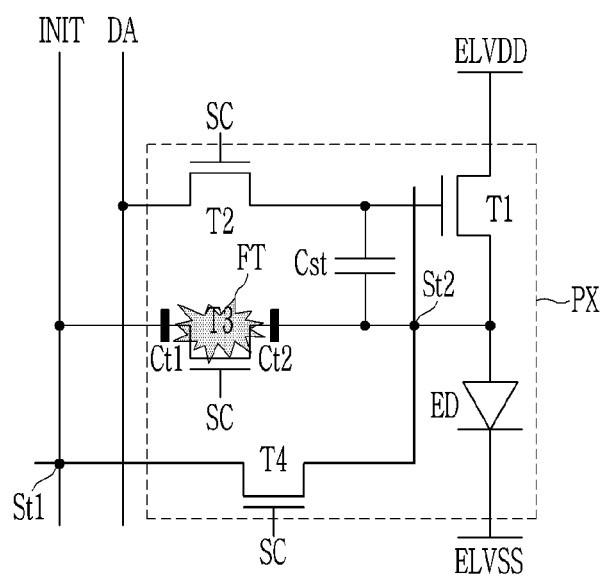
FIG. 11 and FIG. 12 show a repairing method in case that a defect is generated to an initialization transistor of a display device according to an embodiment.
Figure 12:
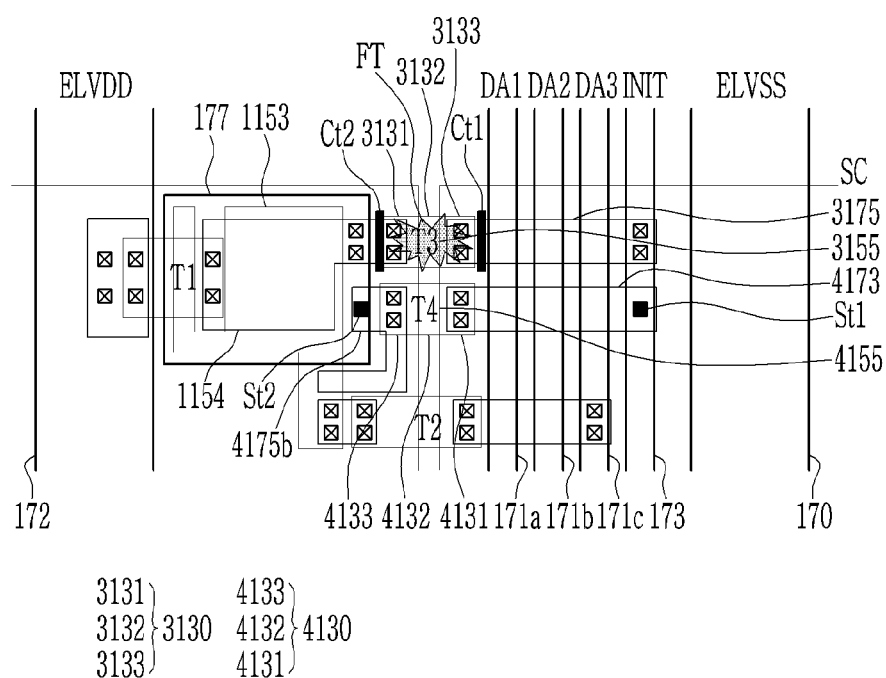
Figure 13:
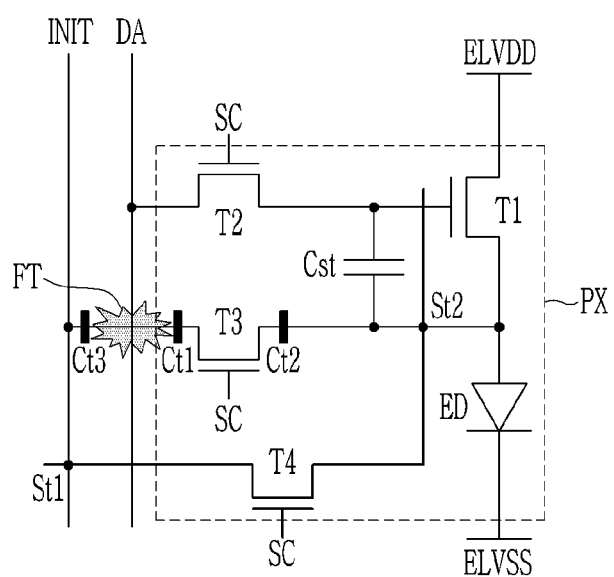
FIG. 13 and FIG. 14 show a repairing method in case that an initialization transistor of a display device according to an embodiment is short-circuited from a data line.
Figure 14:
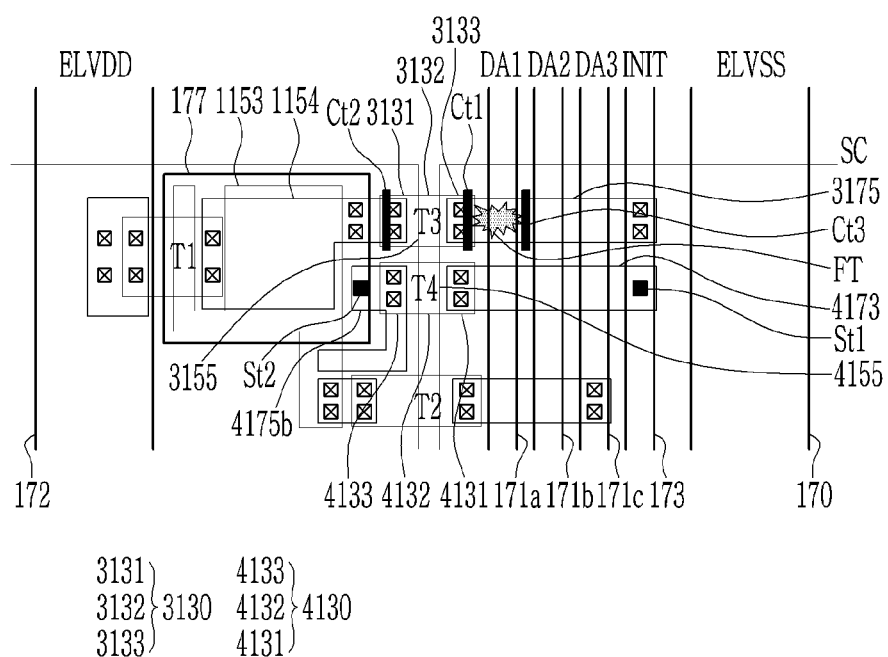

FIG. 9 and FIG. 10 show a repairing method in case that a defect is generated to a switching transistor of a display device according to an embodiment, FIG. 11 and FIG. 12 show a repairing method in case that a defect is generated to an initialization transistor of a display device according to an embodiment, and FIG. 13 and FIG. 14 show a repairing method in case that an initialization transistor of a display device according to an embodiment is short-circuited from a data line.

As shown in FIG. 9 and FIG. 10, a defect FT may be generated to the switching transistor T2 of the display device according to an embodiment. For example, a region of the semiconductor layer 2130 of the switching transistor T2 may be disconnected, or the semiconductor layer 2130 of the switching transistor T2 and the gate electrode 2155 may be short-circuited. In this instance, the switching transistor T2 may not be normally operated.

The switching transistor T2 to which the defect FT is generated may be separated from the corresponding pixel PX between the switching transistor T2 and the data lines 171*a*, 171*b*, and 171*c* at disconnecting region Ct1, and between the switching transistor T2 and the gate electrode of the driving transistor T1 at disconnecting region Ct2. For example, a region of the first electrode 2173 of the switching transistor T2 may be disconnected at disconnecting region Ct1 by irradiating laser beams to the first electrode 2173 of the switching transistor T2. In this instance, laser beams may be irradiated to a portion of the first electrode 2173 positioned near or disposed in a region adjacent the first region 2131 of the semiconductor layer 2130 of the switching transistor T2. By this, the connection between the first region 2131 of the semiconductor layer 2130 of the switching transistor T2 and the data lines 171a, 171b, and 171c may be removed. Further, a region of the second electrode 2175 of the switching transistor T2 may be disconnected at disconnecting region Ct2 by irradiating laser beams to the second electrode 2175 of the switching transistor T2. In this instance, laser beams may be irradiated to a portion of the second electrode 2175 positioned near or disposed in a region adjacent the second region 2133 of the semiconductor layer 2130 of the switching transistor T2. Hence, the connection between the second region 2133 of the semiconductor layer 2130 of the switching transistor T2 and the lower storage electrode 1153 may be removed. The connection between the second region 2133 of the semiconductor layer 2130 of the switching transistor T2 and the gate electrode 1155 of the driving transistor T1 may be removed. For example, the switching transistor T2 may be separated from the corresponding pixel PX by disconnecting regions Ct1 and Ct2 of the switching transistor T2.

The first auxiliary transistor T4 may substitute for the switching transistor T2, and may function as the same by connecting the first auxiliary transistor T4 to the corresponding pixel PX. The first auxiliary transistor T4 and one of the data lines 171a, 171b, and 171c may be short-circuited St1, and the first auxiliary transistor T4 and the gate electrode of the driving transistor T1 may be short-circuited St2. For example, the first electrode 4173 of the first auxiliary transistor T4 and one of the data lines 171a, 171b, and 171c may be short-circuited St1 by irradiating laser beams to the overlapping portion of the first electrode 4173 of the first auxiliary transistor T4 and the data lines 171a, 171b, and 171c. Accordingly, the first electrode 4173 of the first auxiliary transistor T4 may be connected to one of the data lines 171a, 171b, and 171c. The data lines 171a, 171b, and 171c connected to the switching transistor T2 of the corresponding pixel PX may be connected to the first electrode 4173 of the first auxiliary transistor T4. For example, in case that the switching transistor T2 is connected to the third data line 171c on the corresponding pixel PX, the connection is removed, and the third data line 171c may be connected to the first electrode 4173 of the first auxiliary transistor T4. The first portion 4175a of the second electrode 4175 of the first auxiliary transistor T4 and the lower storage electrode 1153 may be short-circuited St2 by irradiating laser beams to the overlapping portion of the first portion 4175a of the second electrode 4175 of the first auxiliary transistor T4 and the lower storage electrode 1153. The second electrode 4175 of the first auxiliary transistor T4 may be accordingly connected to the lower storage electrode 1153. The second region 4133 of the semiconductor layer 4130 of the first auxiliary transistor T4 may be connected to the gate electrode 1155 of the driving transistor T1 through the second electrode 4175 and the lower storage electrode 1153. For example, the first auxiliary transistor T4 may be connected to the corresponding pixel PX by short-circuiting St1 and St2 the first auxiliary transistor T4 and another wire or electrode.

Regarding the display device according to an embodiment, each pixel PX may include a first auxiliary transistor T4, so in case that a defect FT is generated to the switching transistor T2, the first auxiliary transistor T4 may substitute for the switching transistor T2 according to a repair process including a laser cutting process and a laser shorting process.

As shown in FIG. 11 and FIG. 12, a defect FT may be generated to the initialization transistor T3 of the display device according to an embodiment. For example, a region of the semiconductor layer 3130 of the initialization transistor T3 may be disconnected, or the semiconductor layer 3130 of the initialization transistor T3 and the gate electrode 3155 may be short-circuited. In this instance, the initialization transistor T3 may not be properly operated.

The initialization transistor T3 to which the defect FT is generated may be separated from the corresponding pixel PX between the initialization transistor T3 and the initialization voltage line 173 at disconnecting region Ct1, and between the initialization transistor T3 and the second electrode of the driving transistor T1 at disconnecting region Ct2. For example, a region of the second electrode 3175 of the initialization transistor T3 may be disconnected at disconnecting region Ct1 by irradiating laser beams to the second electrode 3175 of the initialization transistor T3. In this instance, laser beams may be irradiated to a portion of the second electrode 3175 positioned near or disposed in a region adjacent the second region 3133 of the semiconductor layer 3130 of the initialization transistor T3. The connection between the second region 3133 of the semiconductor layer 3130 of the initialization transistor T3 and the initialization voltage line 173 may thus be removed. A region of the upper storage electrode 1154 may be disconnected at disconnecting region Ct2 by irradiating laser beams to the upper storage electrode 1154. In this instance, laser beams may be irradiated to a portion of the upper storage electrode 1154 positioned near or disposed in a region adjacent the first region 3131 of the semiconductor layer 3130 of the initialization transistor T3. The connection between the upper storage electrode 1154 and the first region 3131 of the semiconductor layer 3130 of the initialization transistor T3 may be removed. The connection between the first region 3131 of the semiconductor layer 3130 of the initialization transistor T3 and the second region 1133 of the semiconductor layer 1130 of the driving transistor T1 may be removed. For example, the initialization transistor T3 may be separated from the corresponding pixel PX by disconnecting at disconnecting region Ct1 of the initialization transistor T3 and disconnecting at disconnecting region Ct2 of the upper storage electrode 1154.

By connecting the first auxiliary transistor T4 and the corresponding pixel PX, the first auxiliary transistor T4 may substitute for the initialization transistor T3 and may function as the same. The first auxiliary transistor T4 and the initialization voltage line 173 may be short-circuited St1, and the first auxiliary transistor T4 and the second electrode of the driving transistor T1 may be short-circuited St2. For example, the first electrode 4173 of the first auxiliary transistor T4 and the initialization voltage line 173 may be short-circuited St1 by irradiating laser beams to the overlapping portion of the first electrode 4173 of the first auxiliary transistor T4 and the initialization voltage line 173. The first electrode 4173 of the first auxiliary transistor T4 may be resultantly connected to the initialization voltage line 173. Further, the second portion 4175b of the second electrode 4175 of the first auxiliary transistor T4 and the light blocking pattern 177 may be short-circuited St2 by irradiating laser beans to the overlapping portion of the second portion 4175b of the second electrode 4175 of the first auxiliary transistor T4 and the light blocking pattern 177. The second electrode 4175 of the first auxiliary transistor T4 may be accordingly connected to the light blocking pattern 177. The second region 4133 of the semiconductor layer 4130 of the first auxiliary transistor T4 may be connected to the second region 1133 of the semiconductor layer 1130 of the driving transistor T1 through the second electrode 4175, the light blocking pattern 177, and the upper storage electrode 1154. For example, the first auxiliary transistor T4 may be connected to the corresponding pixel PX by short-circuiting St1 and St2 the first auxiliary transistor T4 and another wire or electrode.

Regarding the display device according to an embodiment, each pixel PX may include a first auxiliary transistor T4, so in case that a defect FT is generated to the initialization transistor T3, the first auxiliary transistor T4 may substitute for the initialization transistor T3 according to the repair process including a laser cutting process and a laser shorting process.

As shown in FIG. 13 and FIG. 14, a defect FT may be generated to the initialization transistor T3 of the display device according to an embodiment. For example, the second electrode 3175 of the initialization transistor T3 and the data lines 171*a*, 171*b*, and 171*c* may be short-circuited. In this instance, the second electrode 3175 of the initialization transistor T3 and the first data line 171*a* may be short-circuited. By this, the initialization transistor T3 may not be normally operated, and the first data line 171*a* may be connected to the initialization voltage line 173 by the second electrode 3175 of the initialization transistor T3.

The initialization transistor T3 to which the defect FT is generated may be separated from the corresponding pixel PX. For example, in a like manner of the example described with reference to FIG. 11 and FIG. 12, a region of the second electrode 3175 of the initialization transistor T3 may be disconnected at disconnecting region Ct1 by irradiating laser beams to a portion of the second electrode 3175 positioned near or disposed in a region adjacent the second region 3133 of the semiconductor layer 3130 of the initialization transistor T3. A region of the upper storage electrode 1154 may be disconnected at disconnecting region Ct2 by irradiating laser beams to a portion of the upper storage electrode 1154 positioned near or disposed in a region adjacent the first region 3131 of the semiconductor layer 3130 of the initialization transistor T3. By this, the initialization transistor T3 may be separated from the corresponding pixel PX.

A region of the second electrode 3175 of the initialization transistor T3 may be disconnected Ct3 by irradiating laser beams to the second electrode 3175 of the initialization transistor T3 positioned between the data lines 171*a*, 171*b*, and 171*c* and the initialization voltage line 173. Laser beams may be irradiated to a portion of the second electrode 3175 of the initialization transistor T3 positioned between the first data line 171*a* and the second data line 171*b*. The connection between the initialization voltage line 173 and the first data line 171*a* may be removed. For example, the portion to which the defect FT is generated may be separated so that it may not be connected to another wire by the short circuit between the second electrode 3175 of the initialization transistor T3 and the first data line 171*a*.

By connecting the first auxiliary transistor T4 to the corresponding pixel PX, the first auxiliary transistor T4 may substitute for the initialization transistor T3 and may function as the same. For example, in a like manner of the example described with reference to FIG. 11 and FIG. 12, the first electrode 4173 of the first auxiliary transistor T4 and the initialization voltage line 173 may be short-circuited St1 by irradiating laser beams to the overlapping portion of the first electrode 4173 of the first auxiliary transistor T4 and the initialization voltage line 173. The second portion 4175*b* of the second electrode 4175 of the first auxiliary transistor T4 and the light blocking pattern 177 may be short-circuited St2 by irradiating laser beams to the overlapping portion of the second portion 4175*b* of the second electrode 4175 of the first auxiliary transistor T4 and the light blocking pattern 177. By this, the first auxiliary transistor T4 may be connected to the corresponding pixel PX.

A display device according to an embodiment will now be described with reference to FIG. 15 and FIG. 16.

The display device according to an embodiment described with reference to FIG. 15 and FIG. 16 mostly corresponds to the display device according to an embodiment described with reference to FIG. 1 to FIG. 8, so no same portion will be described. The embodiment is different from the previous embodiment in that it further may include a second auxiliary transistor, which will now be described.

Figure 15:
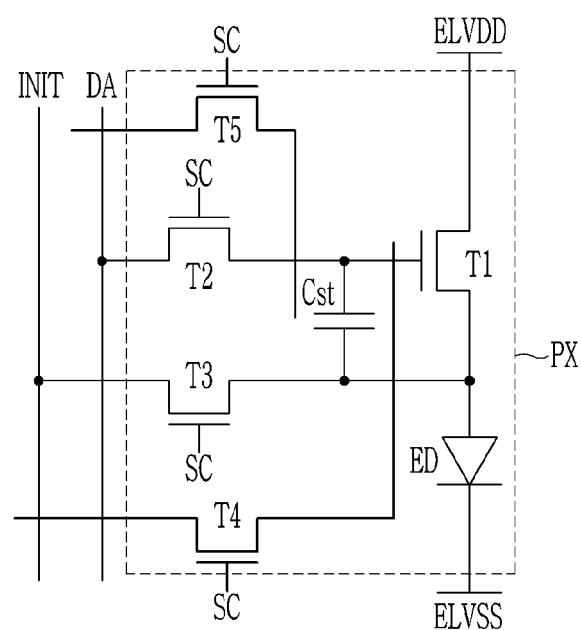
FIG. 15 shows a schematic diagram of an equivalent circuit of a pixel of a display device according to an embodiment.
Figure 16:
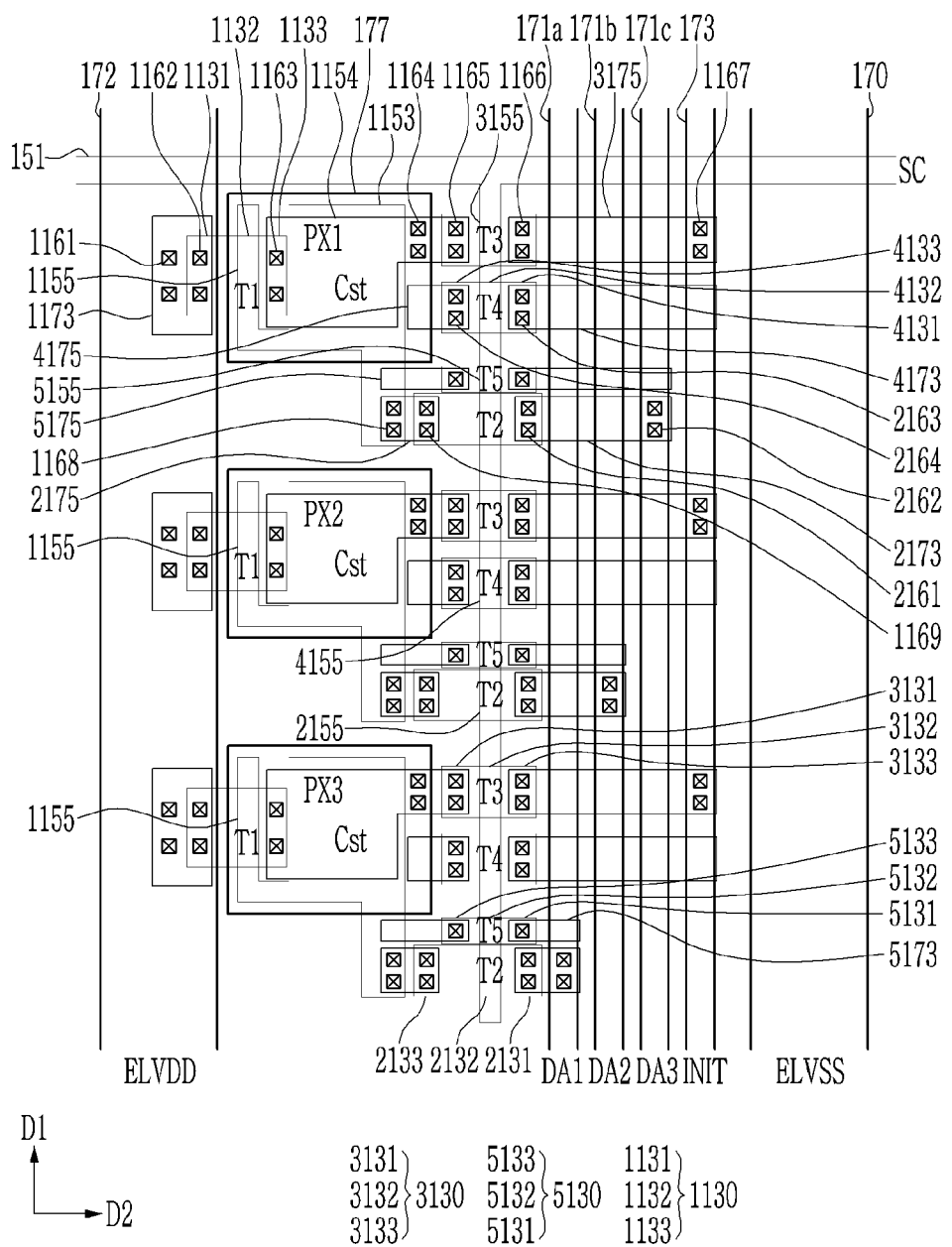
FIG. 16 shows a schematic top plan view of part of a display device according to an embodiment.

FIG. 15 shows a schematic diagram of an equivalent circuit of a pixel of a display device according to an embodiment, and FIG. 16 shows a schematic top plan view of part of a display device according to an embodiment.

The display device according to an embodiment may include pixels PX. The pixels PX may respectively include transistors (T1, T2, T3, T4, and T5), a capacitor Cst, and at least one light emitting diode ED that is a light-emitting device as shown in FIG. 15 and FIG. 16.

The transistors (T1, T2, T3, T4, and T5) include a driving transistor T1, a switching transistor T2, an initialization transistor T3, and a first auxiliary transistor T4 in a like manner of the previous embodiment, and they additionally include a second auxiliary transistor T5 in the embodiment.

A gate electrode of the first auxiliary transistor T4 may be connected to a first scan line for transmitting a first scan signal SC. An electrode of the first auxiliary transistor T4 may not be connected to other wires, but it may float. However, depending on cases, it may be connected to other wires. A first electrode of the first auxiliary transistor T4 may be connected to an initialization voltage line. A second electrode of the first auxiliary transistor T4 may be connected to a second electrode of the driving transistor T1.

The respective pixels PX include a first auxiliary transistor T4, and in most pixels PX, the first auxiliary transistor T4 is not connected and may not be operable. However, on a pixel PX, the first auxiliary transistor T4 may be connected to another wire and may be operated. For example on a pixel PX, in case that a defect is generated to the initialization transistor T3, the initialization transistor T3 is separated from other wires, and the first auxiliary transistor T4 may be connected as a substitute. The first auxiliary transistor T4 functions as the initialization transistor T3. For example, the first auxiliary transistor T4 may be connected between the initialization voltage line and the second electrode of the driving transistor T1 and may substitute for the initialization transistor T3.

A gate electrode of the second auxiliary transistor T5 may be connected to the first scan line for transmitting the first scan signal SC. An electrode of the second auxiliary transistor T5 may not be connected to other wires, but it may float. However, depending on cases, it may be connected to other wires. A first electrode of the second auxiliary transistor T5 may be connected to a data line. A second electrode of the second auxiliary transistor T5 may be connected to a gate electrode of the driving transistor T1.

The respective pixels PX include a second auxiliary transistor T5, and in the most pixels PX, the second auxiliary transistor T5 is not connected and may not be operable. However, on a pixel PX, the second auxiliary transistor T5 may be connected to another wire and may be operated. For example on a pixel PX, in case that a defect is generated to the switching transistor T2, the switching transistor T2 is separated from other wires, and the second auxiliary transistor T5 may be connected as a substitute. The second auxiliary transistor T5 functions as the switching transistor T2. For example, the second auxiliary transistor T5 may be connected between the data line and the gate electrode of the driving transistor T1 and may substitute for the switching transistor T2.

The display device according to an embodiment may include a substrate 110, and a first conductive layer, a semiconductor layer, a second conductive layer, and a third conductive layer positioned on the substrate 110.

In a like manner of the previous embodiment, the semiconductor layer may include a semiconductor layer 1130 of the driving transistor T1, a semiconductor layer 2130 of the switching transistor T2, a semiconductor layer 3130 of the initialization transistor T3, and a semiconductor layer of the first auxiliary transistor T4, and may further include a semiconductor layer 5130 of the second auxiliary transistor T5 in the embodiment.

The semiconductor layer 4130 of the first auxiliary transistor T4 may include a first region 4131, a channel 4132, and a second region 4133. The semiconductor layer 5130 of the second auxiliary transistor T5 may include a first region 5131, a channel 5132, and a second region 5133.

The semiconductor layer 4130 of the first auxiliary transistor T4 may be positioned near or disposed in a region adjacent the semiconductor layer 3130 of the initialization transistor T3. For example, the semiconductor layer 4130 of the first auxiliary transistor T4 may be positioned at a bottom of the semiconductor layer 3130 of the initialization transistor T3 in a plan view.

The semiconductor layer 5130 of the second auxiliary transistor T5 may be positioned near or disposed in a region adjacent the semiconductor layer 2130 of the switching transistor T2. For example, the semiconductor layer 5130 of the second auxiliary transistor T5 may be positioned on an upper side of the semiconductor layer 2130 of the switching transistor T2 in a plan view. For example, the semiconductor layer 3130 of the initialization transistor T3, the semiconductor layer 4130 of the first auxiliary transistor T4, the semiconductor layer 5130 of the second auxiliary transistor T5, and the semiconductor layer 2130 of the switching transistor T2 may be sequentially positioned in the first direction D1. However, disposal forms of the semiconductor layer in a plan view are not limited thereto and may be variable in many ways. For example, the semiconductor layer 4130 of the first auxiliary transistor T4, the semiconductor layer 3130 of the initialization transistor T3, the semiconductor layer 2130 of the switching transistor T2, and the semiconductor layer 5130 of the second auxiliary transistor T5 may be sequentially positioned in the first direction D1.

The semiconductor layer 4130 of the first auxiliary transistor T4 and the semiconductor layer 5130 of the second auxiliary transistor T5 may not be electrically connected to other wires. However, depending on cases, the semiconductor layer 4130 of the first auxiliary transistor T4 may be connected to another wire. For example, the first region 4131 of the semiconductor layer 4130 of the first auxiliary transistor T4 may be connected to the initialization voltage line 173. The second region 4133 of the semiconductor layer 4130 of the first auxiliary transistor T4 may be connected to the second region 1133 of the semiconductor layer 1130 of the driving transistor T1. The first region 5131 of the semiconductor layer 5130 of the second auxiliary transistor T5 may be connected to one of the data lines 171a, 171b, and 171c. The second region 5133 of the semiconductor layer 5130 of the second auxiliary transistor T5 may be connected to the gate electrode 1155 of the driving transistor T1.

In a like manner of the previous embodiment, the second conductive layer may include the gate electrode 1155 of the driving transistor T1, the lower storage electrode 1153, the gate electrode 2155 of the switching transistor T2, the gate electrode 3155 of the initialization transistor T3, and the gate electrode 4155 of the first auxiliary transistor T4, and may further include a gate electrode 5155 of the second auxiliary transistor T5 in the embodiment.

The gate electrode 5155 of the second auxiliary transistor T5 may overlap the channel 5132 of the second auxiliary transistor T5. The gate electrodes 5155 of the second auxiliary transistors T5 of the first to third pixels PX1, PX2, and PX3 may be connected to each other, and may be integral with each other. The gate electrode 5155 of the second auxiliary transistor T5 may be connected to the gate electrode 2155 of the switching transistor T2, the gate electrode 3155 of the initialization transistor T3, and the gate electrode 4155 of the first auxiliary transistor T4, and may be integral with each other.

A doping process or a plasma processing may be performed after the second conductive layer is formed. The channel 5132 of the second auxiliary transistor T5 may not be doped or plasma processed. The first region 5131 and the second region 5133 of the second auxiliary transistor T5 may be doped or plasma processed to have the same characteristic as a conductor.

In a like manner of the previous embodiment, the third conductive layer may include a first electrode 1173 of the driving transistor T1, the upper storage electrode 1154, a first electrode 2173 and a second electrode 2175 of the switching transistor T2, a second electrode 3175 of the initialization transistor T3, and a first electrode 4173 and a second electrode 4175 of the first auxiliary transistor T4, and may further include a first electrode 5173 and a second electrode 5175 of the second auxiliary transistor T5 in the embodiment.

The first-side end of the first electrode 4173 of the first auxiliary transistor T4 may be connected to the first region 4131 of the semiconductor layer 4130 of the first auxiliary transistor T4. The second-side end of the first electrode 4173 of the first auxiliary transistor T4 may overlap the initialization voltage line 173.

The first-side end of the second electrode 4175 of the first auxiliary transistor T4 may be connected to the second region 4133 of the semiconductor layer 4130 of the first auxiliary transistor T4. The second-side end of the second electrode 4175 of the first auxiliary transistor T4 may overlap the light blocking pattern 177.

The first-side end of the first electrode 5173 of the second auxiliary transistor T5 may be connected to the first region 5131 of the semiconductor layer 5130 of the second auxiliary transistor T5. The second-side end of the first electrode 5173 of the second auxiliary transistor T5 may overlap the data lines 171a, 171b, and 171c.

The first-side end of the second electrode 5175 of the second auxiliary transistor T5 may be connected to the second region 5133 of the semiconductor layer 5130 of the second auxiliary transistor T5. The second-side end of the second electrode 5175 of the second auxiliary transistor T5 may overlap the lower storage electrode 1153.

A method for repairing a display device according to an embodiment will now be described with reference to FIG. 17 and FIG. 18.

Figure 17:
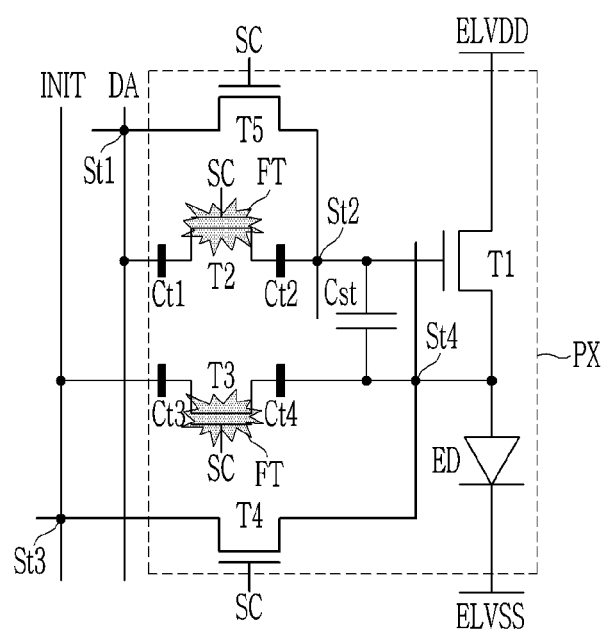
FIG. 17 and FIG. 18 show a repairing method in case that defects are generated to a switching transistor and an initialization transistor of a display device according to an embodiment.
Figure 18:
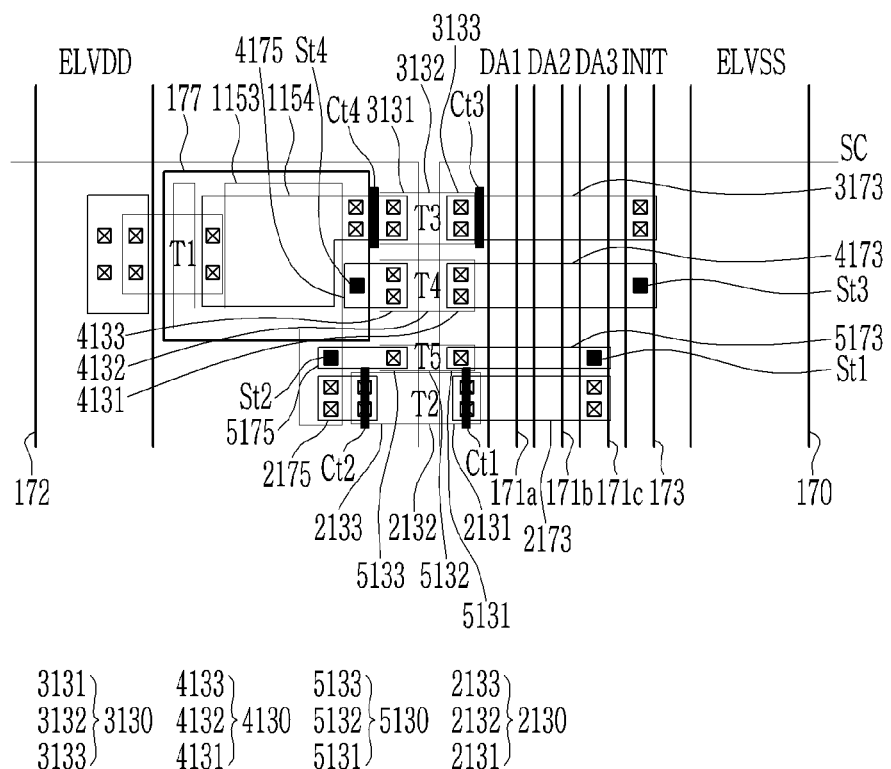

FIG. 17 and FIG. 18 show a repairing method in case that defects are generated to a switching transistor and an initialization transistor of a display device according to an embodiment.

As shown in FIG. 17 and FIG. 18, defects FT may be generated to the switching transistor T2 and the initialization transistor T3 of the display device according to an embodiment. For example, a region of the semiconductor layer 2130 of the switching transistor T2 may be disconnected, or the semiconductor layer 2130 of the switching transistor T2 and the gate electrode 2155 may be short-circuited. A region of the semiconductor layer 3130 of the initialization transistor T3 may be disconnected, or the semiconductor layer 3130 of the initialization transistor T3 and the gate electrode 3155 may be short-circuited. In this instance, the switching transistor T2 and the initialization transistor T3 may not be normally operated.

The switching transistor T2 and the initialization transistor T3 to which defects FT are generated may be separated from the corresponding pixel PX. For example, a region of the first electrode 2173 of the switching transistor T2 may be disconnected at disconnecting region Ct1 by irradiating laser beams to a portion of the first electrode 2173 positioned near or disposed in a region adjacent the first region 2131 of the semiconductor layer 2130 of the switching transistor T2. A region of the second electrode 2175 of the switching transistor T2 may be disconnected at disconnecting region Ct2 by irradiating laser beams to a portion of the second electrode 2175 positioned near or disposed in a region adjacent the second region 2133 of the semiconductor layer 2130 of the switching transistor T2. A region of the second electrode 3175 of the initialization transistor T3 may be disconnected at disconnecting region Ct3 by irradiating laser beams to a portion of the second electrode 3175 positioned near or disposed in a region adjacent the second region 3133 of the semiconductor layer 3130 of the initialization transistor T3. A region of the upper storage electrode 1154 may be disconnected at disconnecting region Ct4 by irradiating laser beams to a portion of the upper storage electrode 1154 positioned near or disposed in a region adjacent the first region 3131 of the semiconductor layer 3130 of the initialization transistor T3. The switching transistor T2 and the initialization transistor T3 may be separated from the corresponding pixel PX.

By connecting the first auxiliary transistor T4 to the corresponding pixel PX, the first auxiliary transistor T4 may substitute for the initialization transistor T3 and may function as the same. For example, the first electrode 4173 of the first auxiliary transistor T4 and the initialization voltage line 173 may be short-circuited St3 by irradiating laser beams to the overlapping portion of the first electrode 4173 of the first auxiliary transistor T4 and the initialization voltage line 173. The second portion 4175b of the second electrode 4175 of the first auxiliary transistor T4 and the light blocking pattern 177 may be short-circuited St4 by irradiating laser beams to the overlapping portion of the second portion 4175b of the second electrode 4175 of the first auxiliary transistor T4 and the light blocking pattern 177. By this, the first auxiliary transistor T4 may be connected to the corresponding pixel PX.

By connecting the second auxiliary transistor T5 to the corresponding pixel PX, the second auxiliary transistor T5 may substitute for the switching transistor T2 and may function as the same. For example, the first electrode 5173 of the second auxiliary transistor T5 and one of the data lines 171a, 171b, and 171c may be short-circuited St1 by irradiating laser beams to the overlapping portion of the first electrode 5173 of the second auxiliary transistor T5 and the data lines 171a, 171b, and 171c. The second electrode 5175 of the second auxiliary transistor T5 and the lower storage electrode 1153 may be short-circuited St2 by irradiating laser beams to the overlapping portion of the second electrode 5175 of the second auxiliary transistor T5 and the lower storage electrode 1153. By this, the second auxiliary transistor T5 may be connected to the corresponding pixel PX.

Regarding the display device according to an embodiment, each pixel PX may include a first auxiliary transistor T4 and a second auxiliary transistor T5, so in case that defects FT are generated to the switching transistor T2 and the initialization transistor T3, the first auxiliary transistor T4 may substitute for the initialization transistor T3, and the second auxiliary transistor T5 may substitute for the switching transistor T2 according to the repair process including a laser cutting process and a laser shorting process.

In case that a defect FT is generated to one of the switching transistor T2 and the initialization transistor T3, the initialization transistor T3 or the switching transistor T2 may be substituted by selectively connecting one of the first auxiliary transistor T4 and the second auxiliary transistor T5 according to the repair process including a laser cutting process and a laser shorting process.

A display device according to an embodiment will now be described with reference to FIG. 19.

The display device according to an embodiment described with reference to FIG. 19 mostly corresponds to the display device according to an embodiment described with reference to FIG. 15 to FIG. 16, so no same portion will be described. The embodiment is different from the previous embodiment in that the switching transistor and the initialization transistor are connected to different scan lines, which will now be described.

Figure 19:
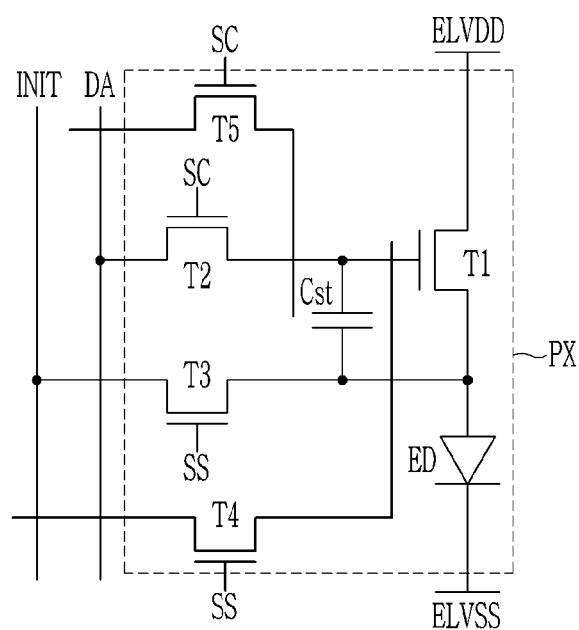
FIG. 19 shows a schematic diagram of an equivalent circuit of a pixel of a display device according to an embodiment.

FIG. 19 shows a schematic diagram of an equivalent circuit of a pixel of a display device according to an embodiment.

The display device according to an embodiment may include pixels PX. As shown in FIG. 19, pixels PX may respectively include transistors (T1, T2, T3, T4, and T5), a capacitor Cst, and at least one light emitting diode ED that is a light-emitting device.

In a like manner of the previous embodiment, the transistors (T1, T2, T3, T4, and T5) include a driving transistor T1, a switching transistor T2, an initialization transistor T3, a first auxiliary transistor T4, and a second auxiliary transistor T5.

The switching transistor T2 and the initialization transistor T3 may be connected to the same first scan line in the previous embodiment, and the switching transistor T2 and the initialization transistor T3 may be connected to different scan lines in the embodiment. A gate electrode of the switching transistor T2 may be connected to a first scan line for transmitting a first scan signal SC. A gate electrode of the initialization transistor T3 may be connected to a second scan line for transmitting a second scan signal SS.

A gate electrode of the first auxiliary transistor T4 may be connected to a second scan line for transmitting the second scan signal SS. An electrode of the first auxiliary transistor T4 may not be connected to other wires but may float. However, depending on cases, it may be connected to other wires. A first electrode of the first auxiliary transistor T4 may be connected to the initialization voltage line. A second electrode of the first auxiliary transistor T4 may be connected to the second electrode of the driving transistor T1.

Each pixel PX may include a first auxiliary transistor T4, and in most of the pixels PX, the first auxiliary transistor T4 is not connected, and may not be operable. However, on some pixels PX, the first auxiliary transistor T4 may be connected to another wire and may be operable. For example on the some pixels PX, in the case of the pixel in which a defect is generated to the initialization transistor T3, the initialization transistor T3 is separated from the wires, and the first auxiliary transistor T4 may be connected thereto in substitution for the separated one. The first auxiliary transistor T4 functions as the initialization transistor T3. For example, the first auxiliary transistor T4 may be connected between the initialization voltage line and the second electrode of the driving transistor T1 and may substitute for the initialization transistor T3.

A gate electrode of the second auxiliary transistor T5 may be connected to the first scan line for transmitting the first scan signal SC. An electrode of the second auxiliary transistor T5 is not connected to other wires, but may float. They may be connected to the other wires, depending on cases. The first electrode of the second auxiliary transistor T5 may be connected to the data line. The second electrode of the second auxiliary transistor T5 may be connected to the gate electrode of the driving transistor T1.

The respective pixels PX include the second auxiliary transistor T5, and in most of the pixels PX, the second auxiliary transistor T5 may not be connected and may not be operable. However, on some pixels PX, the second auxiliary transistor T5 may be connected to another wire and may be operable. For example on a pixel PX, in case that a defect is generated to the switching transistor T2, the switching transistor T2 is separated from other wires, and the second auxiliary transistor T5 may be connected as a substitute. The second auxiliary transistor T5 functions as the switching transistor T2. For example, the second auxiliary transistor T5 may be connected between the data line and the gate electrode of the driving transistor T1 and may function as the switching transistor T2.

A method for repairing a display device according to an embodiment will now be described with reference to FIG. 20.

Figure 20:
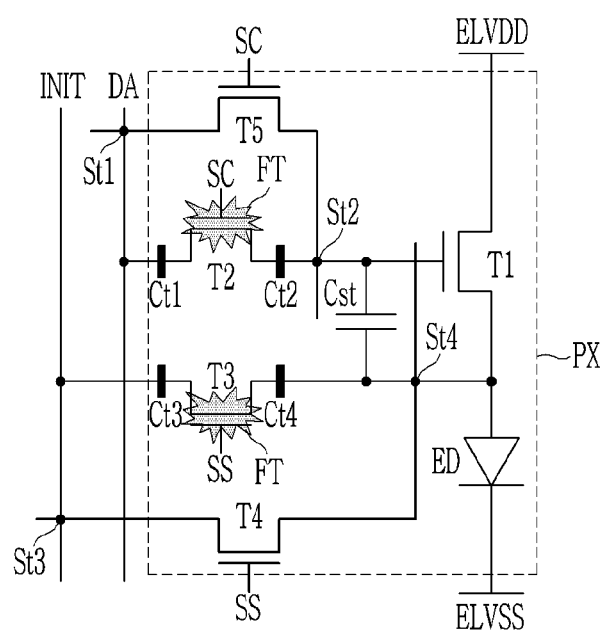
FIG. 20 shows a repairing method in case that defects are generated to a switching transistor and an initialization transistor of a display device according to an embodiment.

FIG. 20 shows a repairing method in case that defects are generated to a switching transistor and an initialization transistor of a display device according to an embodiment.

As shown in FIG. 20, defects FT may be generated to the switching transistor T2 and the initialization transistor T3 of the display device according to an embodiment.

The switching transistor T2 and the initialization transistor T3 to which defects FT are generated may be separated from the corresponding pixel PX. For example, a region of the first electrode of the switching transistor T2 may be disconnected at disconnecting region Ct1 by irradiating laser beams to the first electrode of the switching transistor T2. A region of the second electrode of the switching transistor T2 may be disconnected at disconnecting region Ct2 by irradiating laser beams to the second electrode of the switching transistor T2. A region of the second electrode of the initialization transistor T3 may be disconnected at disconnecting region Ct3 by irradiating laser beams to the second electrode of the initialization transistor T3. A region of the first electrode of the initialization transistor T3 may be disconnected at disconnecting region Ct4 by irradiating laser beams to the first electrode of the initialization transistor T3. By this, the switching transistor T2 and the initialization transistor T3 may be separated from the corresponding pixel PX.

By connecting the first auxiliary transistor T4 to the corresponding pixel PX, the first auxiliary transistor T4 may substitute for the initialization transistor T3 and may function as the same. For example, the first electrode of the first auxiliary transistor T4 and the initialization voltage line may be short-circuited St3 by irradiating laser beams. The second electrode of the first auxiliary transistor T4 and the second electrode of the driving transistor T1 may be short-circuited St4 by irradiating laser beams. Hence, the first auxiliary transistor T4 may be connected to the corresponding pixel PX.

By connecting the second auxiliary transistor T5 to the corresponding pixel PX, the second auxiliary transistor T5 may substitute for the switching transistor T2 and may function as the same. For example, the first electrode of the second auxiliary transistor T5 and the data line may be short-circuited St1 by irradiating laser beams. The second electrode of the second auxiliary transistor T5 and the lower storage electrode may be short-circuited St2 by irradiating laser beams. By this, the second auxiliary transistor T5 may be connected to the corresponding pixel PX.

Regarding the display device according to an embodiment, each pixel PX may include a first auxiliary transistor T4 connected to the second scan line and a second auxiliary transistor T5 connected to the first scan line, so in case that defects FT are generated to the switching transistor T2 and the initialization transistor T3, the first auxiliary transistor T4 may substitute for the initialization transistor T3, and the second auxiliary transistor T5 may substitute for the switching transistor T2 according to the repair process including a laser cutting process and a laser shorting process.

In case that a defect FT is generated to one of the switching transistor T2 and the initialization transistor T3, the initialization transistor T3 or the switching transistor T2 may be substituted by selectively connecting one of the first auxiliary transistor T4 and the second auxiliary transistor T5 according to the repair process including a laser cutting process and a laser shorting process.

A display device according to an embodiment will now be described with reference to FIG. 21 to FIG. 29.

Figure 29:
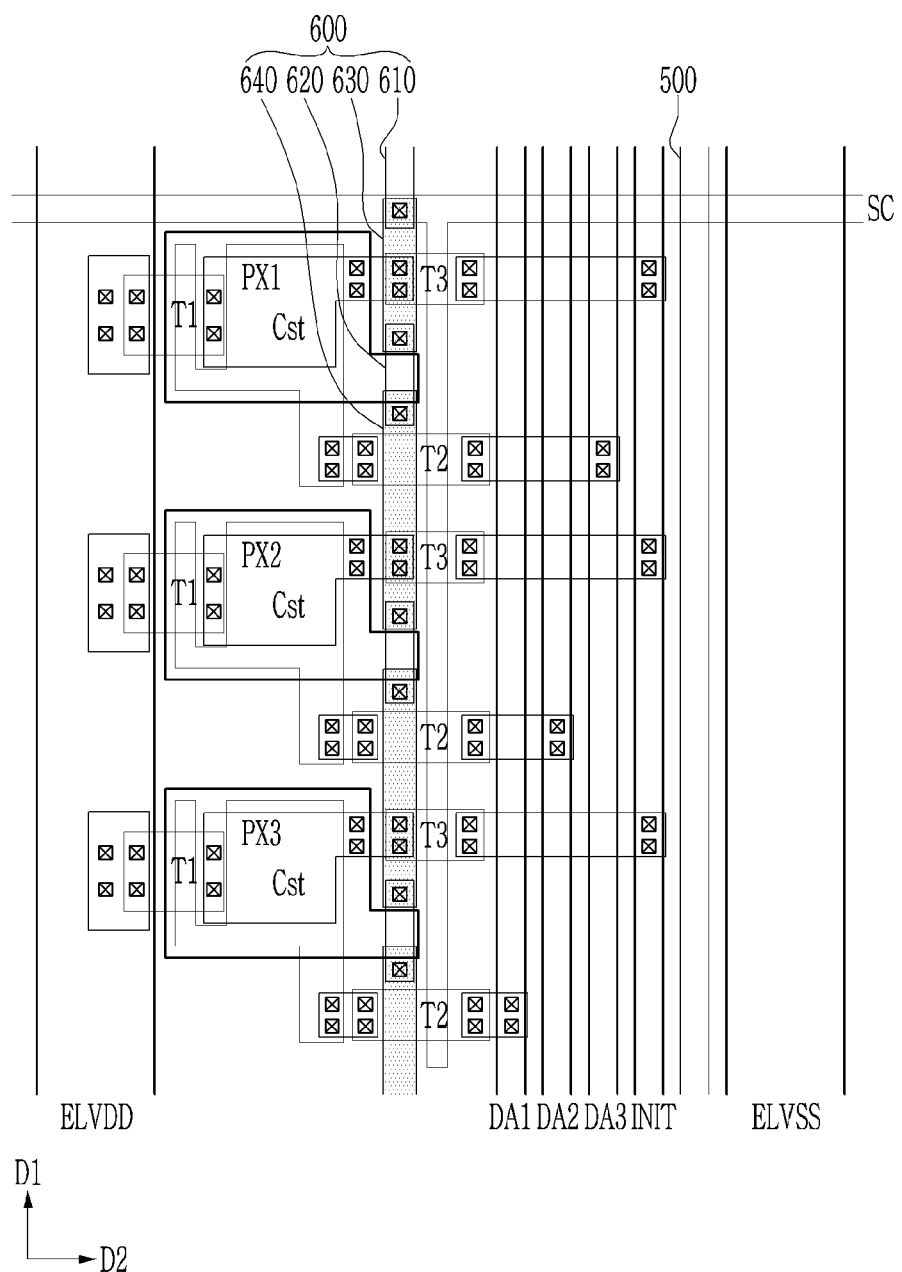

The display device according to an embodiment described with reference to FIG. 21 and FIG. 29 mostly corresponds to the display device according to an embodiment described with reference to FIG. 1 to FIG. 8, therefore no same portion may be described. The embodiment is different from the previous embodiment in that it further may include a dummy pixel, which will now be described.

Figure 21:
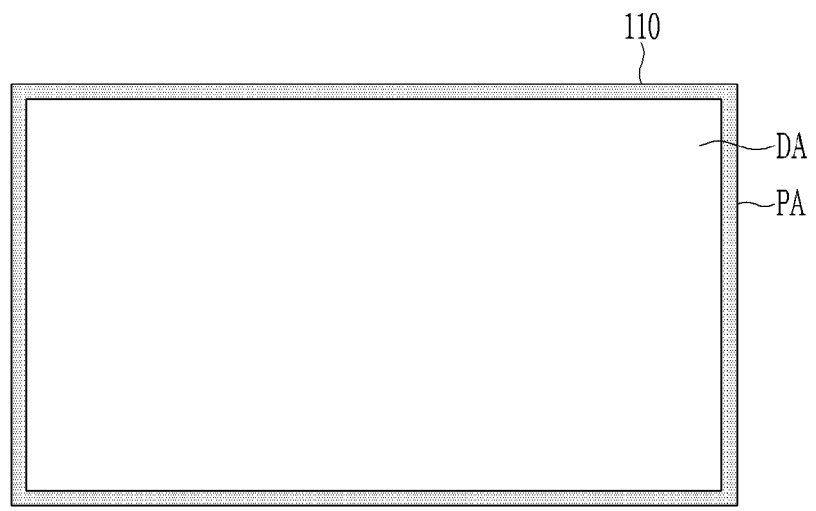
FIG. 21 shows a schematic top plan view of a display device according to an embodiment.
Figure 22:
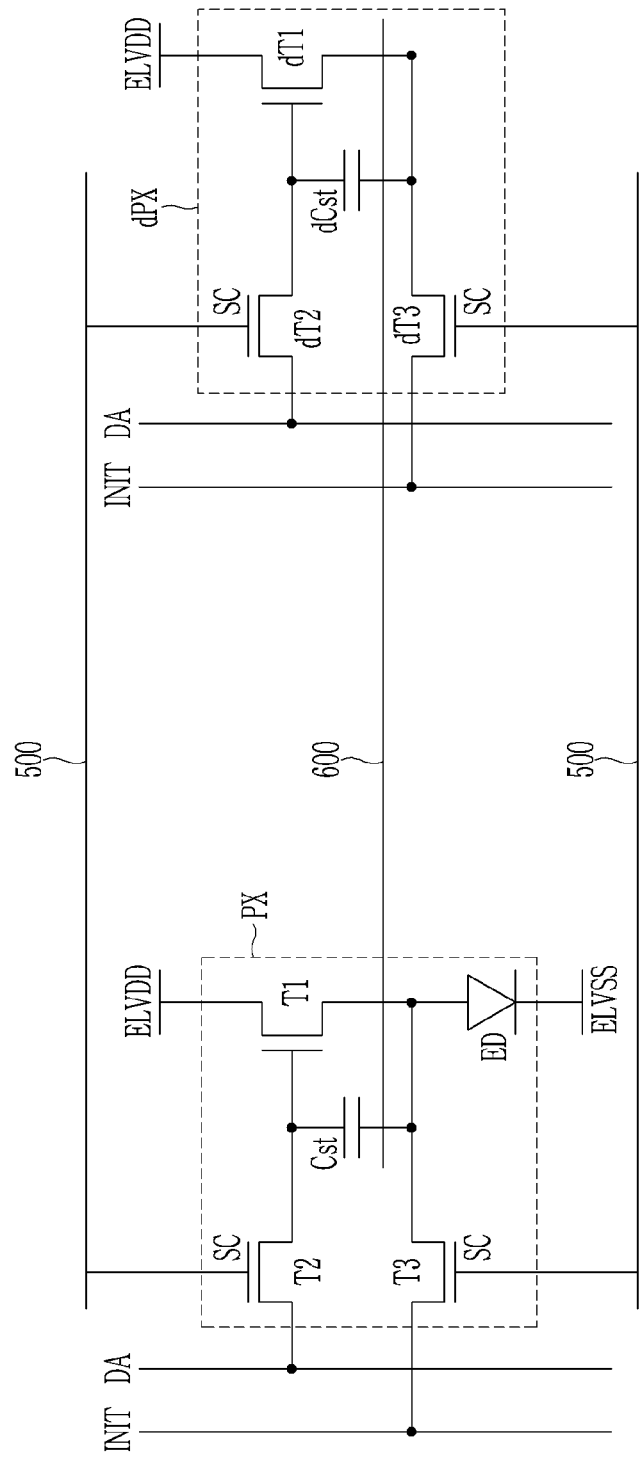
FIG. 22 shows a schematic diagram of an equivalent circuit of a pixel and a dummy pixel of a display device according to an embodiment.
Figure 23:
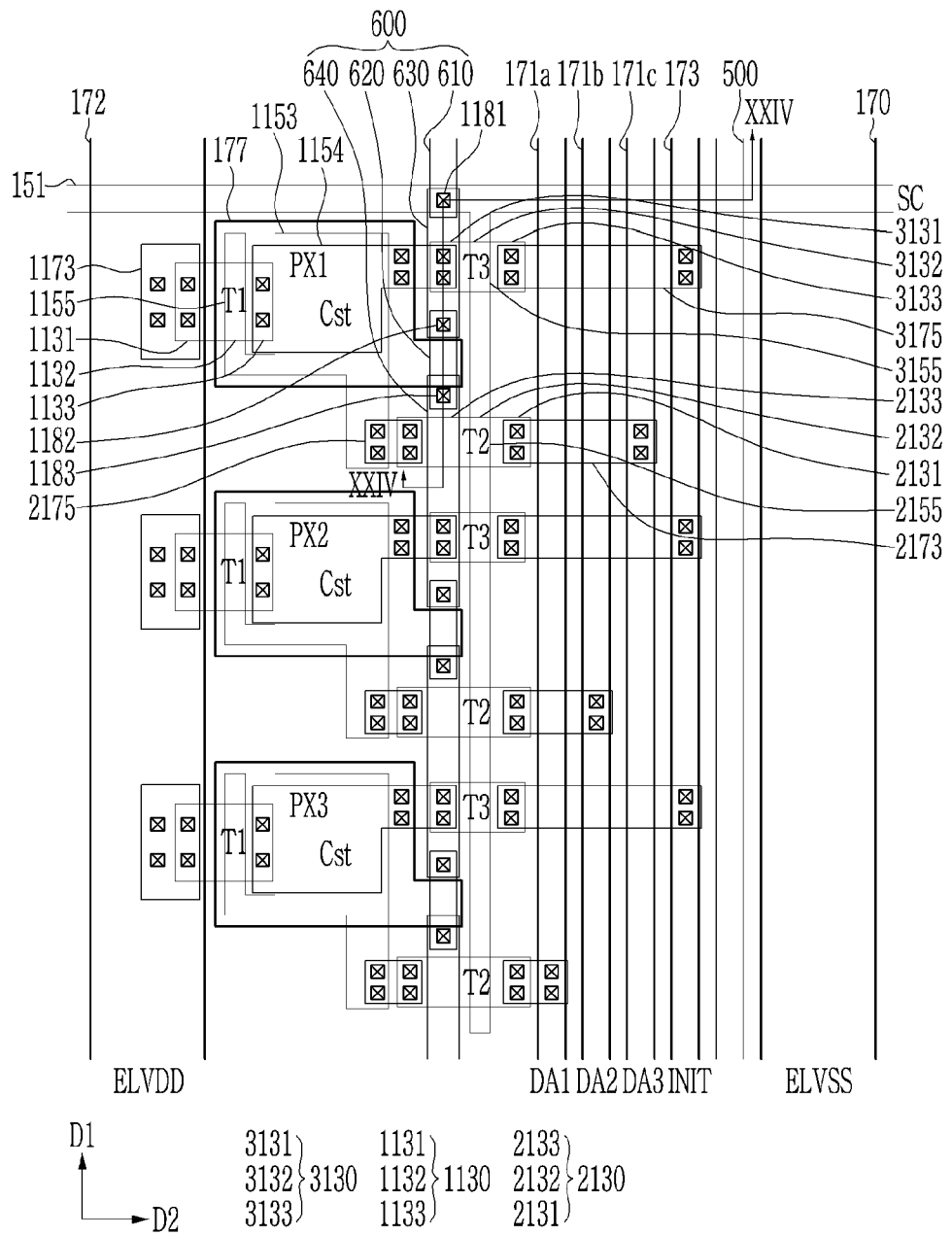
FIG. 23 shows a schematic top plan view of part of a display area of a display device according to an embodiment.
Figure 24:
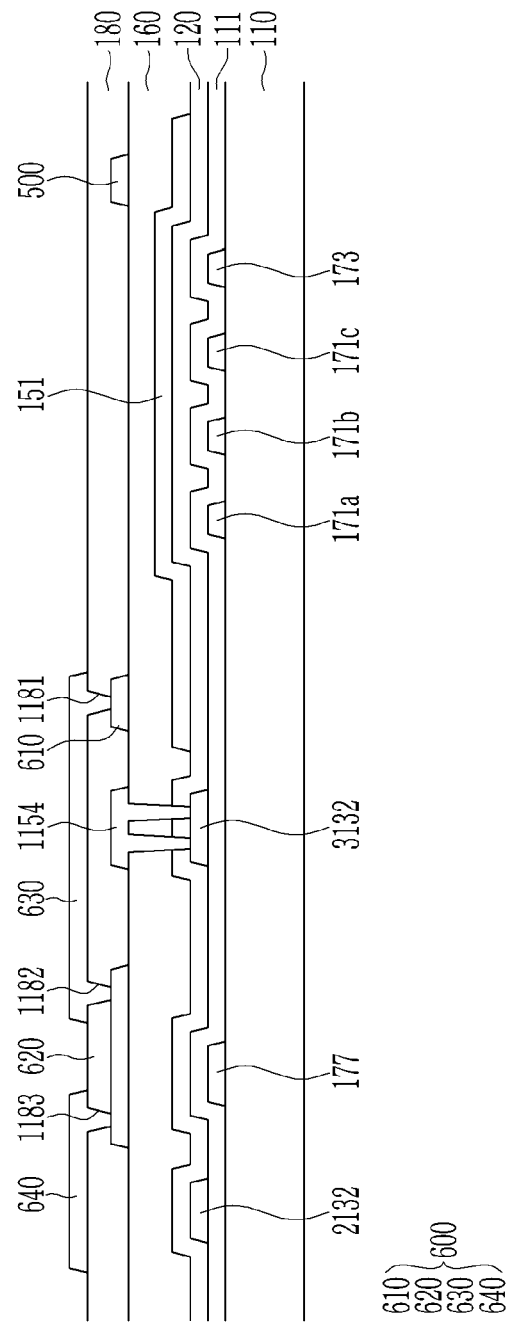
FIG. 24 shows a schematic cross-sectional view of a display device according to an embodiment with respect to a line XXIV-XXIV of FIG. 23.
Figure 30:
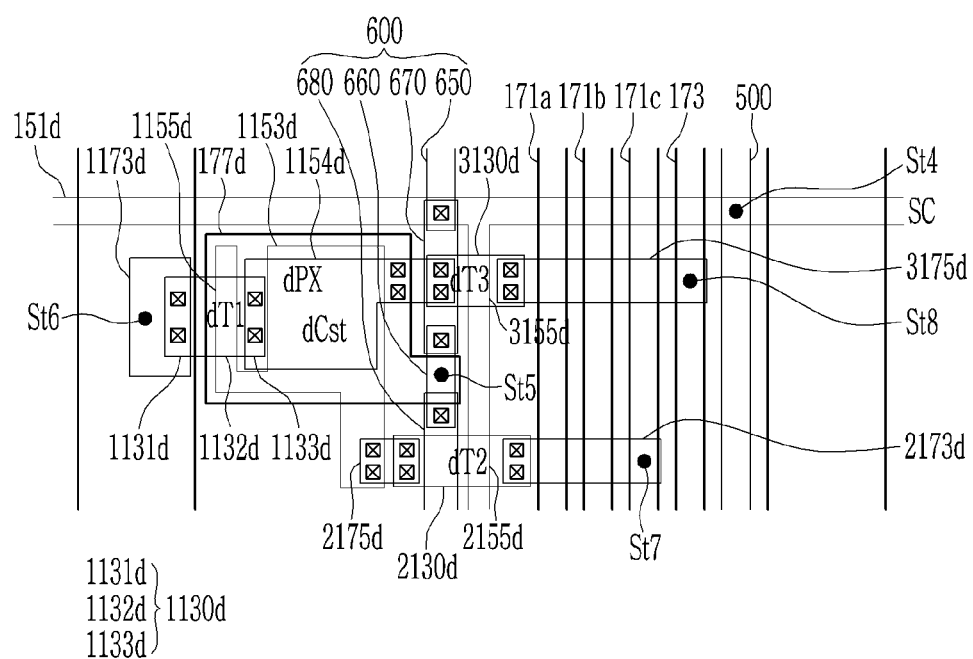
FIG. 30 shows a schematic top plan view of a peripheral area of a display device according to an embodiment.

FIG. 21 shows a schematic top plan view of a display device according to an embodiment, and FIG. 22 shows a schematic diagram of an equivalent circuit of a pixel and a dummy pixel of a display device according to an embodiment. FIG. 23 shows a schematic top plan view of part of a display area of a display device according to an embodiment, and FIG. 24 shows a schematic cross-sectional view of a display device according to an embodiment with respect to a line XXIV-XXIV of FIG. 23. FIG. 25 to FIG. 29 show sequential schematic top plan views of an order for manufacturing a display device according to an embodiment. FIG. 25 to FIG. 29 illustrate three adjacent pixels of a display device according to an embodiment, and the three pixels may be repeatedly disposed. FIG. 30 shows a schematic top plan view of a peripheral area of a display device according to an embodiment.

As shown in FIG. 21, the substrate 110 may include a display area DA and a peripheral area PA. The display area DA represents a region in which pixels including light emitting diodes LED and transistors are formed and which displays images, and the peripheral area PA represents a region for displaying no image. The peripheral area PA is positioned outside the display area DA, and may surround the display area DA. The peripheral area PA represents a region in which wires and pads for supplying driving signals to the pixels, and dummy pixels, are formed.

Pixels including a transistor and a light emitting diode LED may be positioned in the display area DA. Pixels may be arranged in various forms, for example, a matrix form.

Power wires and pad units for transmitting driving signals such as voltages or signals to the pixels positioned in the display area DA may be positioned in the peripheral area PA. Dummy pixels with a similar structure to the pixels positioned in the display area DA may be positioned in the peripheral area PA.

As shown in FIG. 22, one pixel PX may include transistors T1, T2, and T3, a capacitor Cst, and a light emitting diode ED. The transistors T1, T2, and T3 include a driving transistor T1, a switching transistor T2, and an initialization transistor T3. Differing from the previous embodiment, the respective pixels PX do not include the first auxiliary transistor.

Similar to the pixel PX positioned in the display area DA, the one dummy pixel dPX may include dummy transistors dT1, dT2, and dT3, and a dummy capacitor dCst. However, the dummy pixel dPX is different from the pixel PX in that it does not include the light emitting diode ED. Dummy transistors dT1, dT2, and dT3 include a dummy driving transistor dT1, a dummy switching transistor dT2, and a dummy initialization transistor dT3.

In the dummy pixel dPX, the dummy driving transistor dT1 may not be connected to the driving voltage line, the dummy switching transistor dT2 may not be connected to the data line, and the dummy initialization transistor dT3 may not be connected to the initialization voltage line. However, depending on cases, in a dummy pixel dPX, the dummy driving transistor dT1 may be connected to the driving voltage line, the dummy switching transistor dT2 may be connected to the data line, and the dummy initialization transistor dT3 may be connected to the initialization voltage line.

In the dummy pixel dPX, the dummy switching transistor dT2 and the dummy initialization transistor dT3 are connected to the dummy first scan line. The first scan line connected to the pixel PX may not be connected to the dummy first scan line connected to the dummy pixel dPX. However, depending on cases, the first scan line connected to a pixel PX may be connected to the dummy first scan line connected to a dummy pixel dPX by the scan auxiliary wire 500. In case that the dummy first scan line is connected to the first scan line by the scan auxiliary wire 500, the first scan signal SC may be applied to the dummy first scan line.

In the embodiment, the switching transistor T2 and the initialization transistor T3 are connected to the same scan line, but are not limited thereto. The switching transistor T2 may be connected to the first scan line, and the initialization transistor T3 may be connected to the second scan line. The dummy switching transistor dT2 may be connected to the dummy first scan line, and the dummy initialization transistor dT3 may be connected to the dummy second scan line.

The second electrode of the driving transistor T1 of the pixel PX may not be connected to the second electrode of the dummy driving transistor dT1 of the dummy pixel dPX. However, depending on cases, the second electrode of the driving transistor T1 of the pixel PX may be connected to the second electrode of the driving transistor T1 of the dummy pixel dPX by the driving auxiliary wire 600.

Figure 25:
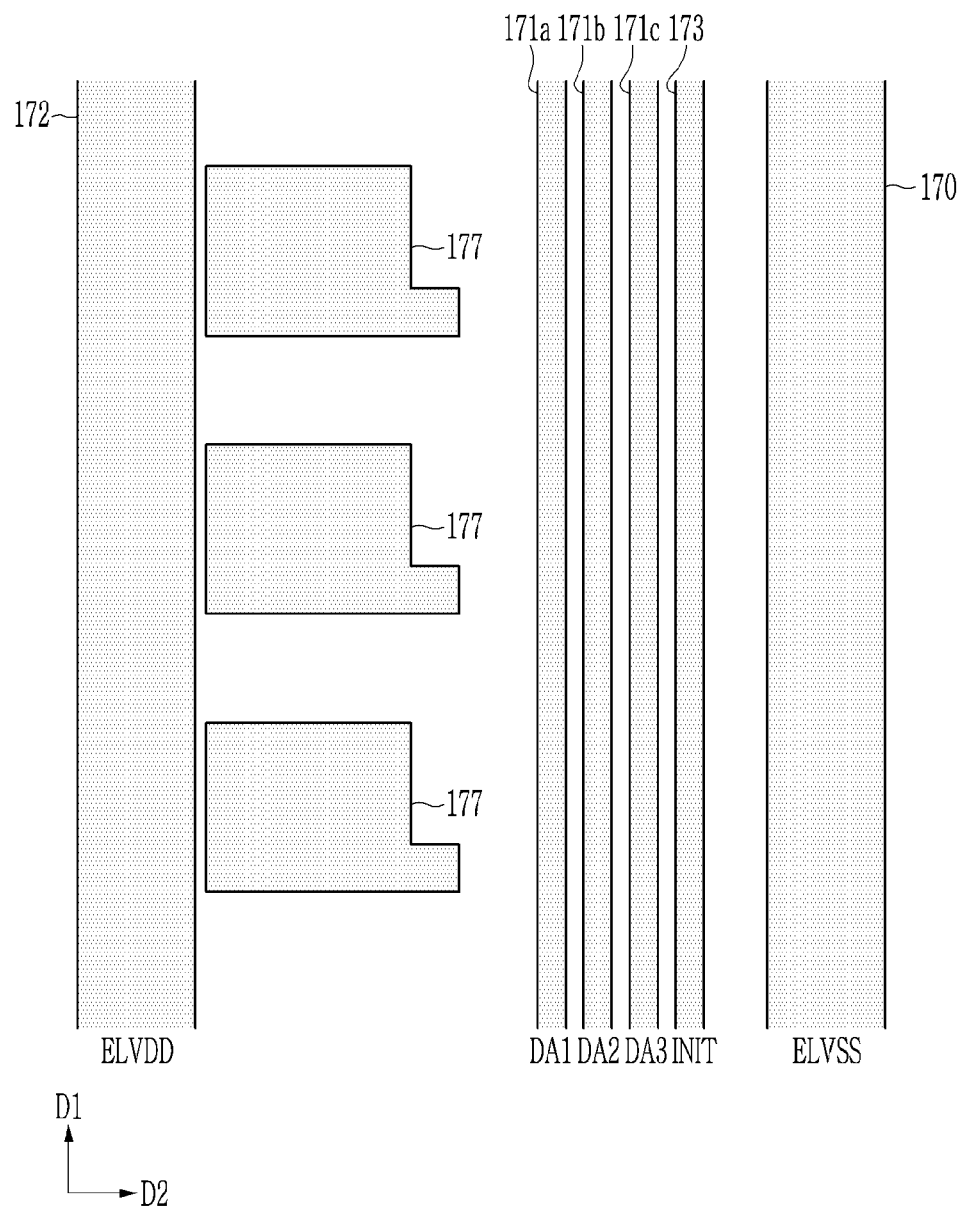
FIG. 25 to FIG. 29 show sequential schematic top plan views of an order for manufacturing a display device according to an embodiment.

As shown in FIG. 23 to FIG. 29, the display device according to an embodiment may include a substrate 110, and a first conductive layer, a semiconductor layer, a second conductive layer, and a third conductive layer positioned on the substrate 110. FIG. 25 illustrates a first conductive layer.

Figure 26:
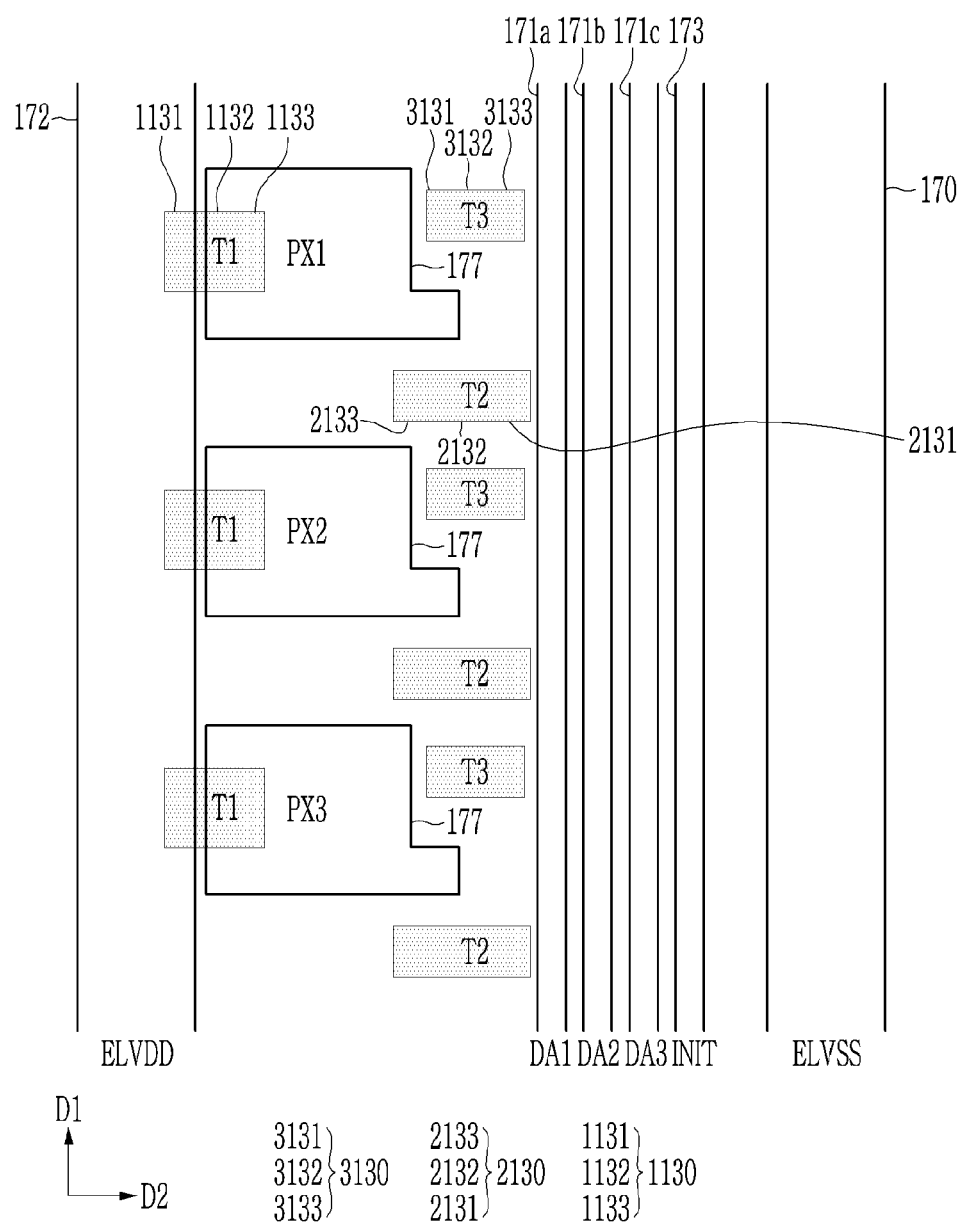

In a like manner of the previous embodiment, the semiconductor layer may include a semiconductor layer 1130 of the driving transistor T1, a semiconductor layer 2130 of the switching transistor T2, and a semiconductor layer 3130 of the initialization transistor T3. In the embodiment, the semiconductor layer of the first auxiliary transistor is not formed. FIG. 26 illustrates a first conductive layer and a semiconductor layer.

Figure 27:
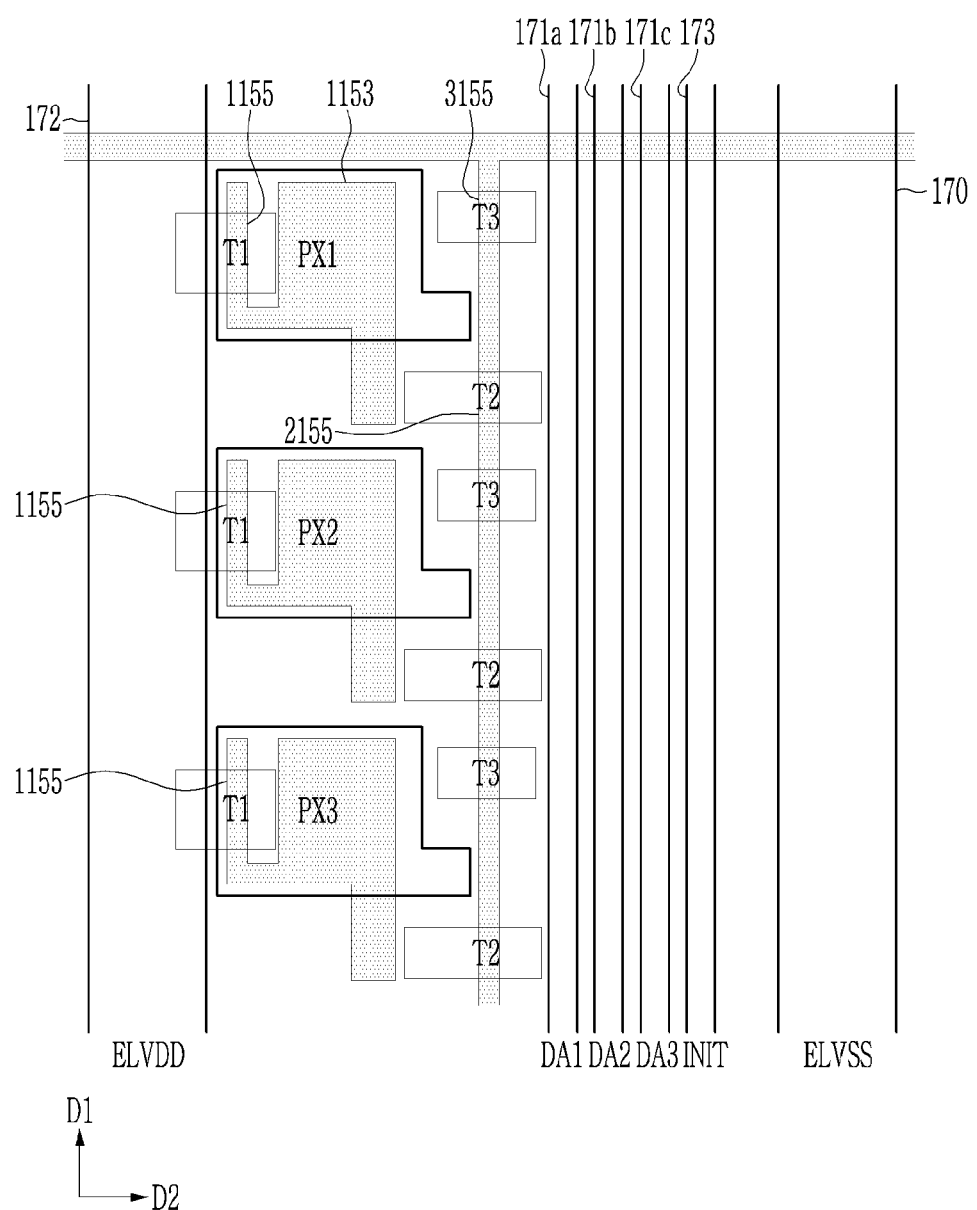

In a like manner of the previous embodiment, the second conductive layer may include a gate electrode 1155 of the driving transistor T1, a lower storage electrode 1153, a gate electrode 2155 of the switching transistor T2, and a gate electrode 3155 of the initialization transistor T3. In the embodiment, the gate electrode of the first auxiliary transistor is not formed. FIG. 27 shows a first conductive layer, a semiconductor layer, and a second conductive layer.

Figure 28:
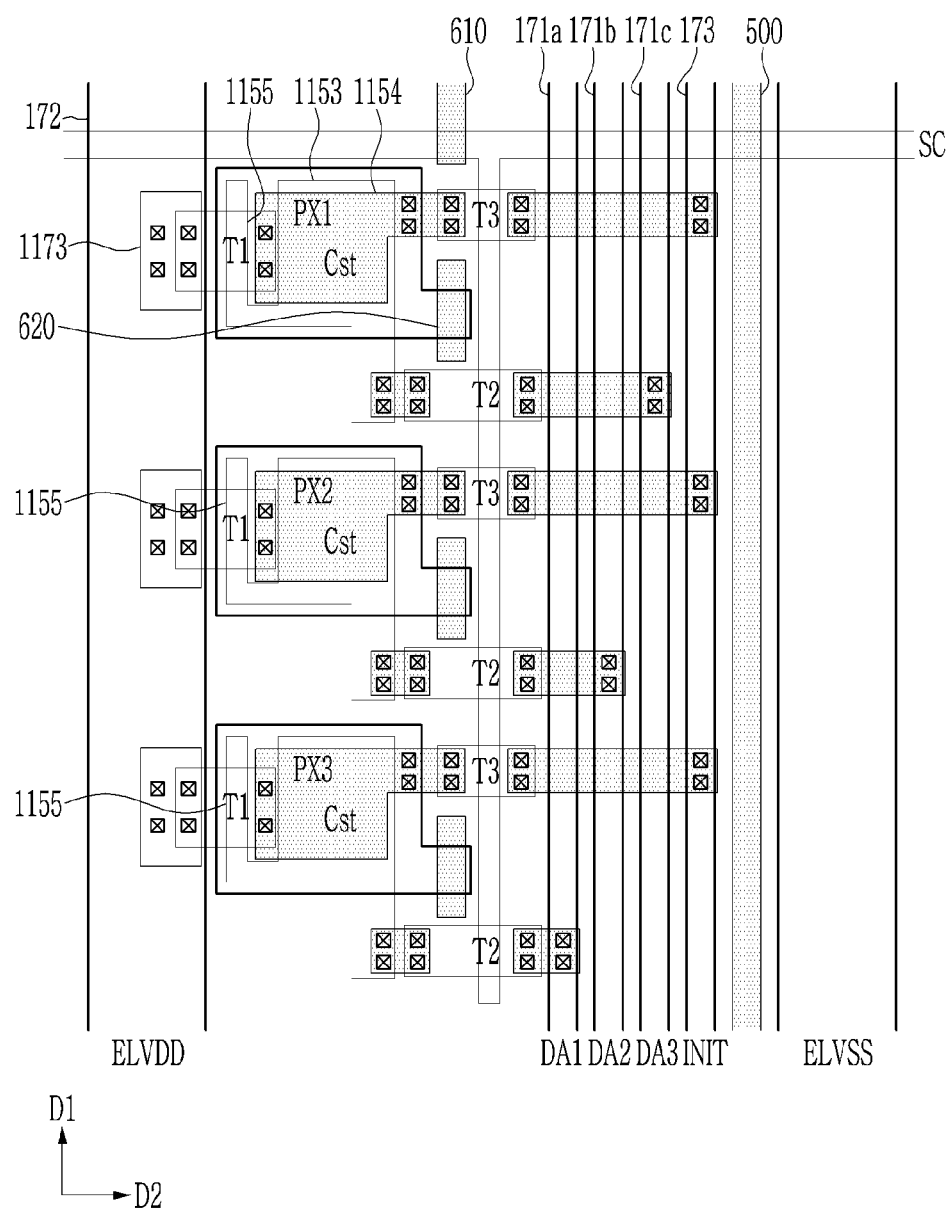

In a like manner of the previous embodiment, the third conductive layer may include an upper storage electrode 1154, a first electrode 2173 and a second electrode 2175 of the switching transistor T2, and a second electrode 3175 of the initialization transistor T3. In the embodiment, the first electrode and the second electrode of the first auxiliary transistor are not formed. FIG. 28 shows a first conductive layer, a semiconductor layer, a second conductive layer, and a third conductive layer.

In the embodiment, the third conductive layer may further include a scan auxiliary wire 500, and a first portion 610 and a second portion 620 of the driving auxiliary wire 600.

The scan auxiliary wire 500 may extend in the first direction D1, and may overlap the first scan line 151. The scan auxiliary wire 500 may be positioned between the initialization voltage line 173 and the common voltage line 170. However, without being limited thereto, the position of the scan auxiliary wire 500 is variable in many ways.

The first portion 610 of the driving auxiliary wire 600 may extend in the first direction D1, and may overlap the first scan line 151. The second portion 620 of the driving auxiliary wire 600 may extend in the first direction D1, and may overlap the light blocking pattern 177. The first portion 610 and the second portion 620 of the driving auxiliary wire 600 may be spaced from each other. The initialization transistor T3 may be positioned between the first portion 610 and the second portion 620 of the driving auxiliary wire 600. The second portion 620 of the driving auxiliary wire 600 may be positioned between the initialization transistor T3 and the switching transistor T2. The first portion 610 and the second portion 620 of the driving auxiliary wire 600 do not overlap the initialization transistor T3 and the switching transistor T2.

A third insulating layer 180 may be positioned on the third conductive layer including the scan auxiliary wire 500, and a first portion 610 and a second portion 620 of the driving auxiliary wire 600.

A fourth conductive layer including a third portion 630 and a fourth portion 640 of the driving auxiliary wire 600 may be positioned on the third insulating layer 180. FIG. 29 shows a first conductive layer, a semiconductor layer, a second conductive layer, a third conductive layer, and a fourth conductive layer.

The third portion 630 of the driving auxiliary wire 600 may extend in the first direction D1, and may overlap the semiconductor layer 3130 of the initialization transistor T3. The third portion 630 of the driving auxiliary wire 600 may overlap the first portion 610 and the second portion 620 of the driving auxiliary wire 600. The third insulating layer 180 may include an opening 1181 overlapping the first portion 610 and the third portion 630 of the driving auxiliary wire 600. The third portion 630 of the driving auxiliary wire 600 may be connected to the first portion 610 through the opening 1181. The third insulating layer 180 may include an opening 1182 overlapping the second portion 620 and the third portion 630 of the driving auxiliary wire 600. The third portion 630 of the driving auxiliary wire 600 may be connected to the second portion 620 through the opening 1182.

The fourth portion 640 of the driving auxiliary wire 600 may extend in the first direction D1, and may overlap the semiconductor layer 2130 of the switching transistor T2. The fourth portion 640 of the driving auxiliary wire 600 may overlap the second portion 620 of the driving auxiliary wire 600. The third insulating layer 180 may include an opening 1183 overlapping the second portion 620 and the fourth portion 640 of the driving auxiliary wire 600. The fourth portion 640 of the driving auxiliary wire 600 may be connected to the second portion 620 through the opening 1183. The fourth portion 640 of the driving auxiliary wire 600 may be connected to the second portion 620 of the driving auxiliary wire 600 positioned on another pixel.

For example, at least some of the first portion 610, the second portion 620, the third portion 630, and the fourth portion 640 of the driving auxiliary wire 600 extending in the first direction D1 may be positioned on other layers, or may be connected to each other to transmit the same voltage. As described above, the third portion 630 and the fourth portion 640 of the driving auxiliary wire 600 may be positioned on a different layer from the first portion 610 and the second portion 620. The first portion 610 and the second portion 620 of the driving auxiliary wire 600 may be positioned on a same layer as the first electrode 2173 and the second electrode 2175 of the switching transistor T2 and the second electrode 3175 of the initialization transistor T3.

Although not shown, the fourth conductive layer may further include a pixel electrode. The third portion 630 and the fourth portion 640 of the driving auxiliary wire 600 may be positioned on the same layer as the pixel electrode. The pixel electrode may be connected to the driving transistor T1, and may receive an output current of the driving transistor T1. A fourth insulating layer may be positioned on the pixel electrode. An opening is formed in the fourth insulating layer, and the opening of the fourth insulating layer may overlap the pixel electrode. An emission layer may be positioned on the pixel electrode and the fourth insulating layer, and a common electrode may be positioned on the emission layer. The pixel electrode, the emission layer, and the common electrode may form a light emitting diode ED. As shown in FIG. 30, the display device according to an embodiment may further include a dummy driving transistor dT1, a dummy switching transistor dT2, a dummy initialization transistor dT3, and a dummy capacitor dCst. The dummy driving transistor dT1, the dummy switching transistor dT2, the dummy initialization transistor dT3, and the dummy capacitor dCst have similar configurations to the driving transistor T1, the switching transistor T2, and the initialization transistor T3, so differences will be described.

The first electrode 1173 of the driving transistor T1 may be connected to the driving voltage line 172 through the opening 1161. The first electrode 1173d of the dummy driving transistor dT1 may not be connected to the driving voltage line 172. However, depending on cases, on a dummy pixel dPX, the first electrode 1173d of the dummy driving transistor dT1 may be connected to the driving voltage line 172. The semiconductor layer 1130d of the dummy driving transistor dT1 may include a first region 1131d, a channel 1132d, and a second region 1133d, and the gate electrode 1155d of the dummy driving transistor dT1 may overlap the channel 1132d of the semiconductor layer 1130d. The dummy lower storage electrode 1153d extending from the gate electrode 1155d of the dummy driving transistor dT1 may overlap the dummy light blocking pattern 177d and the dummy upper storage electrode 1154d.

The gate electrode 2155d of the dummy switching transistor dT2 and the gate electrode 3155d of the dummy initialization transistor dT3 may extend from the dummy first scan line 151d and may be integral with each other.

The first electrode 2173 of the switching transistor T2 may be connected to one of the data lines 171a, 171b, and 171c through the opening 2162. The first electrode 2173d of the dummy switching transistor dT2 may not be connected to the data lines 171a, 171b, and 171c. However, depending on cases, on a dummy pixel dPX, the first electrode 2173d of the dummy switching transistor dT2 may be connected to one of the data lines 171a, 171b, and 171c. The first side of the semiconductor layer 2130d of the dummy switching transistor dT2 is connected to the first electrode 2173d, and the second side is connected to the second electrode 2175d.

The second electrode 3175 of the initialization transistor T3 may be connected to the initialization voltage line 173 through the opening 1167. The second electrode 3175d of the dummy initialization transistor dT3 may not be connected to the initialization voltage line 173. However, depending on cases, on a dummy pixel dPX, the second electrode 3175d of the dummy initialization transistor dT3 may be connected to the initialization voltage line 173. A first side of the semiconductor layer 3130d of the dummy initialization transistor dT3 is connected to the dummy upper storage electrode 1154d, and the second side is connected to the second electrode 3175d.

The scan auxiliary wire 500 may extend to the peripheral area PA from the display area DA. The scan auxiliary wire 500 may overlap the first scan line 151 and the dummy first scan line 151d.

The data lines 171a, 171b, and 171c, the initialization voltage line 173, and the driving auxiliary wire 600 may extend to the peripheral area PA from the display area DA. The driving auxiliary wire 600 may overlap the light blocking pattern 177 and the dummy light blocking pattern 177d.

The driving auxiliary wire 600 may further include a fifth portion 650, a sixth portion 660, a seventh portion 670, and an eighth portion 680 extending in the first direction D1. The fifth portion 650 of the driving auxiliary wire 600 may overlap the dummy first scan line 151d, and the sixth portion 660 may overlap the dummy light blocking pattern 177d. The seventh portion 670 of the driving auxiliary wire 600 may overlap the semiconductor layer 3130d of the dummy initialization transistor dT3, and the eighth portion 680 may overlap the semiconductor layer 2130d of the dummy switching transistor dT2.

At least some of the fifth portion 650, the sixth portion 660, the seventh portion 670, and the eighth portion 680 of the driving auxiliary wire 600 may be positioned on another layer, and may be connected to each other to transmit the same voltage. The fifth portion 650 and the sixth portion 660 of the driving auxiliary wire 600 may be positioned on the same layer as the first electrode 2173d and the second electrode 2175d of the dummy switching transistor dT2, and the second electrode 3175d of the dummy initialization transistor dT3.

The light emitting diode ED may not be positioned on the dummy pixel dPX. The pixel electrode may not be positioned on the dummy pixel dPX.

A method for repairing a display device according to an embodiment will now be described with reference to FIG. 31 to FIG. 33.

Figure 31:
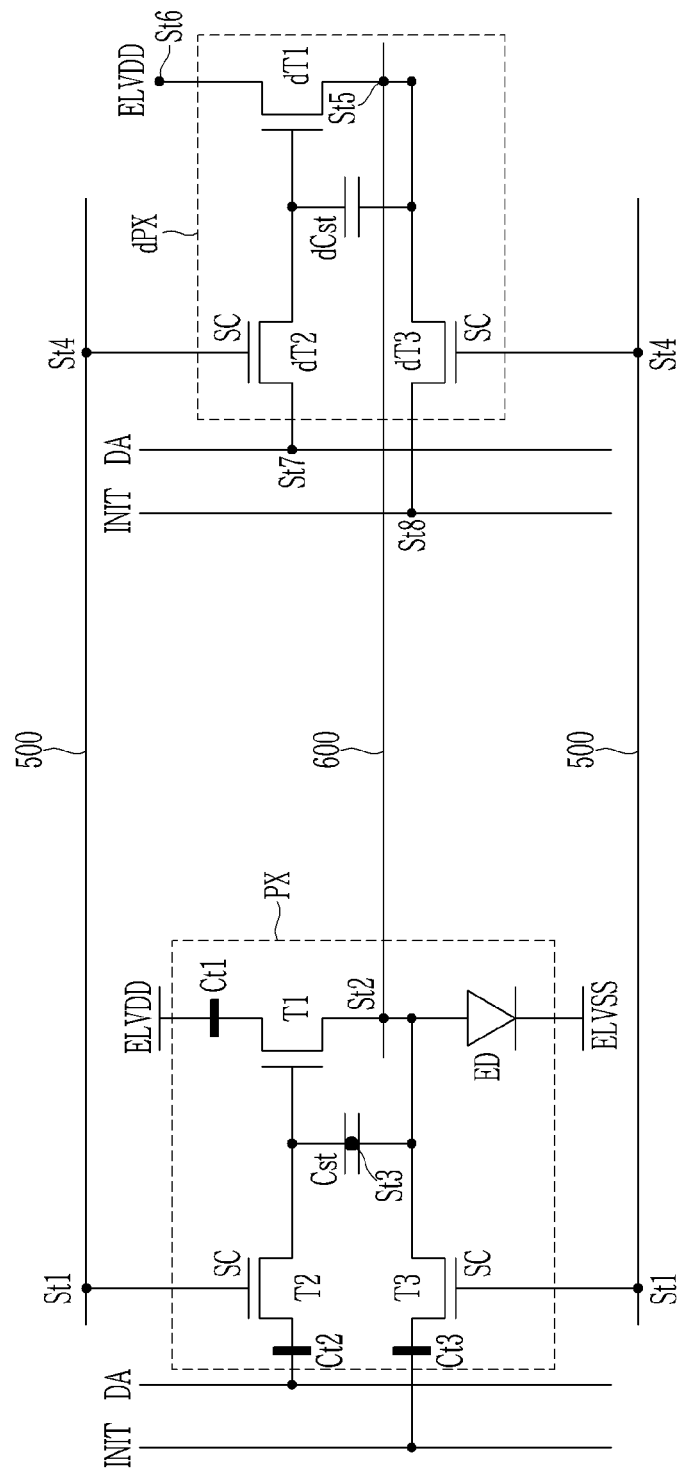
FIG. 31 to FIG. 33 show a repairing method in case that a defect is generated to a pixel of a display device according to an embodiment.
Figure 32:
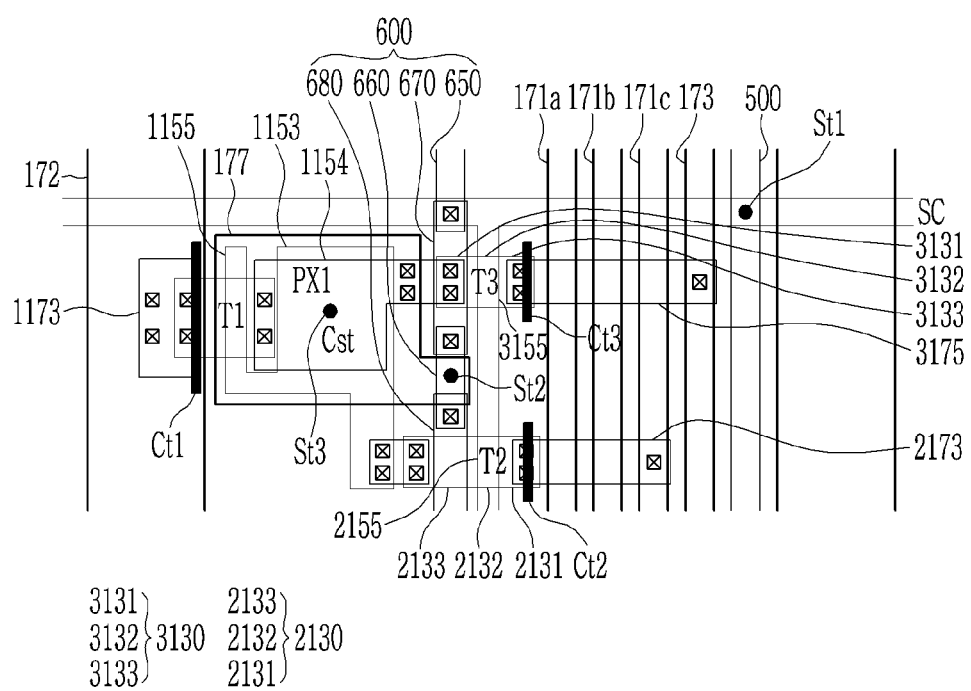
Figure 33:
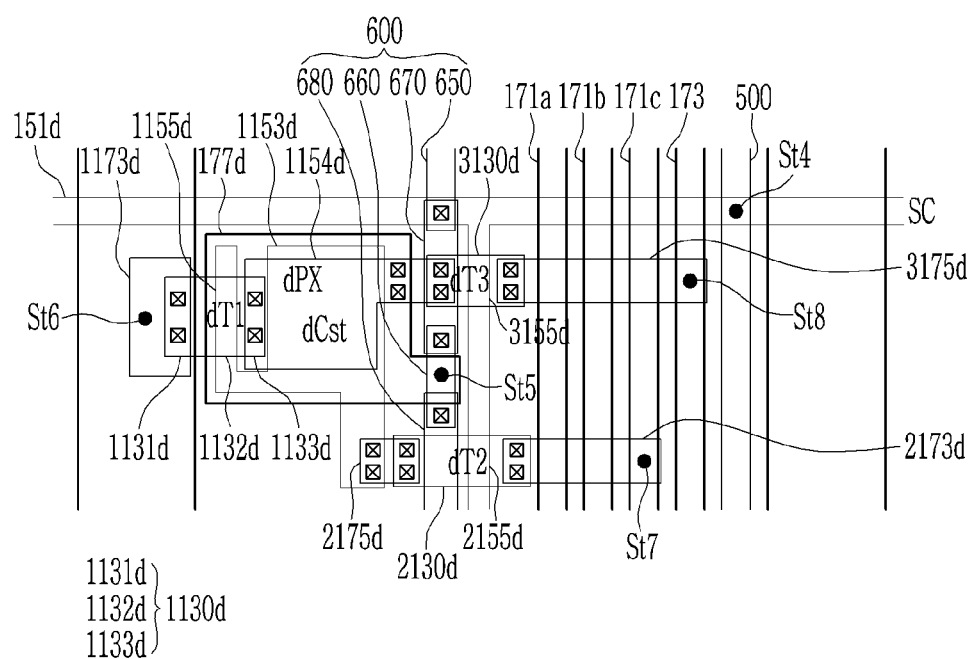

FIG. 31 to FIG. 33 show a repairing method in case that a defect is generated to a pixel of a display device according to an embodiment.

As shown in FIG. 31 to FIG. 33, a defect may be generated to a pixel PX of a display device according to an embodiment. For example, a defect may be generated to the driving transistor T1 of the pixel PX.

The driving transistor T1 of the pixel PX to which a defect is generated, the switching transistor T2, and the initialization transistor T3 may be separated from the corresponding pixel PX between the driving transistor T1 and the driving voltage line 172 at disconnecting region Ct1, between the switching transistor T2 and the data lines 171a, 171b, and 171c at disconnecting region Ct2, and between the initialization transistor T3 and the initialization voltage line 173 at disconnecting region Ct3. For example, between the driving transistor T1 and the driving voltage line 172 may be disconnected at disconnecting region Ct1 by irradiating laser beams to the first region 1131 of the semiconductor layer 1130 of the driving transistor T1, between the switching transistor T2 and the data lines 171a, 171b, and 171c may be disconnected at disconnecting region Ct2 by irradiating laser beams to the first electrode 2173 of the switching transistor T2, and between the initialization transistor T3 and the initialization voltage line 173 may be disconnected at disconnecting region Ct3 by irradiating laser beams to the second electrode 3175 of the initialization transistor T3.

By connecting the pixel PX to which a defect is generated to the dummy pixel dPX, the dummy driving transistor dT1, the dummy switching transistor dT2, and the dummy initialization transistor dT3 may substitute for the driving transistor T1, the switching transistor T2, and the initialization transistor T3 and may function as the same.

The first scan line 151 connected to the pixel PX to which a defect is generated and the scan auxiliary wire 500 may be short-circuited St1, the driving transistor T1 and the driving auxiliary wire 600 may be short-circuited St2, and respective electrodes of the capacitor Cst may be short-circuited St3. For example, the first scan line 151 and the scan auxiliary wire 500 may be short-circuited St1 by irradiating laser beans to the overlapping portion of the first scan line 151 and the scan auxiliary wire 500. The light blocking pattern 177 and the driving auxiliary wire 600 may be short-circuited St2 by irradiating laser beams to the overlapping portion of the light blocking pattern 177 and the second portion 620 of the driving auxiliary wire 600. By this, the second region 1133 of the semiconductor layer 1130 of the driving transistor T1 may be connected to the driving auxiliary wire 600 through the upper storage electrode 1154 and the light blocking pattern 177. The upper storage electrode 1154 and the lower storage electrode 1153 may be short-circuited St3 by irradiating laser beams to the overlapping portion of the upper storage electrode 1154 and the lower storage electrode 1153.

The dummy first scan line 151d connected to the dummy pixel dPX and the scan auxiliary wire 500 may be short-circuited St4, and the dummy driving transistor dT1 and the driving auxiliary wire 600 may be short-circuited St5. The dummy driving transistor dT1 and the driving voltage line 172 may be short-circuited St6, the dummy switching transistor dT2 and one of the data lines 171a, 171b, and 171c may be short-circuited St7, and the dummy initialization transistor dT3 and the initialization voltage line 173 may be short-circuited St8. For example, the dummy first scan line 151d connected to the dummy pixel dPX and the scan auxiliary wire 500 may be short-circuited St4 by irradiating laser beams to the overlapping portion of the dummy first scan line 151d and the scan auxiliary wire 500. The dummy light blocking pattern 177d and the driving auxiliary wire 600 may be short-circuited St5 by irradiating laser beams to the overlapping portion of the dummy light blocking pattern 177d and the driving auxiliary wire 600. By this, the second region 1133d of the semiconductor layer 1130d of the dummy driving transistor dT1 may be connected to the driving auxiliary wire 600 through the dummy upper storage electrode 1154d and the dummy light blocking pattern 177d. The first electrode 1173d of the dummy driving transistor dT1 and the driving voltage line 172 may be short-circuited St6 by irradiating laser beams to the overlapping portion of the first electrode 1173d of the dummy driving transistor dT1 and the driving voltage line 172. The first electrode 2173d of the dummy switching transistor dT2 and one of the data lines 171a, 171b, and 171c may be short-circuited St7 by irradiating laser beams to the overlapping portion of the first electrode 2173d of the dummy switching transistor dT2 and the data lines 171a, 171b, and 171c. The second electrode 3175 of the dummy initialization transistor dT3 and the initialization voltage line 173 may be short-circuited St8 by irradiating laser beams to the overlapping portion of the second electrode 3175 of the dummy initialization transistor dT3 and the initialization voltage line 173. For example, the dummy driving transistor dT1, the dummy switching transistor dT2, and the dummy initialization transistor dT3 of the dummy pixel dPX may be connected to the pixel PX through the scan auxiliary wire 500 and the driving auxiliary wire 600. Therefore, the light emitting diode ED of the corresponding pixel PX may emit light by the dummy driving transistor dT1, the dummy switching transistor dT2, and the dummy initialization transistor dT3 of the dummy pixel dPX.

The display device according to an embodiment may include the dummy pixel dPX, the scan auxiliary wire 500, and the driving auxiliary wire 600, so in case that a defect is generated to the pixel PX, the pixel PX and the dummy pixel dPX may be connected to each other by the scan auxiliary wire 500 and the driving auxiliary wire 600 according to the repair process including a laser cutting process and a laser shorting process. Therefore, the dummy driving transistor dT1, the dummy switching transistor dT2, and the dummy initialization transistor dT3 of the dummy pixel dPX may substitute for the driving transistor T1, the switching transistor T2, and the initialization transistor T3.

A display device according to an embodiment will now be described with reference to FIG. 34 and FIG. 35.

The display device according to an embodiment described with reference to FIG. 34 and FIG. 35 mostly corresponds to the display device according to an embodiment described with reference to FIG. 21 to FIG. 29, therefore no same portion may be described. The embodiment is different from the previous embodiment in that the dummy pixel is positioned in the display area, which will now be described.

Figure 34:
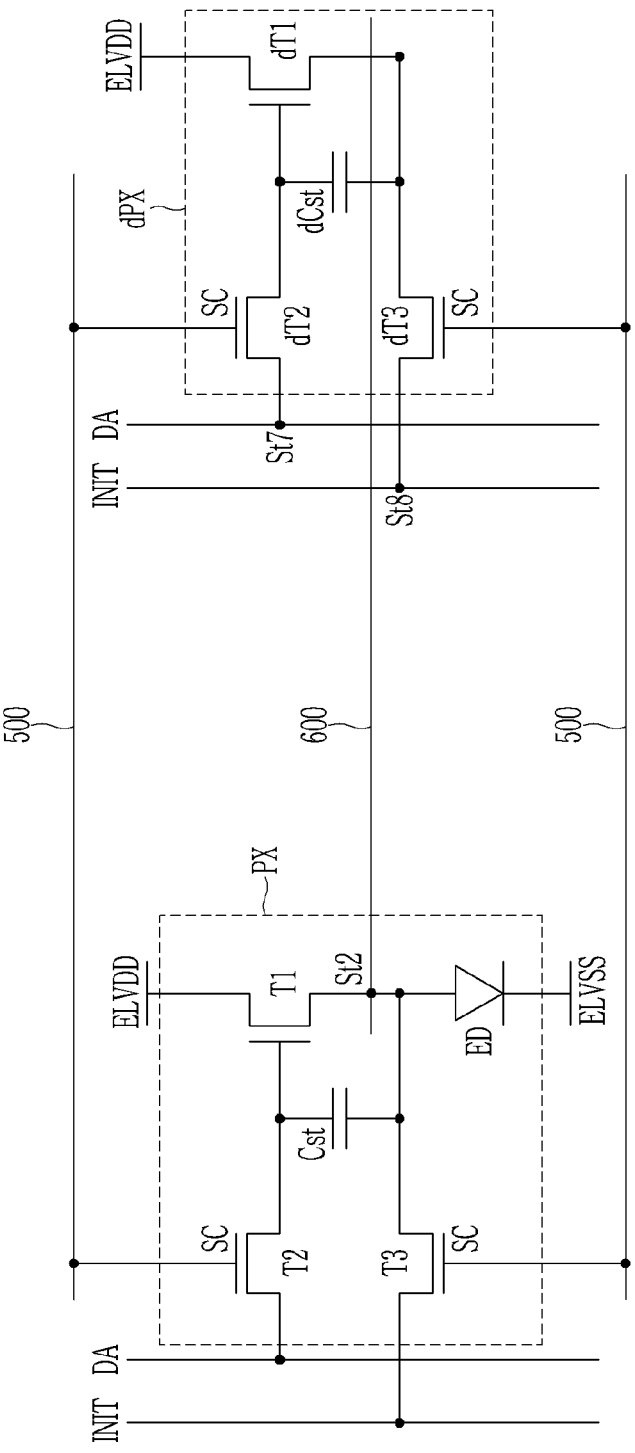
FIG. 34 shows a schematic diagram of an equivalent circuit of a pixel and a dummy pixel of a display device according to an embodiment.
Figure 35:
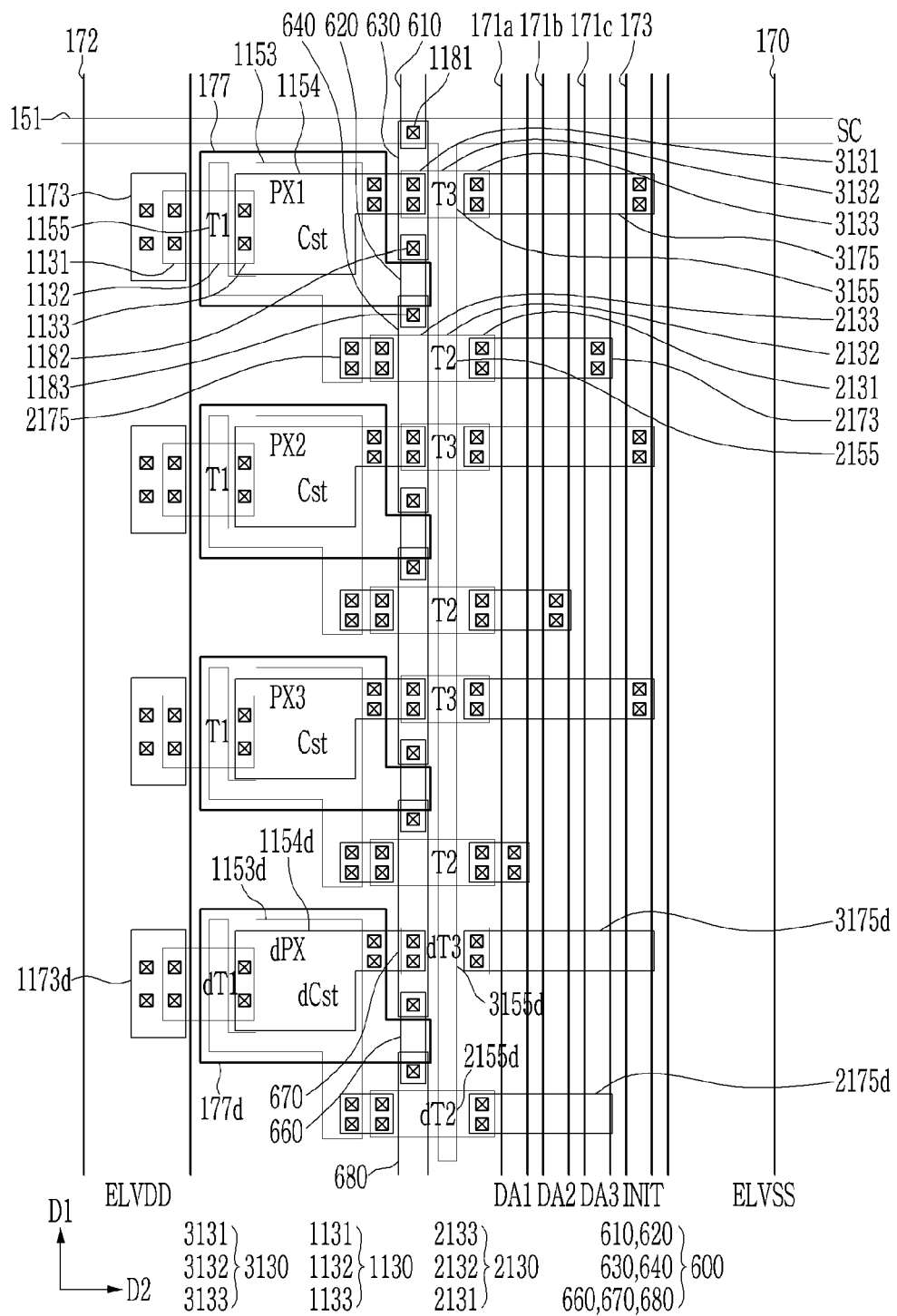
FIG. 35 shows a schematic top plan view of part of a display area of a display device according to an embodiment.

FIG. 34 shows a schematic diagram of an equivalent circuit of a pixel and a dummy pixel of a display device according to an embodiment, and FIG. 35 shows a schematic top plan view of part of a display area of a display device according to an embodiment.

As shown in FIG. 34, one pixel PX may include transistors T1, T2, and T3, a capacitor Cst, and a light emitting diode ED. One dummy pixel dPX may include dummy transistors dT1, dT2, and dT3 and a dummy capacitor dCst.

While the display device according to the previous embodiment may include a scan auxiliary wire, the display device according to the embodiment may include no scan auxiliary wire. In the embodiment, the switching transistor T2 of the pixel PX is connected to the dummy switching transistor dT2 of the dummy pixel dPX. The gate electrode of the switching transistor T2 and the gate electrode of the dummy switching transistor dT2 may be connected to the same first scan line. The initialization transistor T3 of the pixel PX is connected to the dummy initialization transistor dT3 of the dummy pixel dPX. The gate electrode of the initialization transistor T3 and the gate electrode of the dummy initialization transistor dT3 may be connected to the same first scan line.

As shown in FIG. 35, regarding the display device according to an embodiment, the dummy pixel dPX may be positioned near or disposed in a region adjacent the first to third pixels PX1, PX2, and PX3. The dummy pixel dPX may be positioned in the peripheral area in the previous embodiment, and the dummy pixel dPX may be positioned in the display area in the embodiment. The dummy pixel dPX may form a group with the three pixels PX1, PX2, and PX3. Therefore, a number of pixels of the display device according to an embodiment may be three times the number of the dummy pixels dPX.

The gate electrode 2155d of the dummy switching transistor dT2 of the dummy pixel dPX and the gate electrode 3155d of the dummy initialization transistor dT3 may extend from the first scan line 151. For example, the gate electrode 2155 of the switching transistor T2, the gate electrode of the initialization transistor T3, the gate electrode 2155d of the dummy switching transistor dT2, and the gate electrode 3155d of the dummy initialization transistor dT3 may receive the same first scan signal SC from the same first scan line 151.

The driving auxiliary wire 600 may include a first portion 610, a second portion 620, a third portion 630, a fourth portion 640, a sixth portion 660, a seventh portion 670, and an eighth portion 680. At least some of the first portion 610, the second portion 620, the third portion 630, the fourth portion 640, the sixth portion 660, the seventh portion 670, and the eighth portion 680 may be positioned on another layer, and may be connected to each other to transmit the same voltage.

A method for repairing a display device according to an embodiment will now be described with reference to FIG. 36 and FIG. 37.

Figure 36:
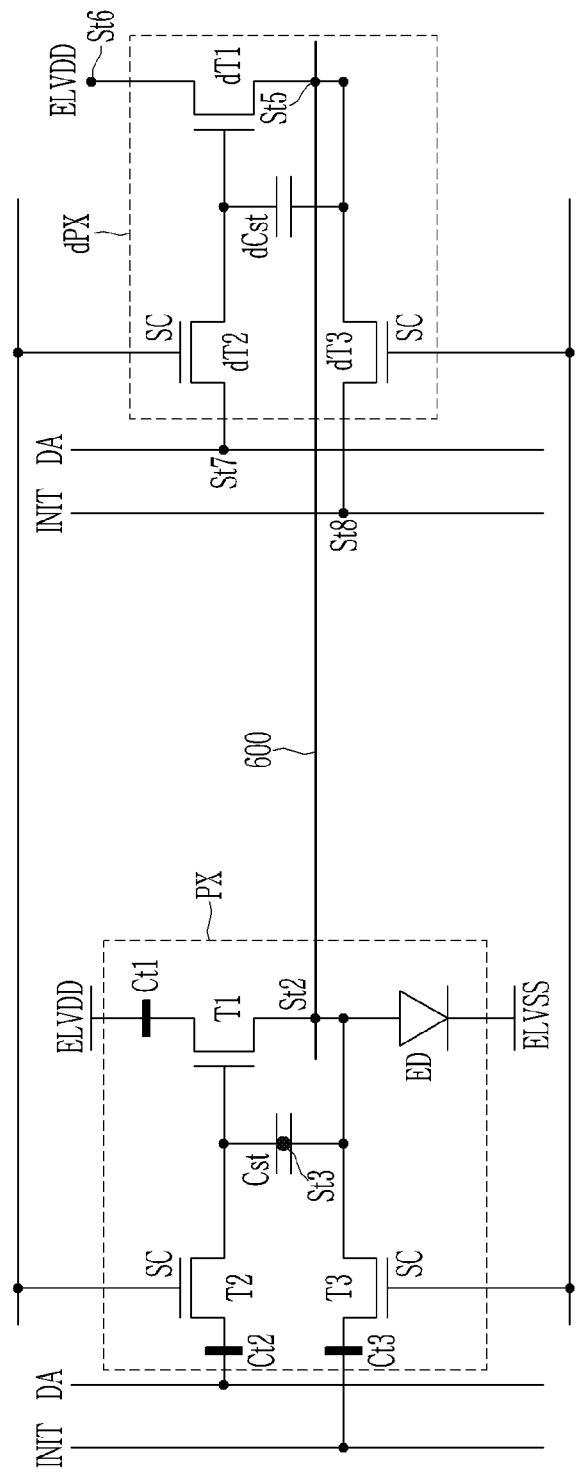
FIG. 36 and FIG. 37 show a repairing method in case that a defect is generated to a pixel of a display device according to an embodiment.
Figure 37:
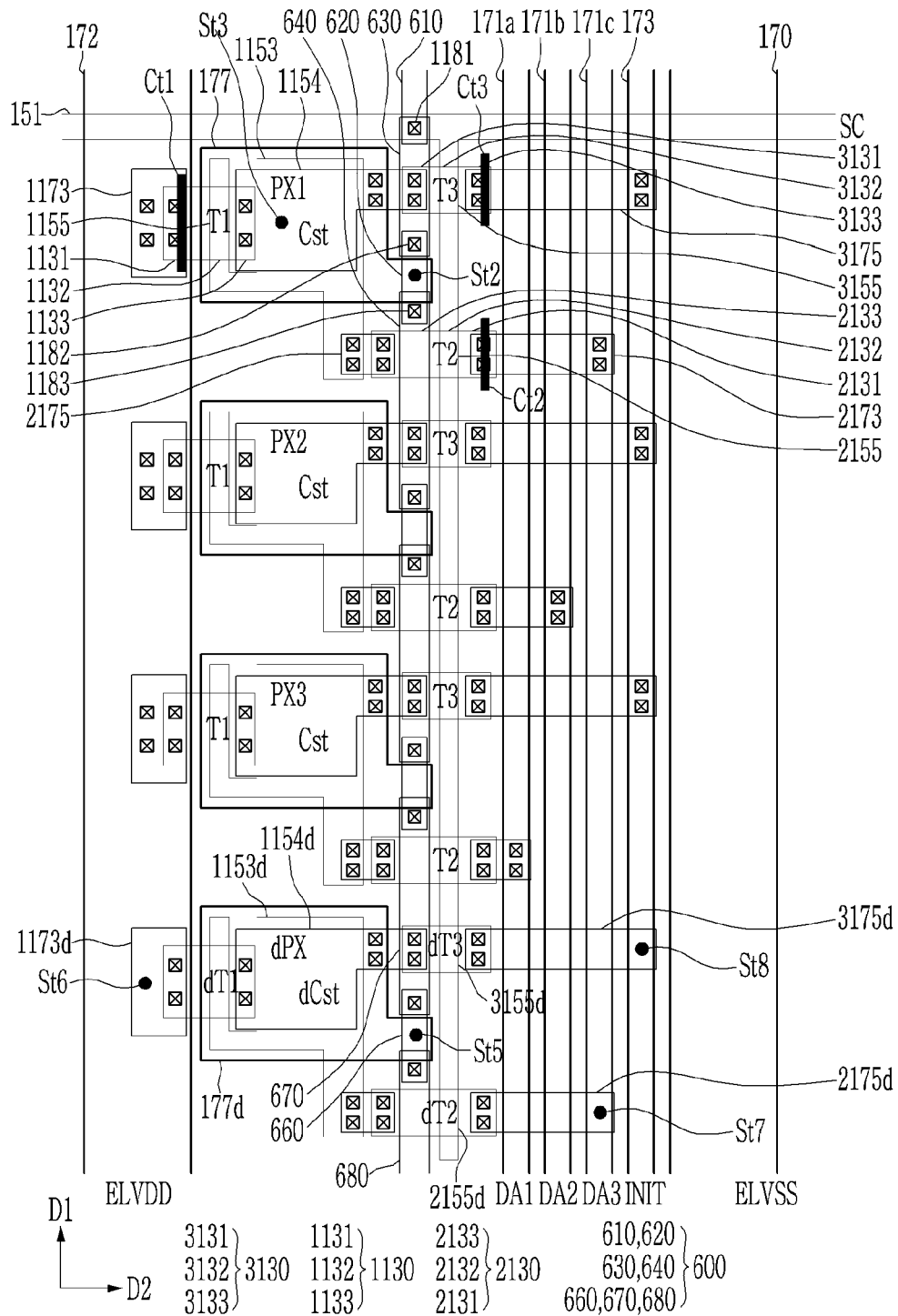

FIG. 36 and FIG. 37 show a repairing method in case that a defect is generated to a pixel of a display device according to an embodiment.

As shown in FIG. 36 and FIG. 37, a defect may be generated to the pixel PX of the display device according to an embodiment. For example, a defect may be generated to the driving transistor T1 of the pixel PX.

The driving transistor T1, the switching transistor T2, and the initialization transistor T3 of the pixel PX to which a defect is generated may be separated from the corresponding pixel PX. between the driving transistor T1 and the driving voltage line 172 may be disconnected at disconnecting region Ct1, between the switching transistor T2 and the data lines 171a, 171b, and 171c may be disconnected at disconnecting region Ct2, and between the initialization transistor T3 and the initialization voltage line 173 may be disconnected at disconnecting region Ct3.

By connecting the pixel PX to which a defect is generated to the dummy pixel dPX, the dummy driving transistor dT1, the dummy switching transistor dT2, and the dummy initialization transistor dT3 may substitute for the driving transistor T1, the switching transistor T2, and the initialization transistor T3 and may function as the same.

The driving transistor T1 of the pixel PX to which a defect is generated and the driving auxiliary wire 600 may be short-circuited St2, and respective electrodes of the capacitor Cst may be short-circuited St3. The dummy driving transistor dT1 and the driving auxiliary wire 600 may be short-circuited St5. The dummy driving transistor dT1 and the driving voltage line 172 may be short-circuited St6, the dummy switching transistor dT2 and one of the data lines 171a, 171b, and 171c may be short-circuited St7, and the dummy initialization transistor dT3 and the initialization voltage line 173 may be short-circuited St8.

The display device according to an embodiment may include the dummy pixel dPX and the driving auxiliary wire 600, so in case that a defect is generated to the pixel PX, the pixel PX and the dummy pixel dPX may be connected by the driving auxiliary wire 600 according to the repair process including a laser cutting process and a laser shorting process. Therefore, the dummy driving transistor dT1, the dummy switching transistor dT2, and the dummy initialization transistor dT3 of the dummy pixel dPX may substitute for the driving transistor T1, the switching transistor T2, and the initialization transistor T3.

A schematic cross-sectional structure of a display device according to an embodiment will now be described with reference to FIG. 38. The drawings of the above-described various embodiments will also be referred to. The drawings illustrate the third insulating layer or the third conductive layer as a highest layer, and another layer may be thereon, which will now be described.

Figure 38:
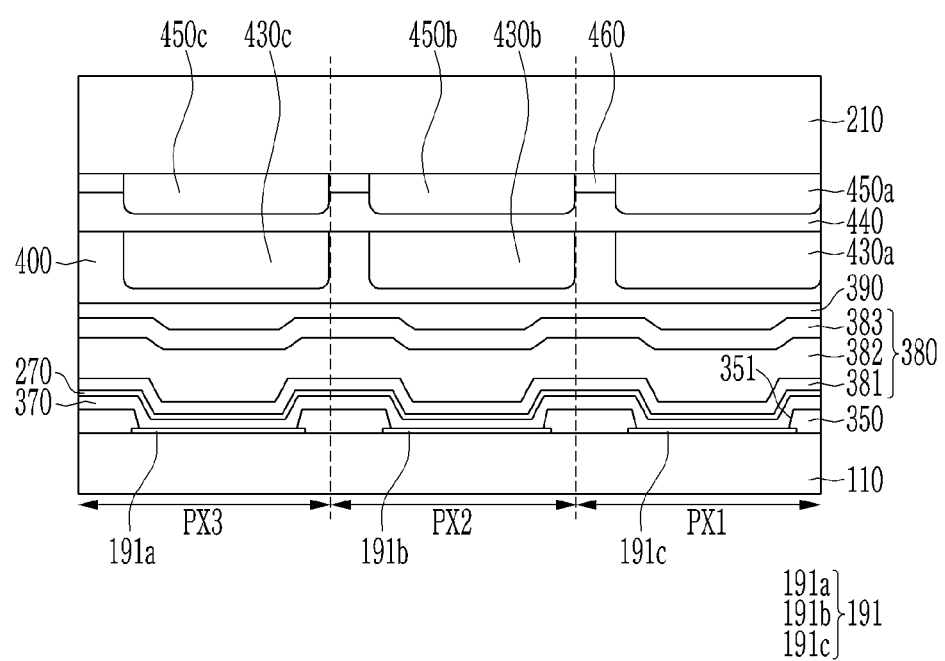
FIG. 38 shows a schematic cross-sectional view of some constituent elements of a display device according to an embodiment.

FIG. 38 shows a schematic cross-sectional view of some constituent elements of a display device according to an embodiment. FIG. 38 omits illustration of the first scan line, the driving voltage line, the data line, and transistors of the display device according to an embodiment, and illustrates constituent elements positioned on the third insulating layer.

As shown in FIG. 38, the display device according to an embodiment may include pixels PX1, PX2, and PX3. Pixel electrodes 191, which may include pixel electrodes 191a, 191b, and 191c, may be positioned or disposed on the respective pixels PX1, PX2, and PX3 on the substrate 110. Transistors and insulating layers positioned between the substrate 110 and the pixel electrodes 191a, 191b, and 191c are not shown, but for example, they may be disposed as shown in the drawings of the above-described various embodiments.

A fourth insulating layer 350 may be positioned on the pixel electrodes 191a, 191b, and 191c, and the fourth insulating layer 350 may include an opening 351. An emission layer 370 may be positioned on the pixel electrodes 191a, 191b, and 191c, and the fourth insulating layer 350, and a common electrode 270 may be positioned on the emission layer 370. The emission layer 370 may include a light emitting material for discharging first color light that may be blue light.

An encapsulation layer 380 including insulating layers 381, 382, and 383 may be positioned on the common electrode 270. The insulating layer 381 and the insulating layer 383 may include inorganic insulating materials, and an insulating layer 382 between the insulating layer 381 and the insulating layer 383 may include an organic insulating material.

A filling layer 390 including filler may be positioned on the encapsulation layer 380. A capping layer 400 including an insulating material, and color conversion layers 430a and 430b, and a transmission layer 430c may be positioned on the filling layer 390.

The transmission layer 430c may transmit incident light. For example, the transmission layer 430c may transmit first color light that may be blue light. The transmission layer 430c may include a polymer material for transmitting the first color light. A region in which the transmission layer 430c is positioned may correspond to a light emitting region for emitting blue light, and the transmission layer 430c may not include semiconductor nanocrystals and may transmit the incident first color light.

The color conversion layers 430a and 430b may include different types of semiconductor nanocrystals. For example, the first color light input to the color conversion layer 430a may be converted into second color light and may be discharged by the semiconductor nanocrystals included by the color conversion layer 430b. The first color light input to the color conversion layer 430b may be converted into third color light and may be discharged by the semiconductor nanocrystals included by the color conversion layer 430b.

The semiconductor nanocrystals may include at least one of a fluorescent substance for converting the incident first color light into second color light or third color light and a quantum dot material.

A core of the quantum dot may be selected from among a group II-VI compound, a group III-V compound, a group IV-VI compound, a group IV element, a group IV compound, and a combination thereof.

The group II-VI compound may be selected from among a binary compound selected from among CdSe, CdTe, ZnS, ZnSe, ZnTe, ZnO, HgS, HgSe, HgTe, MgSe, MgS, and a mixture thereof; a tertiary compound selected from among AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from among a binary compound selected from among GaN, GaP, GaAs, GaSb, AlN, AlP, AlAs, AlSb, InN, InP, InAs, InSb, and a mixture thereof; a tertiary compound selected from among GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound selected from among GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from among a binary compound selected from among SnS, SnSe, SnTe, PbS, PbSe, PbTe, and a mixture thereof; a tertiary compound selected from among SnSeS, SnSeTe, SnSTe, PbSeS, PbSeTe, PbSTe, SnPbS, SnPbSe, SnPbTe, and a mixture thereof; and a quaternary compound selected from among SnPbSSe, SnPbSeTe, SnPbSTe, and a mixture thereof. The group IV element may be selected from among Si, Ge, and a mixture thereof. The group IV compound may be a binary compound selected from among SiC, SiGe, and a mixture thereof.

In this instance, the binary compound, the tertiary compound, or the quaternary compound may exist in the particles with uniform concentration, or exist in the same particles with a concentration distribution partially divided into some states. Further, the color conversion media layer may have a core or shell structure where one quantum dot surrounds another quantum dot. An interface between the core and the shell may have a concentration gradient such that a concentration of an element existing in the shell is gradually reduced nearing the center thereof.

In some embodiments, the quantum dot may have a core-shell structure including a core including the above-described nanocrystal and a shell surrounding the core. The shell of the quantum dot may function as a protective layer for maintaining the semiconductor characteristic by preventing chemical denaturation of the core and/or a charging layer for providing an electrophoretic characteristic to the quantum dot. The shell may be a single layer or a multilayer. An interface between the core and the shell may have a concentration gradient such that a concentration of an element existing in the shell is gradually reduced nearing the center thereof. Examples of the shell of the quantum dot include a metallic or non-metallic oxide, a semiconductor compound, or a combination thereof.

For example, the metallic or non-metallic oxide may include binary compounds such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$, or tertiary compounds such as $MgAl_2O_4$, $CoFe_2O_4$, $NiFe_2O_4$, or $CoMn_2O_4$, and the disclosure is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, and the disclosure is not limited thereto.

The quantum dot may have a full width of half maximum (FWHM) of a light-emitting wavelength spectrum that is less than about 45 nm, by way of example, less than about 40 nm, or further by way of example, less than about 30 nm, and it may improve color purity or color reproducibility within this range. Further, light emitted through the quantum dot is output in all directions, thereby improving a light viewing angle.

Further, the form of the quantum dot is not particularly limited, but more by way of example, it may be formed to be substantially spherical, substantially pyramidal, substantially multi-armed, or substantially cubic nanoparticles, nanotubes, nanowires, nanofibers, and nanoplate-shaped particles.

The quantum dot may control the output color of light according to the size of particles, and hence, the quantum dot may have various light-emitting colors such as blue, red, and green.

An insulating layer 440 may be positioned on color conversion layers 430a and 430b and a transmission layer 430c, and color filters 450a, 450b, and 450c and a light blocking member 460 may be positioned thereon.

The color filter 450a may express second color light, the color filter 450b may express third color light, and the color filter 450c may express first color light.

The light blocking member 460 may be among the neighboring color filters 450a, 450b, and 450c.

A substrate 210 may be positioned on color filters 450a, 450b, and 450c and a light blocking member 460. For example, color conversion layers 430a and 430b and color filters 450a, 450b, and 450c may be positioned between the substrate 110 and the substrate 210.

According to an embodiment, the emission layer 370 may include a quantum dot and not color conversion layers 430a and 430b and a transmission layer 430c.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure and the appended claims.

What is claimed is:

1. A display device comprising:
a driving voltage line, a data line, an initialization voltage line, and a light blocking pattern disposed on a substrate;
a semiconductor layer of a driving transistor electrically connected to the driving voltage line;
a semiconductor layer of a switching transistor electrically connected to the data line;
a semiconductor layer of an initialization transistor electrically connected to the initialization voltage line;
a gate electrode of the driving transistor overlapping the semiconductor layer of the driving transistor;
a lower storage electrode extending from the gate electrode of the driving transistor and electrically connected to the semiconductor layer of the switching transistor;
an upper storage electrode electrically connected to the semiconductor layer of the driving transistor, the light blocking pattern, and the semiconductor layer of the initialization transistor, and overlapping the lower storage electrode;
a semiconductor layer of a first auxiliary transistor disposed in a region adjacent at least one of the semiconductor layer of the switching transistor and the semiconductor layer of the initialization transistor;
a first electrode of the first auxiliary transistor electrically connected to the semiconductor layer of the first auxiliary transistor and overlapping at least one of the data line and the initialization voltage line; and
a second electrode of the first auxiliary transistor electrically connected to the semiconductor layer of the first auxiliary transistor and overlapping at least one of the lower storage electrode and the light blocking pattern.

2. The display device of claim 1, further comprising:
a scan line disposed on the substrate; and
a gate electrode of the switching transistor, a gate electrode of the initialization transistor, and a gate electrode of the first auxiliary transistor extending from the scan line, wherein
the gate electrode of the switching transistor overlaps the semiconductor layer of the switching transistor,
the gate electrode of the initialization transistor overlaps the semiconductor layer of the initialization transistor, and
the gate electrode of the first auxiliary transistor overlaps the semiconductor layer of the first auxiliary transistor.

3. The display device of claim 2, further comprising:
a first electrode of the switching transistor electrically connecting between the semiconductor layer of the switching transistor and the data line;
a second electrode of the switching transistor electrically connecting between the semiconductor layer of the switching transistor and the lower storage electrode; and
a second electrode of the initialization transistor electrically connecting between the semiconductor layer of the initialization transistor and the initialization voltage line.

4. The display device of claim 2, wherein
the data line includes a first data line, a second data line, and a third data line to which different data voltages are applied, and
the first electrode of the first auxiliary transistor overlaps the first data line, the second data line, and the third data line.

5. The display device of claim 1, further comprising:
a semiconductor layer of a second auxiliary transistor disposed in a region of the semiconductor layer of the switching transistor;
a first electrode of a second auxiliary transistor electrically connected to the semiconductor layer of the second auxiliary transistor and overlapping the data line; and
a second electrode of the second auxiliary transistor electrically connected to the semiconductor layer of the second auxiliary transistor and overlapping the lower storage electrode, wherein
the semiconductor layer of the first auxiliary transistor is adjacent the semiconductor layer of the initialization transistor,
the first electrode of the first auxiliary transistor overlaps the initialization voltage line, and
the second electrode of the first auxiliary transistor overlaps the light blocking pattern.

6. The display device of claim 5, further comprising:
a scan line disposed on the substrate; and
a gate electrode of the switching transistor, a gate electrode of the initialization transistor, a gate electrode of the first auxiliary transistor, and a gate electrode of the second auxiliary transistor extending from the scan line, wherein
the gate electrode of the switching transistor overlaps the semiconductor layer of the switching transistor,
the gate electrode of the initialization transistor overlaps the semiconductor layer of the initialization transistor,
the gate electrode of the first auxiliary transistor overlaps the semiconductor layer of the first auxiliary transistor, and
the gate electrode of the second auxiliary transistor overlaps the semiconductor layer of the second auxiliary transistor.

7. The display device of claim 6, wherein
the data line includes a first data line, a second data line, and a third data line to which different data voltages are applied, and
the first electrode of the second auxiliary transistor overlaps the first data line, the second data line, and the third data line.

* * * * *